US012324225B2

(12) United States Patent
Chiang et al.

(10) Patent No.: US 12,324,225 B2
(45) Date of Patent: Jun. 3, 2025

(54) SELF-ALIGNED STRUCTURE FOR SEMICONDUCTOR DEVICES

(71) Applicant: Taiwan Semiconductor Manufacturing Company, Ltd., Hsinchu (TW)

(72) Inventors: Kuo-Cheng Chiang, Hsinchu County (TW); Chih-Hao Wang, Hsinchu County (TW); Shi Ning Ju, Hsinchu County (TW); Kuan-Lun Cheng, Hsin-Chu (TW); Kuan-Ting Pan, Taipei (TW)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 18/447,922

(22) Filed: Aug. 10, 2023

(65) Prior Publication Data

US 2023/0386933 A1    Nov. 30, 2023

Related U.S. Application Data

(60) Continuation of application No. 17/195,282, filed on Mar. 8, 2021, now Pat. No. 11,837,504, which is a (Continued)

(51) Int. Cl.
*H01L 27/088*    (2006.01)
*H01L 27/092*    (2006.01)
(Continued)

(52) U.S. Cl.
CPC ......... *H10D 84/038* (2025.01); *H10D 30/611* (2025.01); *H10D 30/6219* (2025.01);
(Continued)

(58) Field of Classification Search
CPC ............. H01L 27/0886; H01L 27/0924; H01L 27/1211; H01L 29/41791
See application file for complete search history.

(56) References Cited

U.S. PATENT DOCUMENTS 7,071,048 B2    7/2006 Son et al.
8,298,913 B2    10/2012 Anderson
(Continued)

FOREIGN PATENT DOCUMENTS

CN    105428394 A    3/2016
DE    102018100940 A1    2/2019
KR    20160098195 A    8/2016

*Primary Examiner* — Evren Seven
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a semiconductor device having self-aligned isolation structures. The present disclosure provides self-aligned isolation fins that can be formed by depositing dielectric material in openings formed in a spacing layer or by replacing portions of fins with dielectric material. The self-aligned isolation fins can be separated from each other by a critical dimension of the utilized photolithography process. The separation between self-aligned isolation fins or between the self-aligned isolation fins and active fins can be approximately equal to or larger than the separations of the active fins.

20 Claims, 33 Drawing Sheets

Related U.S. Application Data division of application No. 15/724,411, filed on Oct. 4, 2017, now Pat. No. 10,943,830.

(60) Provisional application No. 62/552,229, filed on Aug. 30, 2017.

(51) Int. Cl.

| | | |
|---|---|---|
| *H01L 29/417* | (2006.01) | |
| *H01L 29/66* | (2006.01) | |
| *H01L 29/78* | (2006.01) | |
| *H10D 30/60* | (2025.01) | |
| *H10D 30/62* | (2025.01) | |
| *H10D 30/69* | (2025.01) | |
| *H10D 64/01* | (2025.01) | |
| *H10D 84/01* | (2025.01) | |
| *H10D 84/03* | (2025.01) | |
| *H10D 84/83* | (2025.01) | |
| *H10D 84/85* | (2025.01) | |
| *H01L 21/8238* | (2006.01) | |
| *H01L 21/84* | (2006.01) | |
| *H01L 27/12* | (2006.01) | |
| *H10D 86/00* | (2025.01) | |
| *H10D 86/01* | (2025.01) | |

(52) U.S. Cl.
CPC ......... *H10D 30/792* (2025.01); *H10D 64/017* (2025.01); *H10D 84/0147* (2025.01); *H10D 84/0151* (2025.01); *H10D 84/0158* (2025.01); *H10D 84/0193* (2025.01); *H10D 84/834* (2025.01); *H10D 84/853* (2025.01); *H10D 86/011* (2025.01); *H10D 86/215* (2025.01)

(56) References Cited

U.S. PATENT DOCUMENTS

| | | | |
|---|---|---|---|
| 8,367,498 B2 | 2/2013 | Chang | |
| 8,486,770 B1 | 7/2013 | Wu | |
| 9,166,022 B2 | 10/2015 | Xu | |
| 9,190,417 B2 | 11/2015 | Chang | |
| 9,236,476 B2 | 1/2016 | Pillarisetty | |
| 9,455,331 B1 | 9/2016 | Cai et al. | |
| 9,460,970 B2 | 10/2016 | Mor | |
| 9,472,554 B2 | 10/2016 | Hargrove | |
| 9,484,461 B2 | 11/2016 | Ching | |
| 9,536,793 B1 | 1/2017 | Zhang et al. | |
| 9,553,025 B2 | 1/2017 | Wann | |
| 9,728,464 B2 | 8/2017 | Glass | |
| 9,728,541 B1* | 8/2017 | Huang | H01L 29/6681 |
| 9,748,245 B1 | 8/2017 | Cheng et al. | |
| 9,799,570 B1 | 10/2017 | Cheng | |
| 9,831,306 B2 | 11/2017 | Webb | |
| 9,847,329 B2 | 12/2017 | Wen et al. | |
| 9,853,131 B1* | 12/2017 | Cheng | H01L 29/7851 |
| 9,875,938 B2 | 1/2018 | Jeong | |
| 9,972,495 B1 | 5/2018 | Wu | |
| 10,068,987 B1 | 9/2018 | Zang | |
| 10,141,296 B2 | 11/2018 | Hsieh | |
| 10,170,583 B2 | 1/2019 | Cheng | |
| 10,204,202 B2 | 2/2019 | Hsieh | |
| 10,403,714 B2 | 2/2019 | Ching | |
| 10,249,605 B2 | 4/2019 | Subhash et al. | |
| 10,294,605 B2 | 4/2019 | Subhash | |
| 10,304,844 B1 | 5/2019 | Balakrishnan | |
| 10,304,946 B2 | 5/2019 | Mehandru | |
| 10,347,751 B2 | 7/2019 | Ching | |
| 10,374,082 B2 | 8/2019 | Zhang | |
| 10,374,083 B1 | 8/2019 | Zhang et al. | |
| 10,607,890 B2 | 3/2020 | Basker | |
| 10,943,830 B2 | 3/2021 | Chiang et al. | |
| 2005/0093082 A1 | 5/2005 | Son | |
| 2008/0105931 A1 | 5/2008 | Kang et al. | |
| 2011/0095378 A1* | 4/2011 | Lee | H01L 29/6681 257/401 |
| 2011/0260257 A1 | 10/2011 | Jagannathan | |
| 2012/0086055 A1 | 4/2012 | Anderson | |
| 2012/0091528 A1 | 4/2012 | Chang | |
| 2012/0104472 A1 | 5/2012 | Xu | |
| 2013/0082329 A1* | 4/2013 | Chen | H01L 21/823431 257/E27.06 |
| 2013/0168771 A1 | 7/2013 | Wu | |
| 2013/0330889 A1* | 12/2013 | Yin | H01L 21/823431 257/E21.409 |
| 2014/0027860 A1 | 1/2014 | Glass | |
| 2014/0035041 A1 | 2/2014 | Pillarisetty | |
| 2014/0061815 A1 | 3/2014 | Jagannathan | |
| 2014/0097493 A1* | 4/2014 | Baek | H01L 27/0207 257/347 |
| 2014/0145247 A1 | 5/2014 | Cheng | |
| 2015/0034941 A1 | 2/2015 | Hargrove | |
| 2015/0091100 A1 | 4/2015 | Xie et al. | |
| 2015/0144998 A1 | 5/2015 | Ching | |
| 2015/0155208 A1 | 6/2015 | Mor | |
| 2016/0049468 A1 | 2/2016 | Wu et al. | |
| 2016/0093726 A1 | 3/2016 | Ching | |
| 2016/0163699 A1 | 6/2016 | You et al. | |
| 2016/0225761 A1 | 8/2016 | Huang | |
| 2016/0233298 A1 | 8/2016 | Webb et al. | |
| 2016/0315082 A1 | 10/2016 | Huang | |
| 2017/0040324 A1* | 2/2017 | Yang | H01L 29/0649 |
| 2017/0054004 A1 | 2/2017 | Cheng | |
| 2017/0125550 A1 | 5/2017 | Chang | |
| 2017/0178960 A1 | 6/2017 | Basker | |
| 2017/0207217 A1 | 7/2017 | Hellings | |
| 2017/0278928 A1 | 9/2017 | Tung | |
| 2017/0365522 A1 | 12/2017 | Jeong | |
| 2018/0004882 A1 | 1/2018 | Hsieh | |
| 2018/0040713 A1* | 2/2018 | Chang | H01L 21/823481 |
| 2018/0137232 A1 | 5/2018 | Hsieh | |
| 2018/0158811 A1 | 6/2018 | Subhash | |
| 2018/0204932 A1 | 7/2018 | Mehandru | |
| 2018/0337037 A1 | 11/2018 | Bouche | |
| 2019/0006486 A1 | 1/2019 | Ching | |
| 2019/0067120 A1 | 2/2019 | Ching | |
| 2019/0067417 A1 | 2/2019 | Ching | |
| 2019/0067444 A1 | 2/2019 | Ching | |
| 2019/0067446 A1 | 2/2019 | Ching | |
| 2019/0139957 A1 | 5/2019 | Liao | |
| 2019/0164980 A1 | 5/2019 | Balakrishnan | |
| 2019/0206980 A1 | 7/2019 | Jan | |
| 2019/0214479 A1 | 7/2019 | Jambunathan | |
| 2019/0221667 A1 | 7/2019 | Zhang | |
| 2019/0267375 A1 | 8/2019 | Ching | |
| 2019/0287972 A1 | 9/2019 | Hafez | |
| 2021/0193531 A1 | 6/2021 | Chiang et al. | |
| 2024/0274694 A1 | 8/2024 | Chiang et al. | |

* cited by examiner

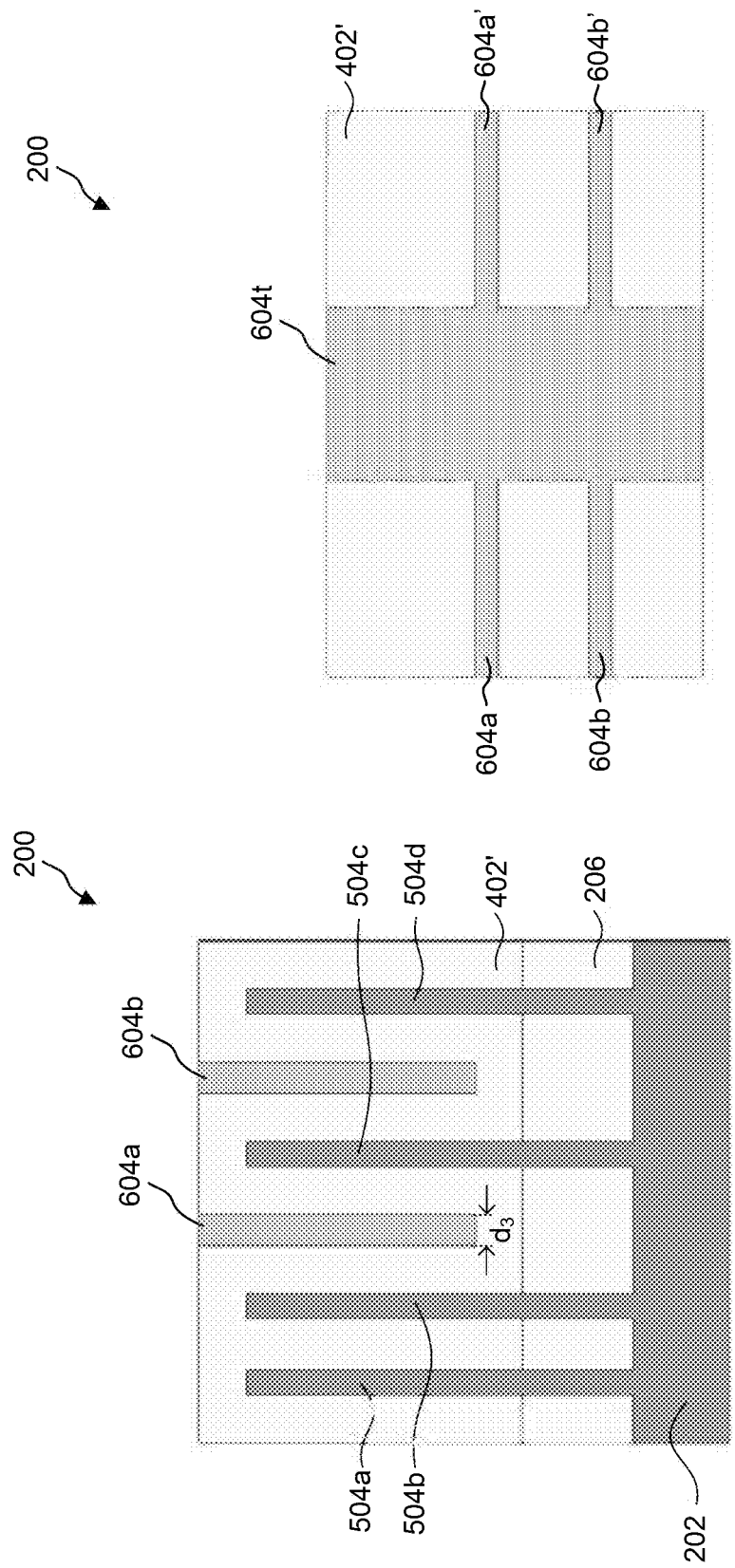

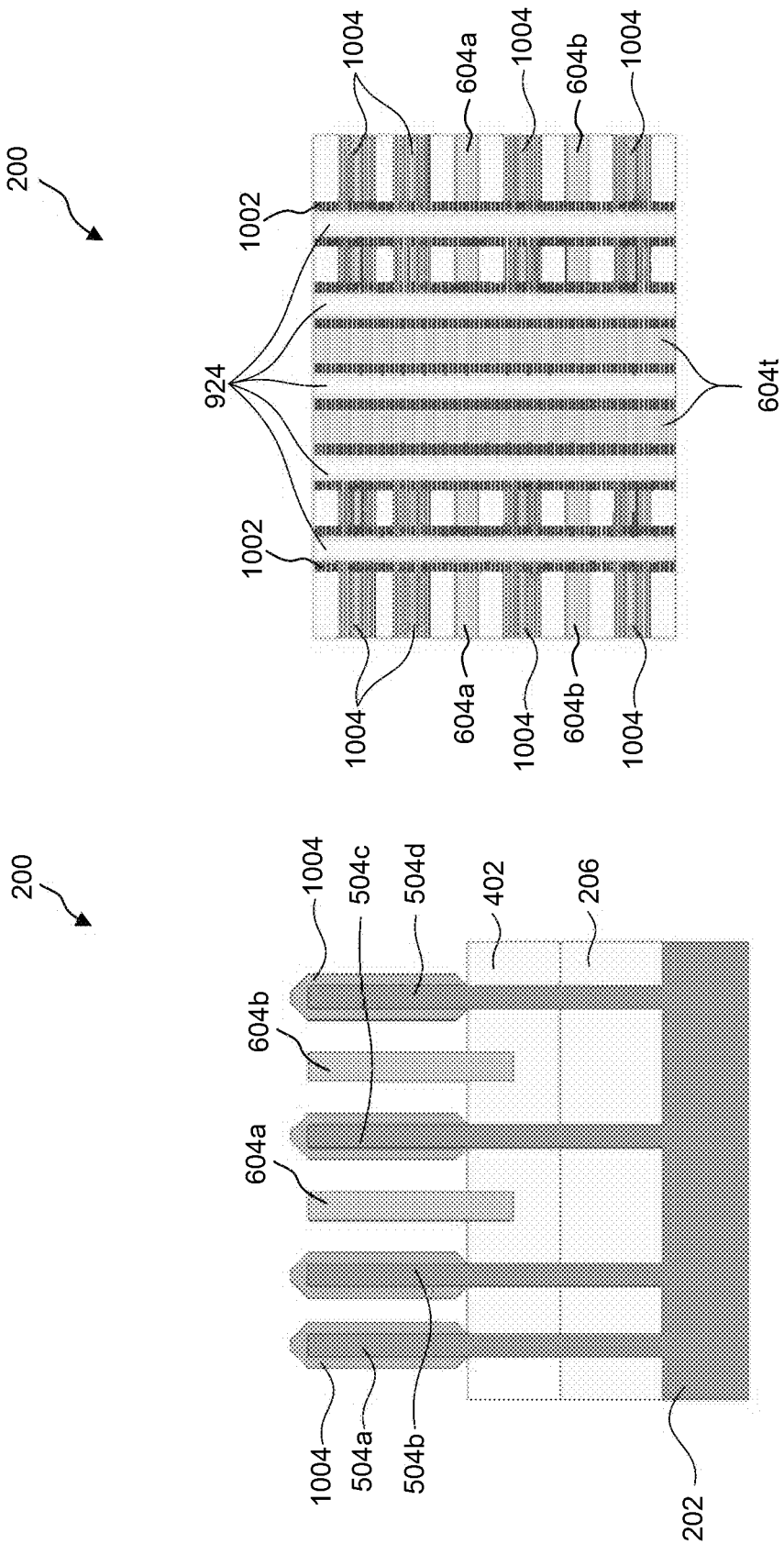

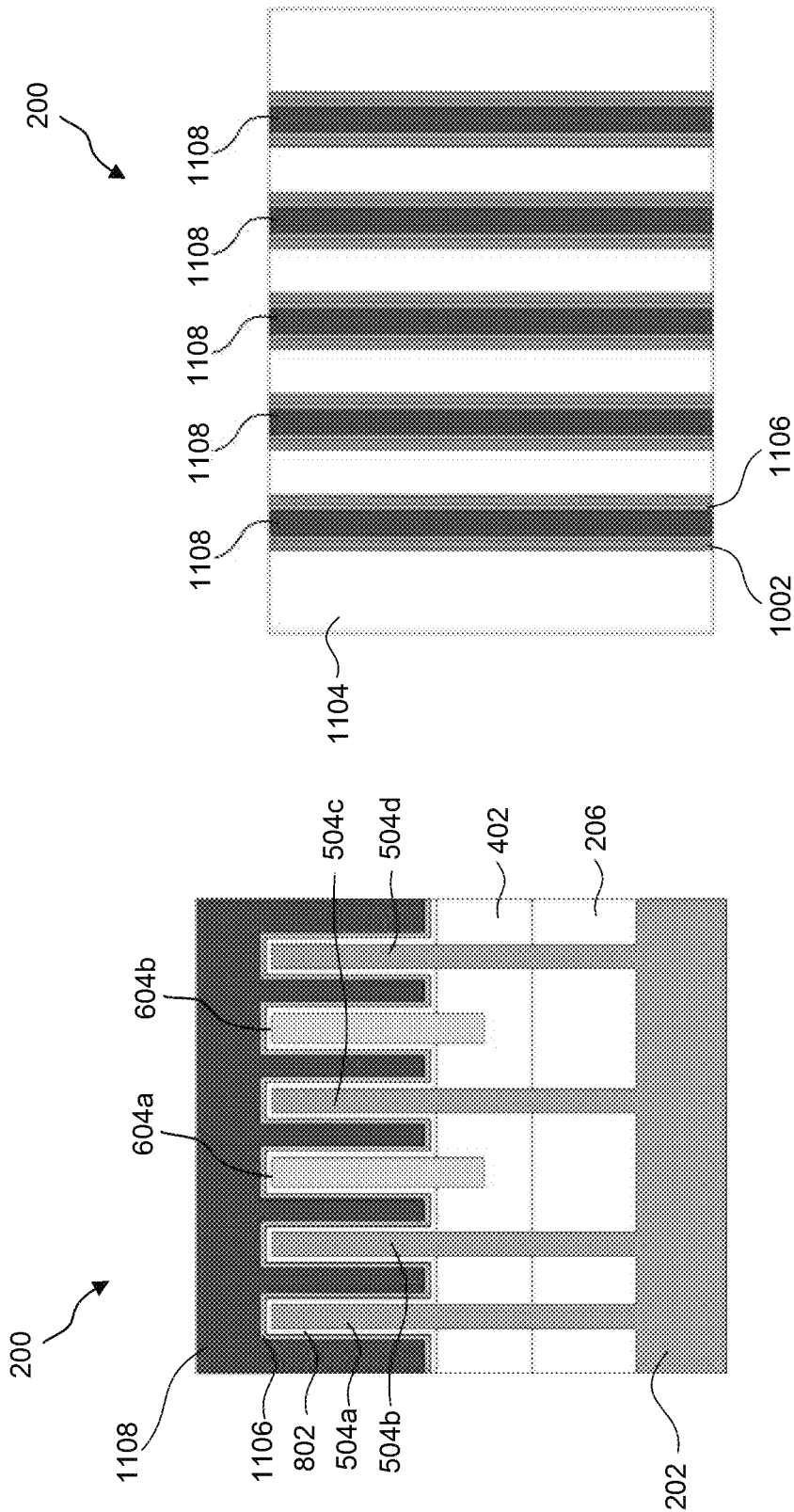

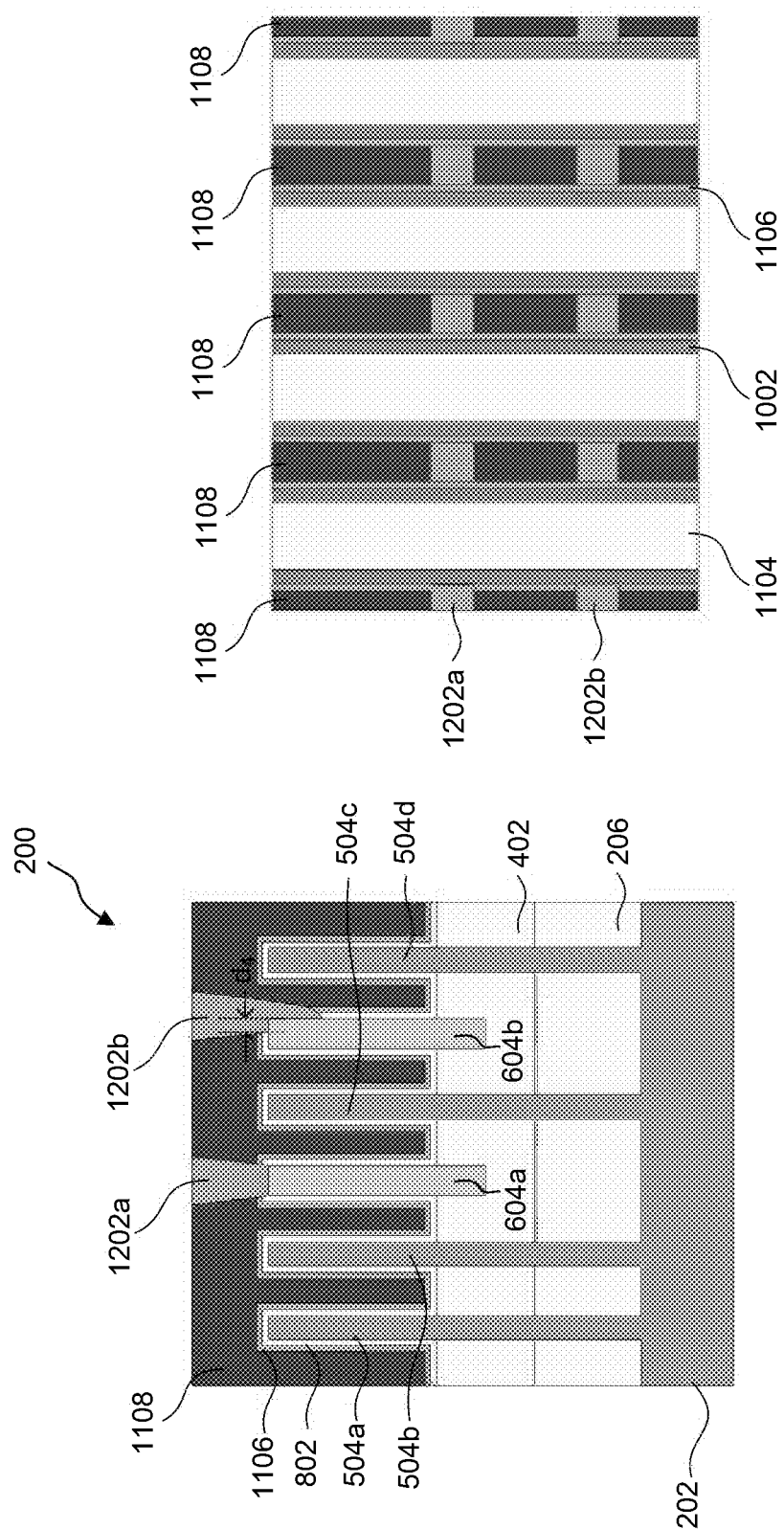

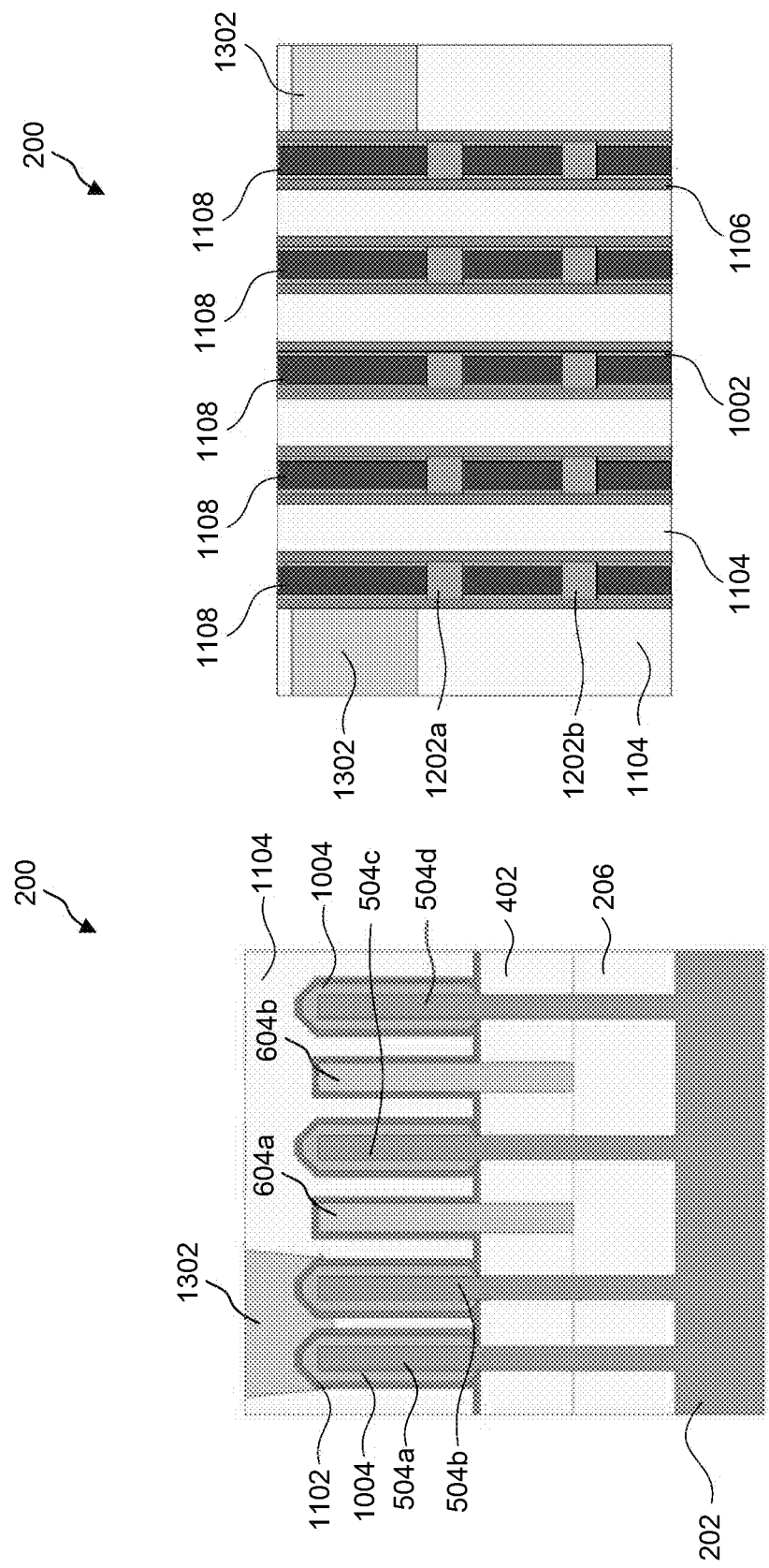

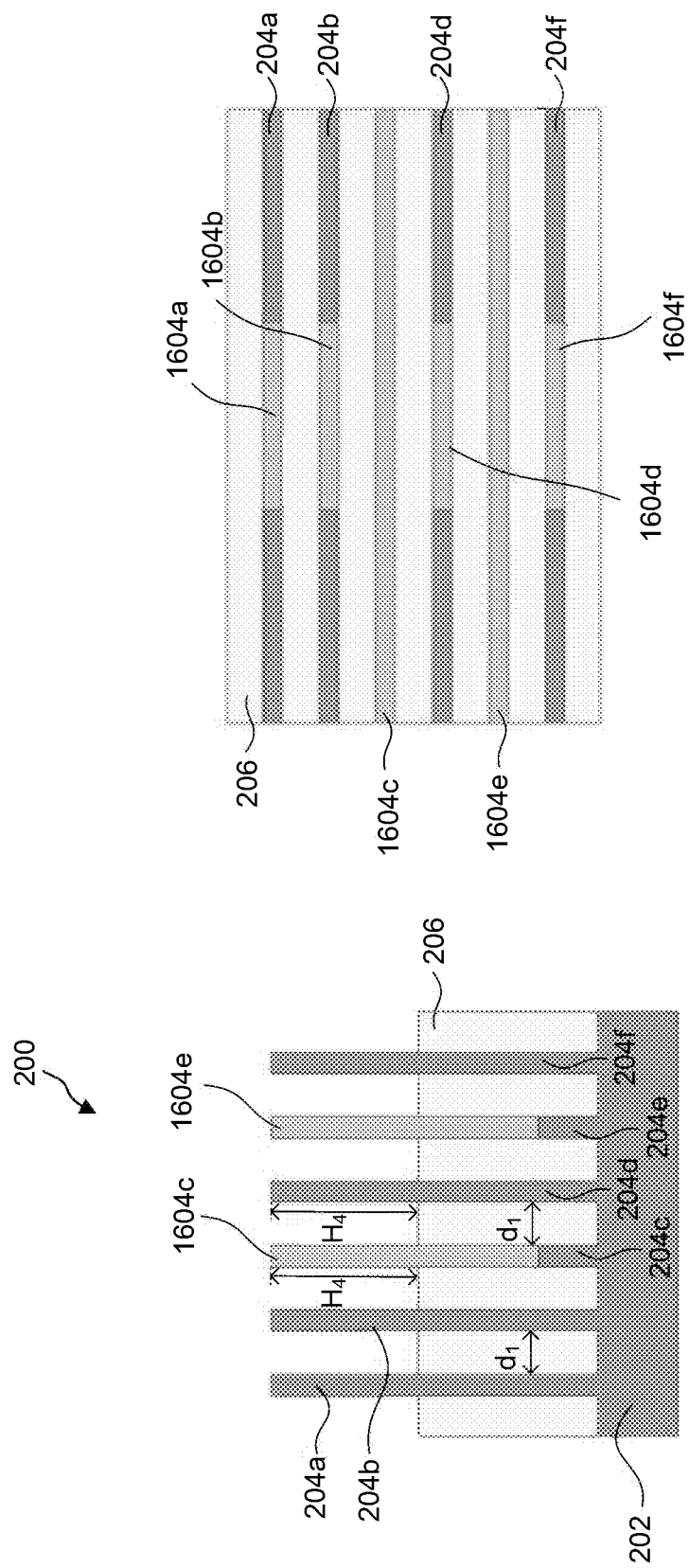

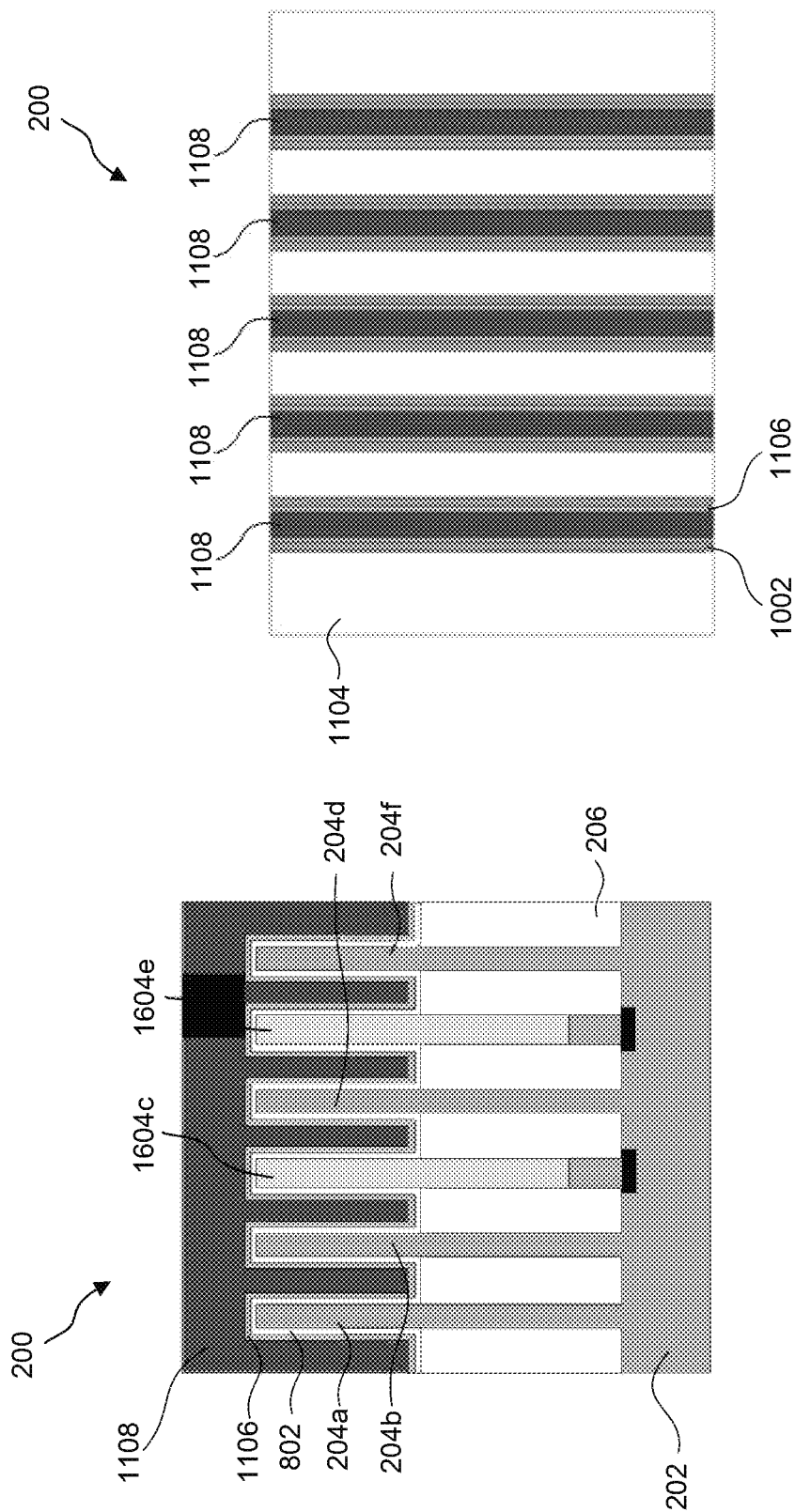

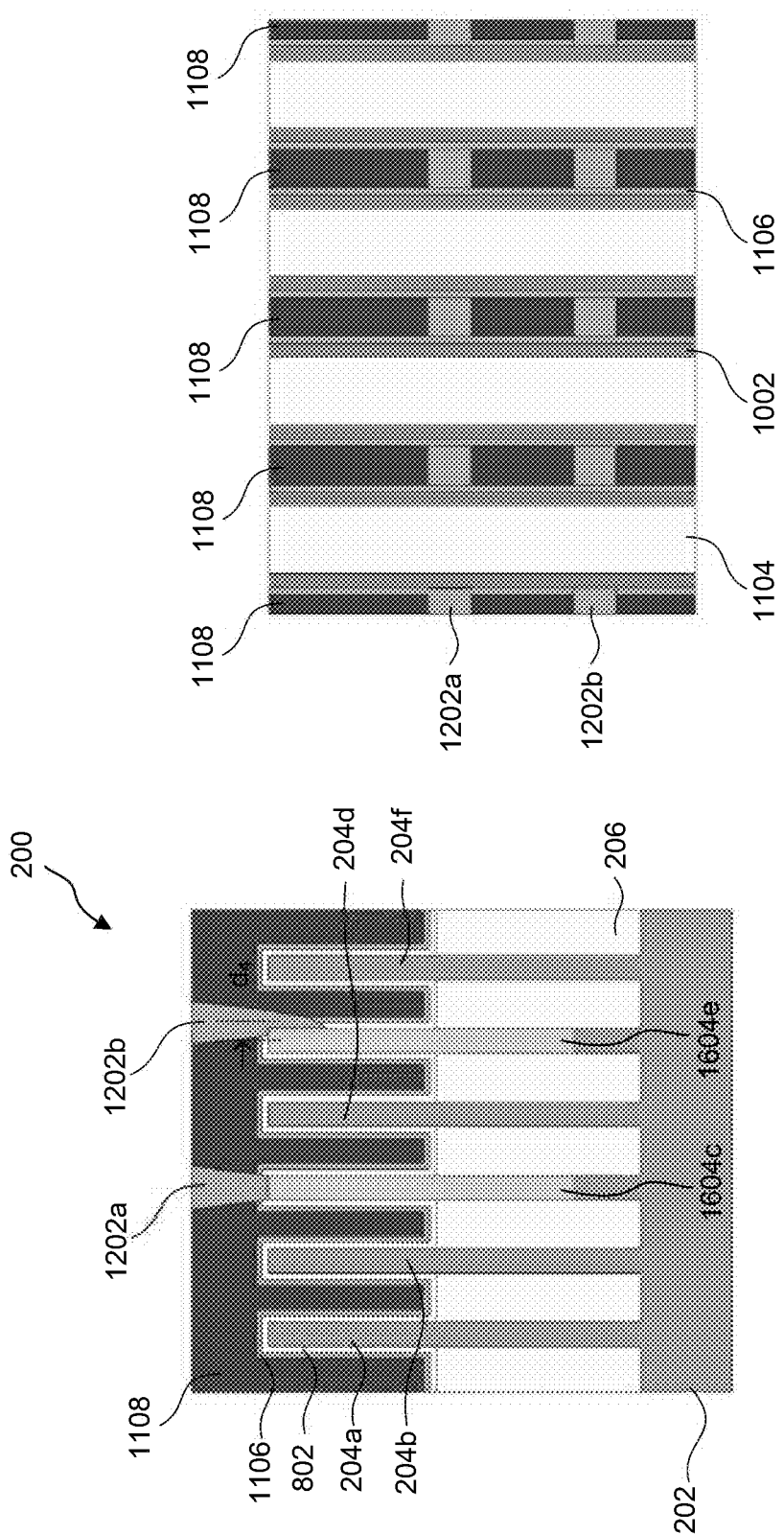

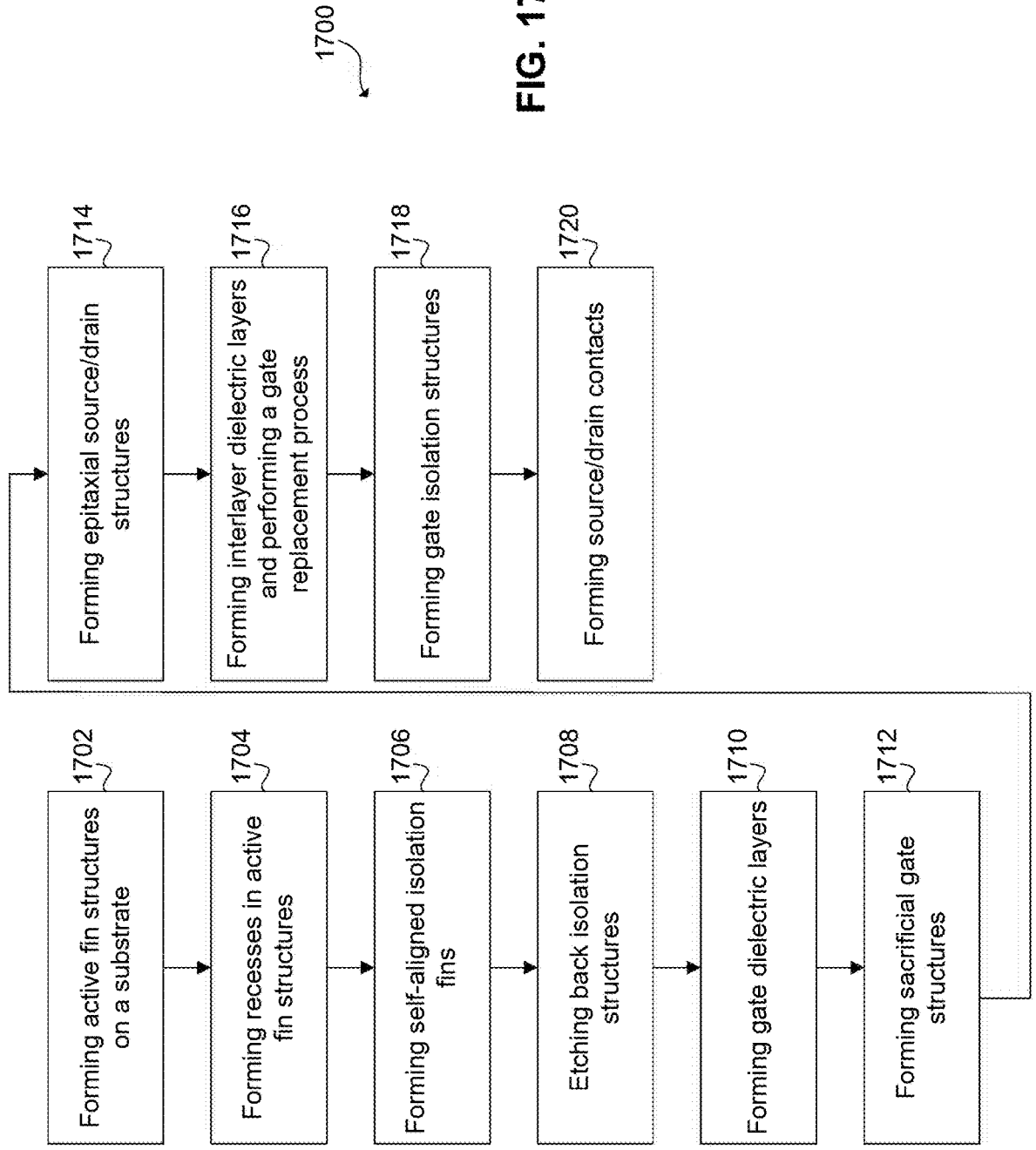

SELF-ALIGNED STRUCTURE FOR SEMICONDUCTOR DEVICES

This application is a continuation of U.S. Non-Provisional patent application Ser. No. 17/195,282, titled "Self-Aligned Structure for Semiconductor Devices," filed on Mar. 8, 2021, which is a divisional of U.S. Non-Provisional patent application Ser. No. 15/724,411, titled "Self-Aligned Structure for Semiconductor Devices," filed on Oct. 4, 2017, which claims the benefit of U.S. Provisional Patent Application No. 62/552,229, titled "Self-Aligned Structure for Semiconductor Devices," filed on Aug. 30, 2017, all of which are incorporated herein by reference in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 3A-3C are respective isometric, cross-sectional, and top-down views of a partially-fabricated fin-based structure after forming self-aligned isolation fins, in accordance with some embodiments.

FIGS. 5A-5C are respective isometric, cross-sectional, and top-down views of a partially-fabricated fin-based structure after forming sacrificial structures and epitaxial source/drain structures, in accordance with some embodiments.

FIGS. 6A-6C are respective isometric, cross-sectional, and top-down views of a partially-fabricated fin-based structure after forming interlayer dielectric layers and performing a gate replacement process, in accordance with some embodiments.

FIGS. 7A-7C are respective isometric, cross-sectional, and top-down views of a partially-fabricated fin-based structure after forming gate isolation structures, in accordance with some embodiments.

FIGS. 8A-8C are respective isometric, cross-sectional, and top-down views of a partially-fabricated fin-based structure after forming source/drain contacts, in accordance with some embodiments.

FIGS. 11A-11C are respective isometric, cross-sectional, and top-down views of a partially-fabricated fin-based structure after etching back the isolation structures, in accordance with some embodiments.

FIGS. 13A-13C are respective isometric, cross-sectional, and top-down views of a partially-fabricated fin-based structure after forming interlayer dielectric layers and performing a gate replacement process, in accordance with some embodiments.

FIGS. 14A-14C are respective isometric, cross-sectional, and top-down views of a partially-fabricated fin-based structure after forming gate isolation structures, in accordance with some embodiments.

FIG. 17 is a flow diagram of an exemplary method of forming self-aligned isolation fins by replacing portions of fins with dielectric material, in accordance with some embodiments.

DETAILED DESCRIPTION

Figure 1:
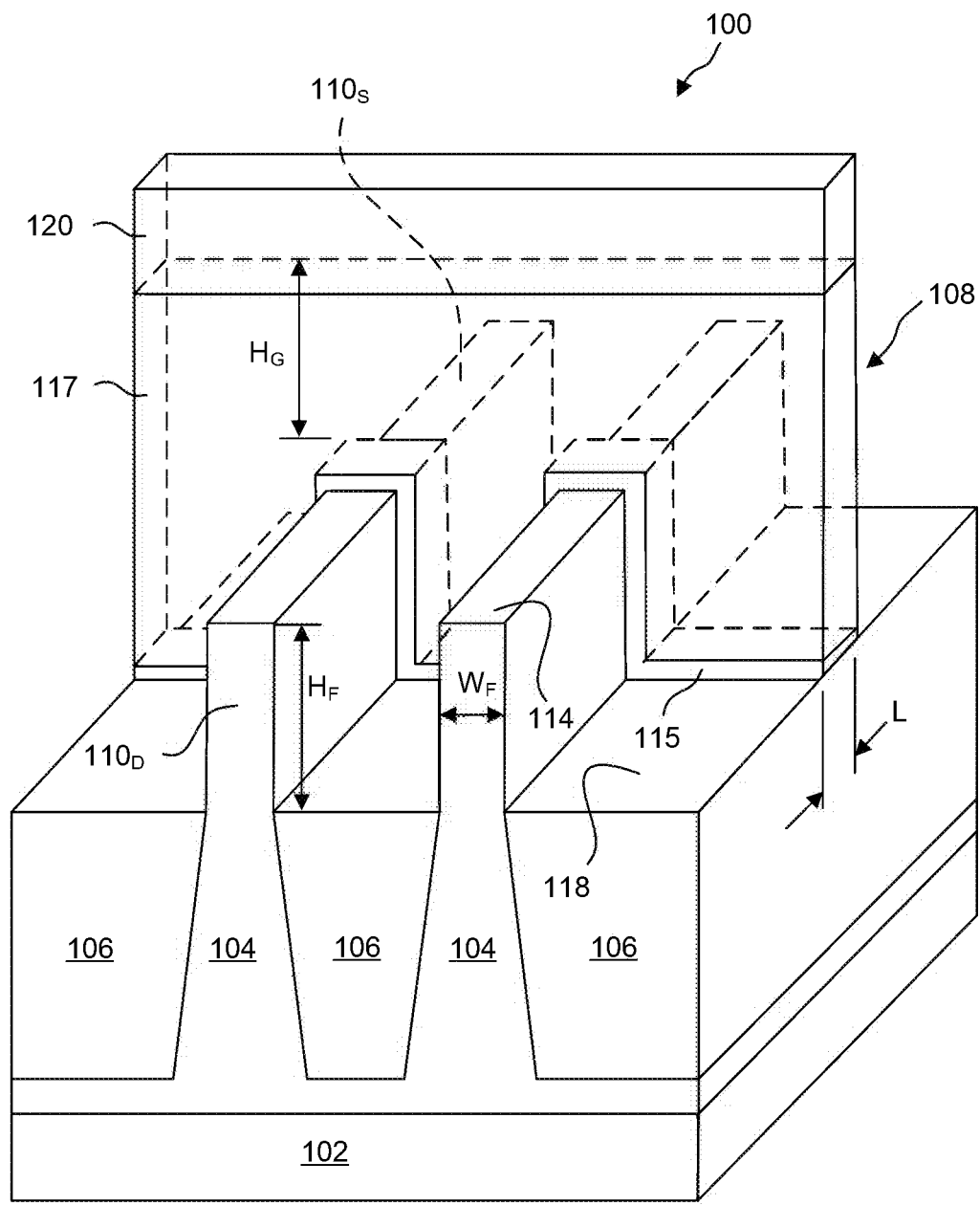
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field-effect transistor. An example of a FET is a metal oxide semiconductor field-effect transistor (MOSFET). MOSFETs can be, for example, (i) planar structures built in and on the planar surface of a substrate such as a semiconductor wafer or (ii) built with vertical structures.

The term "FinFET" refers to a fin field-effect transistor, which is a FET that is formed over a fin and vertically oriented with respect to the planar surface of a wafer.

"S/D" refers to the source and/or drain junctions that form two terminals of a FET.

The term "vertical," as used herein, means nominally perpendicular to the surface of a substrate.

The expression "epitaxial layer" refers to a layer or structure of single crystal material. Likewise, the expression "epitaxially grown" refers to a layer or structure of single crystal material. Epitaxially-grown material may be doped or undoped.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity varies by ±1% to ±5% of the value.

The term "about" as used herein indicates the value of a given quantity varies by ±10% of the value.

The performance and scalability of silicon-based transistors are approaching limitations. For example, as device dimensions are scaled down to achieve higher packing density, shrinking silicon-based transistors becomes more challenging. A fin-field effect transistor (FinFET) device may be used to address these challenges due to its compact form factor and improved performance such as, for example, drive current enhancement and sub-threshold leakage reduction.

A FinFET utilizes a vertical device structure. Channel regions of the FinFET are formed in the fins, and gate structures are disposed over sidewalls and top surfaces of the fins. Gate structures surrounding the channel provides the benefit of controlling the channel regions from three sides. Although FinFETs may exhibit improved performance, they also have their challenges. As the structure size and separation are reduced, transistor performance can be adversely impacted in a number of ways. For example, reductions in body thickness (corresponding to a reduction in fin width) can decrease the mobility of carriers through the channel region. Reduction in structure separation can lead to high aspect ratio (e.g., depth to width ratio of the gap structure) gaps between adjacent structures. The high aspect ratio can cause pre-mature sealing of gap structures during dielectric material deposition and lead to electrical shorts in FinFETs. Further, loading effect can be exacerbated across devices with different critical dimensions or pattern densities, resulting in lower yield and reduced device performance. The loading effect can be derived from etching rate variances across a semiconductor device due to different patterning (e.g., pattern density, aspect ratio of features, and/or composition/reflectivity of features). To reduce the loading effect and provide uniform pattern density, dummy gate structures can be used to fill areas between FinFETs to achieve uniform gate density. Dummy gate structures can be formed over shallow trench isolation (STI) layer and in parallel with active gate structures of adjacent FinFETs. However, without sufficient mechanical support, the dummy gate structures can collapse and cause defect in devices.

Various embodiments in accordance with this disclosure provide mechanisms of forming self-aligned isolation fins in FinFET structures. In some embodiments, the self-aligned isolation fins can be formed by depositing dielectric material in recesses formed in spacing layers. In some embodiments, the self-aligned isolation fins can be formed by replacing portions of fins with dielectric material. In some embodiments, the self-aligned isolation fins can be separated from each other by a minimum design rule spacing such as, for example, a critical dimension of the utilized photolithography process. The separation between self-aligned isolation fins can be approximately equal to or larger than the separation between active fins of the FinFET structures.

In accordance with various embodiments of this disclosure, using the self-aligned isolation fins in semiconductor structures provides, among other things, benefits of (i) uniform etch and void-free metal source/drain contacts with no seams; (ii) preventing gate structure collapsing by anchoring the gate structures on the self-aligned isolation fins; (iii) preventing STI layer under-cut during epitaxial source/drain formation; (iv) preventing epi-bridging between adjacent epitaxial source/drain by using self-aligned isolation fins as barrier layers; (v) providing isolation between gate structures by using self-aligned isolation fins as barrier layers; and (vi) increased AC gain due to reduced parasitic capacitance from the thinned metal source/drain contacts.

Before describing the embodiments related to the embodiments of self-aligned isolation fins in FinFET structures, an exemplary structure for a FinFET is presented. FIG. 1 provides an isometric view of a semiconductor device that includes partially-fabricated FinFETs, in accordance with some embodiments.

FIG. 1 is an isometric view of a semiconductor structure 100, in accordance with some embodiment of the present disclosure. Semiconductor structure 100 includes FinFETs. Semiconductor structure 100 includes a substrate 102, a plurality of fins 104, a plurality of isolation structures 106, and a gate structure 108. Gate structure 108 is disposed over sidewalls and a top surface of each of fins 104. Fins 104 and isolation structures 106 have top surfaces 114 and 118, respectively. Gate structure 108 includes a gate dielectric structure 115 and a gate electrode structure 117. In some embodiments, one or more additional layers or structures can be included in gate structure 108.

FIG. 1 shows a hard mask 120 disposed on a top surface of gate electrode structure 117. Hard mask 120 is used to pattern, such as by etching, gate structure 108. In some embodiments, hard mask 120 is made of a dielectric material such as, for example, silicon nitride. The isometric view of FIG. 1 is taken after the patterning process (e.g., etching) of a gate dielectric layer and a gate electrode layer to form gate structure 108. Integrated circuits can include a plurality of such, and similar, gate structures.

Each of the plurality of fins 104 includes a pair of source/drain (S/D) terminals, where a source terminal is referred to as source region $110_S$ and a drain terminal is referred to as drain region $110_D$. The source and drain regions $110_S$ and $110_D$ are interchangeable and are formed in, on, and/or surrounding fins 104. A channel region of fins 104 underlies gate structure 108. Gate structure 108 has a gate length L and a gate width ($2 \times H_F + W_F$), as shown in FIG. 1. In some embodiments, the gate length L is in a range from about 10 nm to about 30 nm. In some embodiments, the gate length L is in a range from about 3 nm to about 10 nm. In some embodiments, the fin width $W_F$ is in a range from about 6 nm to about 12 nm. In some embodiments, the fin width W is in a range from about 4 nm to about 6 nm. Gate height $H_G$ of gate structure 108, measured from a fin top surface 114 to the top of gate structure 108, is in a range from about 50 nm to about 80 nm, in some embodiments. Fin height $H_F$ of fin 104, measured from the isolation structure top surface 118 to fin top surface 114, is in a range from about 5 nm to about 100 nm, in some embodiments.

Substrate 102 can be a silicon substrate, according to some embodiments. In some embodiments, substrate 102 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material.

Fins 104 are active regions where one or more transistors are formed. Fins 104 can include: (i) silicon (Si) or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP and/or indium antimonide; (iii) an alloy semiconductor including SiGe; or (iv) combinations thereof. Fins 104 can be fabricated using suitable processes including patterning and etch processes. The patterning process can include forming a photoresist layer overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into substrate 102, leaving protruding fins. The recesses can be etched using a reactive ion etch (RIE) and/or other suitable processes. Numerous other methods to form fins 104 on substrate 102 may be suitable. For example, fins 104 can include epitaxial material, in accordance with some embodiments.

Isolation structures 106 can partially fill the recesses and can be made of a dielectric material such as, for example, silicon oxide, spin-on-glass, silicon nitride, silicon oxynitride, fluorine-doped silicate glass (FSG), a low-k dielectric material, other suitable insulating material, and/or combinations thereof. In some embodiments, isolation structures 106 can be shallow trench isolation (STI) structures and are formed by etching trenches in substrate 102. The trenches can be filled with insulating material, followed by a chemical-mechanical polishing (CMP) and etch-back process.

Other fabrication techniques for isolation structures 106 and/or fins 104 are possible. Isolation structures 106 can include a multi-layer structure such as, for example, a structure with one or more liner layers. Isolation structures 106 can also be formed by depositing an enhanced gap fill layer using the multi-step deposition and treatment process to eliminate voids and seams in the gap fill material.

Gate structure 108 can include a gate dielectric layer 115, a gate electrode structure 117, and/or one or more additional layers, according to some embodiments. In some embodiments, gate structure 108 uses polysilicon as gate electrode structure 117. Also shown in FIG. 13 is a hard mask 120 disposed on a top surface of gate electrode structure 117. Hard mask 120 is used to pattern, such as by etching, gate structure 108. In some embodiments, hard mask 120 is made of a dielectric material, such as silicon nitride.

Although gate structure 108 is described as using polysilicon or amorphous silicon for gate electrode structure 117, gate structure 108 can be a sacrificial gate structure such as formed in a replacement gate process used to form a metal gate structure. The replacement gate process and associated manufacturing steps can be performed and are not shown in these figures. The metal gate structure can include barrier layer(s), gate dielectric layer(s), work function layer(s), fill metal layer(s), and/or other suitable materials for a metal gate structure. In some embodiments, the metal gate structure can include capping layers, etch stop layers, and/or other suitable materials.

Exemplary p-type work function metals that can be included in the metal gate structure are TiN, tantalum nitride (TaN), ruthenium (Ru), molybdenum (Mo), aluminum (Al), tungsten nitride (WN), zirconium disilicide ($ZrSi_2$), molybdenum disilicide ($MoSi_2$), tantalum disilicide ($TaSi_2$), nickel disilicide ($NiSi_2$), platinum (Pt), other suitable p-type work function materials, or combinations thereof. Exemplary n-type work function metals that can be included in the metal gate structure are Al, titanium (Ti), silver (Ag), tantalum aluminum (TaAl), tantalum aluminum carbon (TaAlC), tantalum aluminum nitride (TiAlN), tantalum carbide (TaC), tantalum carbide nitride (TaCN), tantalum silicide nitride (TaSiN), manganese (Mn), zirconium (Zr), other suitable n-type work function materials, or combinations thereof. A work function is associated with the material composition of the work function layer. Thus, the material of a work function layer is chosen to tune its work function so that a desired threshold voltage Vth can be achieved by a device formed in the respective region. The work function layer(s) may be deposited by chemical vapor deposition (CVD), plasma-enhanced CVD (PECVD), atomic layer deposition (ALD), other suitable processes, and/or combinations thereof.

A fill metal layer can be deposited over the work function metal layer(s). The fill metal layer fills in remaining portions of trenches or openings formed by removal of the sacrificial gate structure The fill metal layer can include Al, W, copper (Cu), and/or other suitable materials. The fill metal can be formed by ALD, CVD, physical vapor deposition (PVD), plating, other suitable processes, and/or combinations thereof.

Semiconductor device structure 100 described above includes fins 104 and gate structure 108. The semiconductor device structure 100 can include multiple gate structures 108 formed over fins 104. The semiconductor device structure 100 may require additional processing to form various features such as, for example, lightly-doped-drain (LDD) regions and doped S/D structures. The term "LDD region" is used to describe lightly-doped regions disposed between a channel region of a transistor and at least one of the transistor's S/D regions. LDD regions can be formed in fins 104 by doping. Ion implantation can be used, for example, for the doping process. Other processes can be used for doping the LDD regions.

FIGS. 2A-15D illustrate fabrication processes of self-aligned isolation fins in various semiconductor devices. In FIGS. 2A-8D, the self-aligned isolation fins can be formed by depositing dielectric material in recesses formed in the spacing layer, in accordance with some embodiments. In FIGS. 9A-15D, the self-aligned isolation fins can be formed by replacing portions of fins with dielectric material, in accordance with some embodiments. The fabrication processes provided herein are exemplary, and alternative processes in accordance with this disclosure may be performed that are not shown in these figures.

Figure 2A:
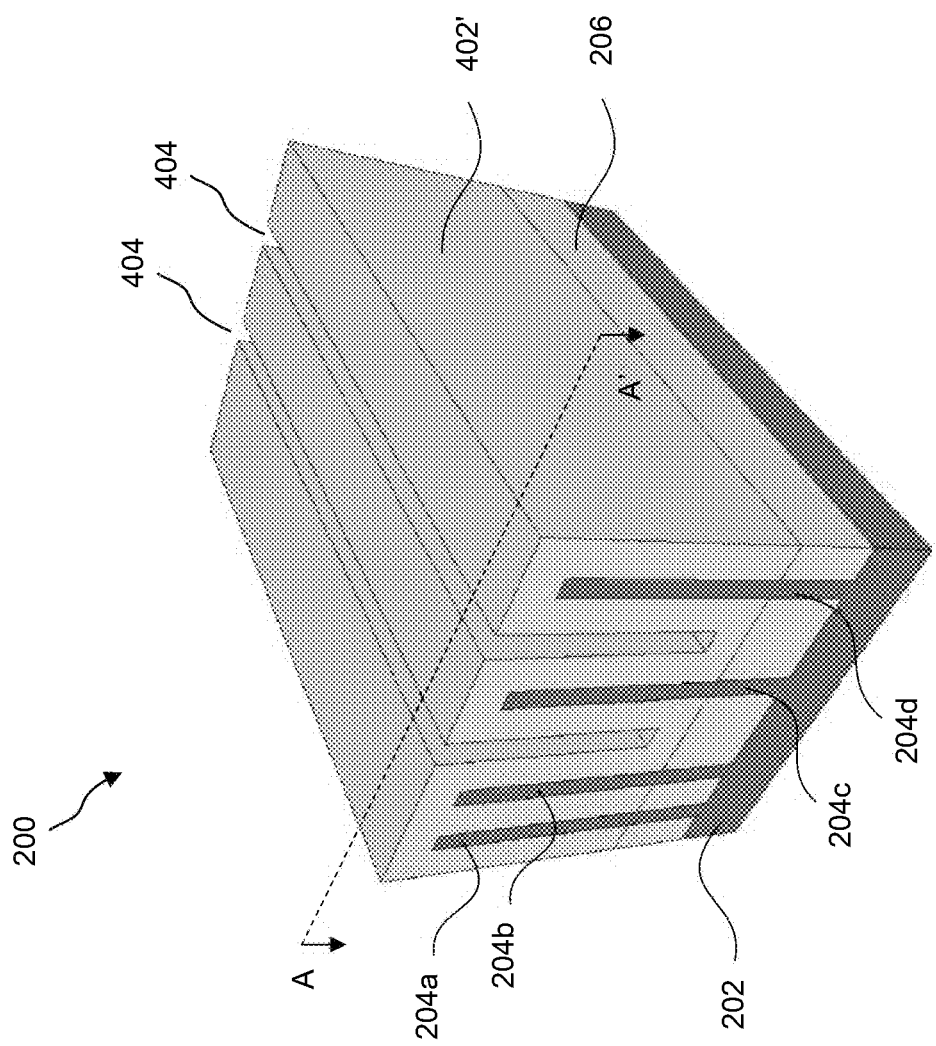
FIGS. 2A-2C are respective isometric, cross-sectional, and top-down views of a partially-fabricated fin-based structure after forming active fin structures and spacing layers on a substrate, in accordance with some embodiments.
Figure 2C:
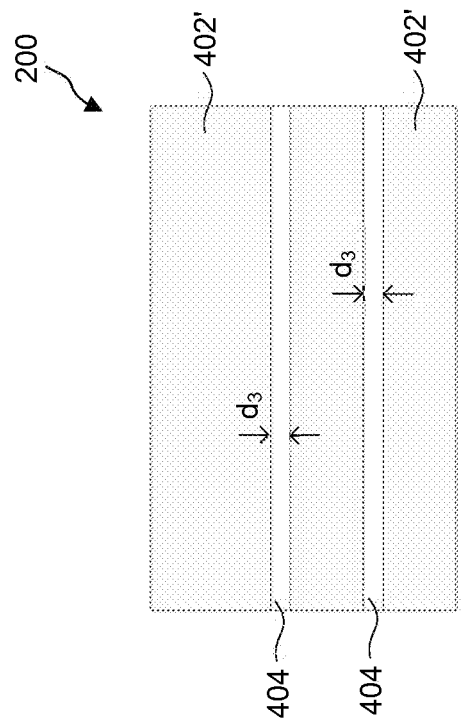
Figure 2B:
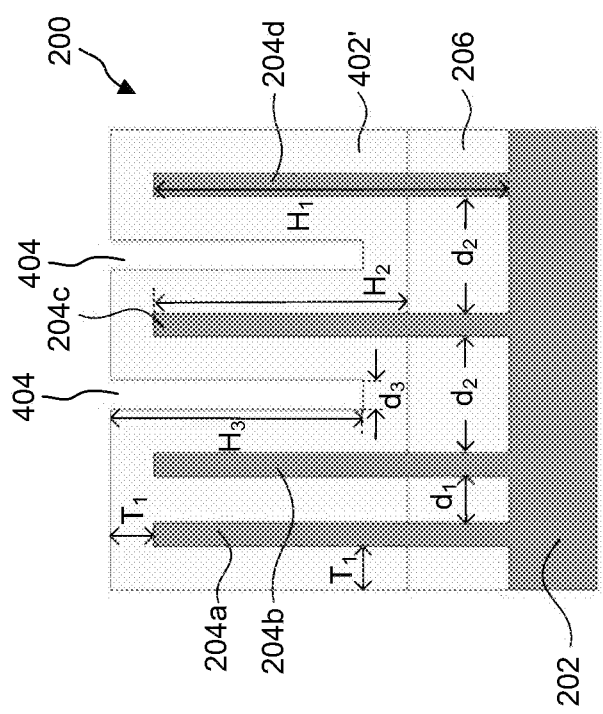

FIGS. 2A-2C are views of an exemplary partially-fabricated semiconductor structure 200 after a number of active fin structures 204a-204d are formed on a substrate 202, in accordance with some embodiments. FIG. 2A is a 3D view of the exemplary structure. FIG. 2B is a cross-sectional view of the structure along the A-A' line of the exemplary structure as illustrated by FIG. 2A. FIG. 2C is a top-down view of the exemplary structure.

The substrate 202 can be made of silicon or some other suitable elementary semiconductor such as, for example, diamond or germanium (Ge); a suitable compound semiconductor such as, for example, silicon carbide (SiC), indium arsenide (InAs), or indium phosphide (InP); or a suitable alloy semiconductor such as, for example, silicon germanium carbide (SiGeC), gallium arsenic phosphide (GaAsP), or gallium indium phosphide (GaInP).

In some embodiments, active fin structures 204a-204d protrude from substrate 202, as illustrated by FIG. 2A. In some embodiments, active fin structures 204a-204d are mutually parallel and extend in one direction, as illustrated by FIGS. 2B and 2C. Although four active fin structures 204a-204d are illustrated in FIGS. 2A-2C, fewer or more active fin structures can be included in semiconductor structure 200. In some embodiments, active fin structures 204a-204d can be doped with n-type dopants such as, for example, phosphorus (P) and arsenic (As), or p-type dopants such as, for example, boron (B) and gallium (Ga). In some embodiments, some fin structures are doped with n-type dopants and are used in n-type FinFETs (e.g., NMOS devices), while some fin structures are doped with p-type dopants and are used in in p-type FinFETs (e.g., PMOS devices). In some embodiments, active fin structures 204a-204d are made of silicon or other suitable materials.

In some embodiments, active fin structures 204a-204d are formed by patterning a hard mask layer and etching into substrate 202 using an anisotropic etch (e.g., dry etch). In some embodiments, the anisotropic etch uses chlorine and/or fluorine based chemicals. The areas covered by hard mask layer are blocked by the hard mask layer during the anisotropic etch process, and the areas not covered by hard mask layer are recessed, resulting in active fin structures 204a-204d.

In some embodiments, active fin structures 204a-204d have a width along the A-A' direction between about 5 nm and about 20 nm (e.g., between 6 nm and 10 nm, between 7 nm and 18 nm, between 10 nm and 15 nm, or between 12 nm and 18 nm). In some embodiments, as shown in FIG. 2B, the active fin structures 204a-204d can have a height $H_1$ between about 100 nm and about 140 nm (e.g., between 100 nm and 140 nm) measured from the upper surface of substrate 202. In some embodiments, the distance $d_1$ between adjacent first and second active fin structures 204a and 204b can be between about 10 nm and about 25 nm (e.g., between 12 nm and 20 nm). In some embodiments, the distance $d_2$ between third and fourth adjacent active fin structures 204b, 204c, and 204d can be between about 20 nm and about 55 nm (e.g., between 30 nm and 45 nm).

In some embodiments, isolation structures 206 can fill the openings between active fin structures 204a-204d and provide isolation between the adjacent fins. Isolation structures 206 can be made of a dielectric material such as, for example, silicon oxide, spin-on-glass, silicon nitride, silicon oxynitride, FSG, a low-k dielectric material, other suitable insulating material, and/or combinations thereof. In some embodiments, isolation structures 206 can be STI structures and are formed by depositing insulating material to fill the openings and followed by a CMP and an etch-back process. Other fabrication techniques for isolation structures 206 are possible. Isolation structures 206 can include a multi-layer structure such as, for example, a structure with one or more liner layers. Isolation structures 206 can also be formed by depositing an enhanced gap fill layer using the multi-step deposition and treatment process to eliminate voids and seams in the gap fill material. Isolation structures 206 can be formed by etched back by removing the hard mask layer and etching back a portion of material that is deposited to form isolation structures 206. In some embodiments, removing the hard mask layer includes performing a wet chemical process with phosphoric acid ($H_3PO_4$) that etches silicon nitride. In some embodiments, the hard mask layer can be removed using a CMP process. After the hard mask layer is removed, isolation structures 206 can be etched back to expose a portion of active fin structures 204a-204d. In some embodiments, isolation structures 206 are etched back so that the top surface of the remaining isolation structures is below the top surface of the active fin structures 204a-204d. The etch processes in isolation structures 206 can be plasma processes such as, for example, a reactive ion etching (RIE) process using oxygen-based plasma. In some embodiments, the RIE etching process may include other etchant gas such as, for example, nitrogen, carbon tetrafluoride ($CF_4$), and/or other suitable gases. Numerous other methods to etch back the isolation structure can also be suitable. In some embodiments, as shown in FIG. 2B, the height $H_2$ of the active fin structures 204a-204d measured from the top surface of the remaining isolation structures 206 to the top surface of active fin structures 204a-204d is between about 50 nm and about 90 nm (e.g., between 65 nm and 70 nm). After isolation structures 206 are etched back, portions of active fin structures 204a-204d can be protruding from the remaining portions of isolation structures 206.

Spacing layer material 402' can be deposited on the exposed sidewalls and top planar surfaces of active fin structures 204a-204d and exposed top surfaces of isolation structures 206. In some embodiments, spacing layer material 402' can be directly formed over substrate 202 without isolation structure 206. In some embodiments, spacing layer material 402' can be made of silicon oxide. In some embodiments, spacing layer material 402' can be made of a dielectric material such as, for example, spin-on-glass, silicon nitride, silicon oxynitride, FSG, a low-k dielectric material, and/or other suitable insulating material. In some embodiments, spacing layer material 402' can be deposited by an ALD process. In some embodiments, the deposition of spacing layer material 402' can be done by any suitable processes such as, for example, plasma-enhanced ALD (PEALD), CVD, PVD, molecular beam epitaxy (MBE), high density plasma CVD (HDPCVD), metal organic (MOCVD), remote plasma CVD (RPCVD), PECVD, other suitable methods, and/or combinations thereof. In some embodiments, as shown in FIG. 2B, the thickness $T_1$ of spacing layer material 402' can be in a range of about 5 nm to about 30 nm (e.g., about 15 nm to about 20 nm). In some embodiments, spacing layer material 402' is deposited on the top planar surfaces of active fin structures 204a-204d. Spacing layer material 402' is also deposited in exposed surfaces between active fin structures 204a-204d, such as exposed sidewalls and exposed top surfaces of isolation structures 206. The nominal thickness $T_1$ of spacing layer material 402' can be achieved by controlling deposition parameters of the deposition process such as, for example, the process time, process temperature, pulse length, plasma power, chamber pressure, gas flow rate, other suitable parameters, and/or combinations thereof. In some embodiments, spacing layer material 402' can be deposited using a PEALD process with plasma power in a range between about 500 W to about 800 W. In some embodiments, the temperature of the deposition process can be in a range between about 200° C. to about 400° C. In some embodiments, the deposition process can be a timed deposition process where a longer processing time can result in a greater thickness of $T_1$, and the deposition process can continue until a nominal thickness is achieved. For example, spacing layer material 402' can be deposited to substantially fill the opening between first and second active fin structures 204a and 204b. As spacing layer material 402' is deposited on both opposing sidewalls of active fin structures 204a and 204b in the opening, thickness $T_1$ can be at least half of distance $d_1$ in order to substantially fill the opening between active fin structures 204a-204b.

Spacing layer material 402' can be deposited between third and fourth active fin structures 204c and 204d to form openings 404, in accordance with some embodiments. By choosing suitable processing deposition parameters, openings 404 can be configured to create spaces for the subsequent deposition of self-aligned isolation fins. As shown in FIGS. 2B-2C, openings 404 have height $H_3$ and width $d_3$. In some embodiments, height $H_3$ can be in a range between about 50 nm and about 90 nm (e.g., between 65 nm and 70 nm). In some embodiments, width $d_3$ can be in a range between about 5 nm and about 20 nm (e.g., between 6 nm and 10 nm, between 7 nm and 18 nm, between 10 nm and 15 nm, or between 12 nm and 18 nm).

Figure 3A:
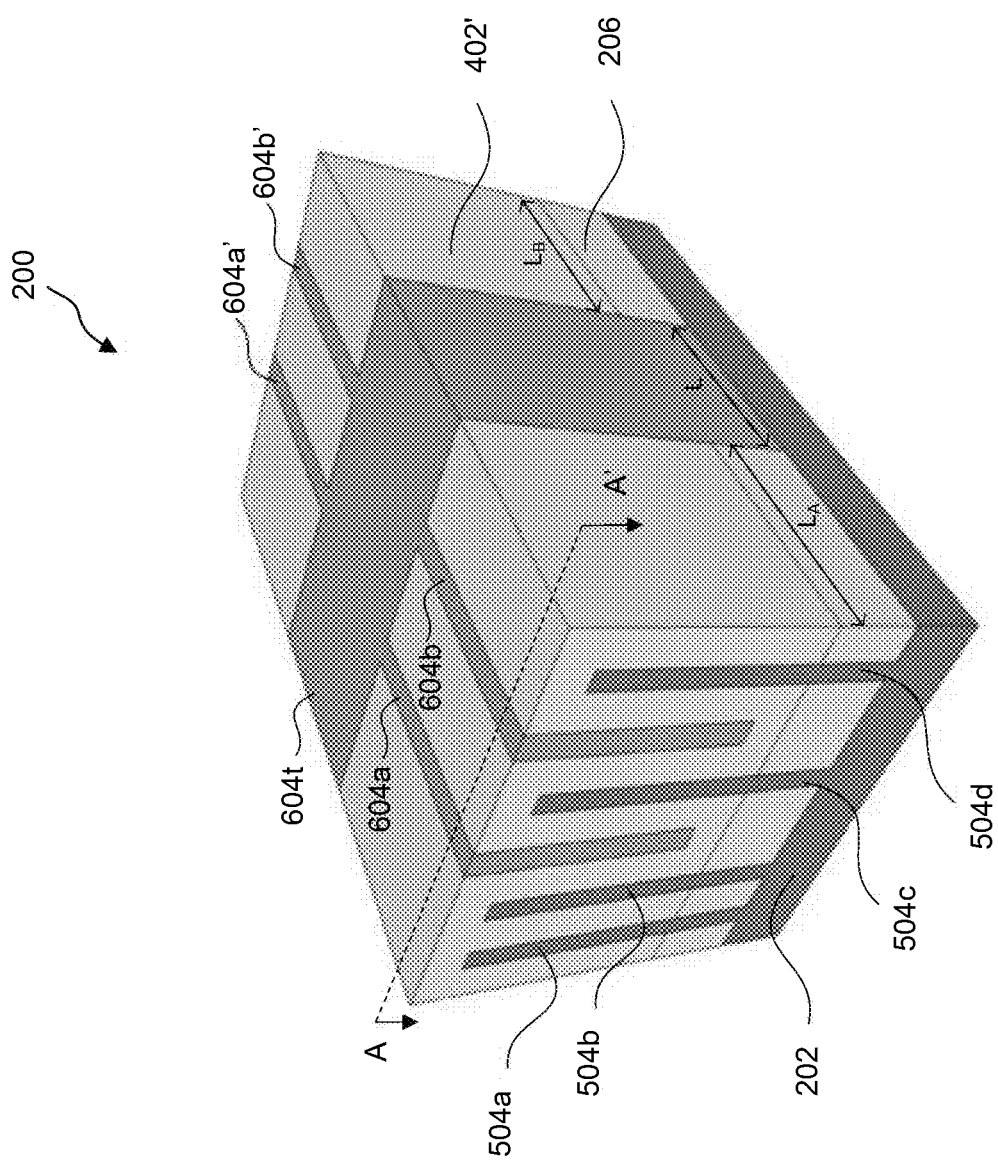

FIGS. 3A-3C are views of an exemplary partially-fabricated semiconductor structure 200 after separating the active fin structures 204a-204d into two groups of active fin structures, in accordance with some embodiments. FIG. 3A is a 3D view of the exemplary structure. FIG. 3B is a cross-sectional view of the structure along the A-A' line as illustrated by FIG. 3A. FIG. 3C is a top-down view of the exemplary structure.

As shown in FIG. 3A, portions of spacing layer material 402', active fin structures 204a-204d, and isolation structures 206 can be removed, and remaining portions of active fin structures 204a-204d can be separated into respective first and second groups of active fin structures. Specifically, first and second groups of active fin structures respectively include active fin structures 504a-504d and active fin structures 504a'-504d' (covered by spacing layer material 402' and not shown in FIG. 3A). In some embodiments, a trench having length L can be formed in active fin structures 204a-204d separating them into first and second groups of active fin structures. Length L can be in a range of between about 10 nm to about 100 um. In some embodiments, first group of active fin structures has a length $L_A$ that can be in a range of between about 100 nm to about 100 um (e.g., between about 100 nm to about 100 um). In some embodiments, second group of active fin structures has a length $L_B$ that can be in a range of between about 100 nm to about 100 um (e.g., between about 100 nm to about 100 um). In some embodiments, lengths $L_A$ and $L_B$ can be substantially similar. In some embodiments, lengths $L_A$ and $L_B$ can be different. The trench can be formed in semiconductor structure 200 using a patterning and etching process. In some embodiments, an exemplary patterning process can include forming a photoresist layer over the exposed surfaces of spacing layer material 402', exposing the resist to a mask or reticle having a pattern thereon, performing a post-exposure bake process, and developing the resist to form a masking layer. In some embodiments, the masking layer can be hard masks such as, for example, silicon nitride layers, other suitable layers, and/or combinations thereof. Surface areas of spacing layer material 402' that are not protected by the masking layer are etched using, for example, a reactive ion etching (RIE) processes, a wet etching process, other suitable processes, and/or combinations thereof. In some embodiments, the etching selectivity can be substantially similar between spacing layer material 402' and active fin structures 204a-204d by controlling etching parameters of the etch process such as, for example, etchant gas type, gas flow rate, etching temperature, plasma power, chamber pressure, other suitable parameters, and/or combinations thereof. For example, the etch process can be an RIE process using fluorocarbon gases such as $CF_4$, fluoroform ($CHF_3$), octafluoropropane ($C_3F_8$), other suitable etchant gases, and/or combinations thereof. The etch process can be an anisotropic etch process. In some embodiments, spacing layer material 402' and exposed portions of active fin structures 204a-204d can be removed using different processes. The etch process can be a timed etch process where a longer processing time can result in a greater depth of the trench and the etch process can continue until a nominal depth is achieved. For example, the etch process can continue until exposed portions of active fin structures 204a-204d are removed and substrate 202 is exposed. In some embodiments, portions of active fin structures 204a-204d and isolation structure 206 remain at the bottom of the trench. After the etch process, the masking layer is subsequently removed by any suitable process such as, for example, any suitable resist strip process, plasma ash process, hard mask removal process, and/or any other suitable processes.

Self-aligned isolation fins are then formed in openings 404 and the trench of semiconductor structure 200. In some embodiments, forming the self-aligned isolation fins includes filling the openings 404 and the trench with a dielectric fin material. In some embodiments, filling of openings 404 can be performed by an ALD process. In some embodiments, filling of the trench can be performed by a CVD or a flowable CVD (FCVD) process. In some embodiments, openings 404 and the trench can be filled by any suitable processes such as, for example, ALD, CVD, FCVD, PVD, MBE, HDPCVD, MOCVD, RPCVD, PECVD, other suitable methods, and/or combinations thereof. In some embodiments, the process of filling openings 404 and the trench with the dielectric fin material is performed at a temperature between about 400° C. and about 700° C. (e.g., between 400° C. and 600° C.). In some embodiments, the dielectric fin material can be deposited using an FCVD process with a processing temperature in a range between about 200° C. and 400° C., followed by a subsequent ultra-violet (UV) curing and annealing process. In some embodiments, the annealing process can be performed at a temperature in a range between about 500° C. to about 800°

C. In some embodiments, in-situ doping of carbon and/or nitrogen can be performed to cure or solidify the dielectric fin material during the FCVD process. In some embodiments, the dielectric fin material includes silicon carbon nitride (SiCN), silicon oxygen carbon nitride (SiOCN), or metal oxides such as, for example, hafnium oxide ($HfO_2$), zirconium oxide ($ZrO_2$), aluminum oxide ($Al_2O_3$), other suitable metal oxides, and/or combinations thereof. In some embodiments, forming the self-aligned isolation fins further includes performing a planarization step (e.g., a CMP step) to remove the excess dielectric materials on the upper surfaces of spacing layer material 402', so that the upper surfaces of the self-aligned isolation fins and the upper surface of spacing layer material 402' are substantially coplanar. The deposition of dielectric fin material forms self-aligned isolation fins 604a-604b and 604a'-604b' in openings 404, and self-aligned isolation fin 604t in the trench. Self-aligned isolation fins 604a-604b are formed between active fin structures 504a-504d of the first group of active fin structures and self-aligned isolation fins 604a'-604b' are formed between active fin structures 504a'-504d' of the second group of active fin structures. As openings 404 and the trench are defined and formed prior to the deposition of dielectric fin material, no alignment process is needed when the dielectric fin material fills in the exposed opening and trenches. As shown in FIG. 3B, the width of the self-aligned isolation fins 604a-604b and 604a'-604b are substantially equal to the width $d_3$ of openings 404. In some embodiments, the height of the self-aligned isolation fins 604a-604b and 604a'-604b can be substantially equal to the depth $H_3$ of openings 404, or less due to the planarization process. In some embodiments, height $H_3$ can be in a range between about 50 nm and about 90 nm (e.g., between 65 nm and 70 nm). In some embodiments, width $d_3$ can be in a range between about 5 nm and about 20 nm (e.g., between 6 nm and 10 nm, between 7 nm and 18 nm, between 10 nm and 15 nm, or between 12 nm and 18 nm). In some embodiments, self-aligned isolation fin 604t can be formed in the trench which is between the respective first and second groups of active fin structures. Self-aligned isolation fin 604t can have a length that is substantially same as length L of the trench and is in a range of between about 50 nm to about 100 um.

Figure 4A:
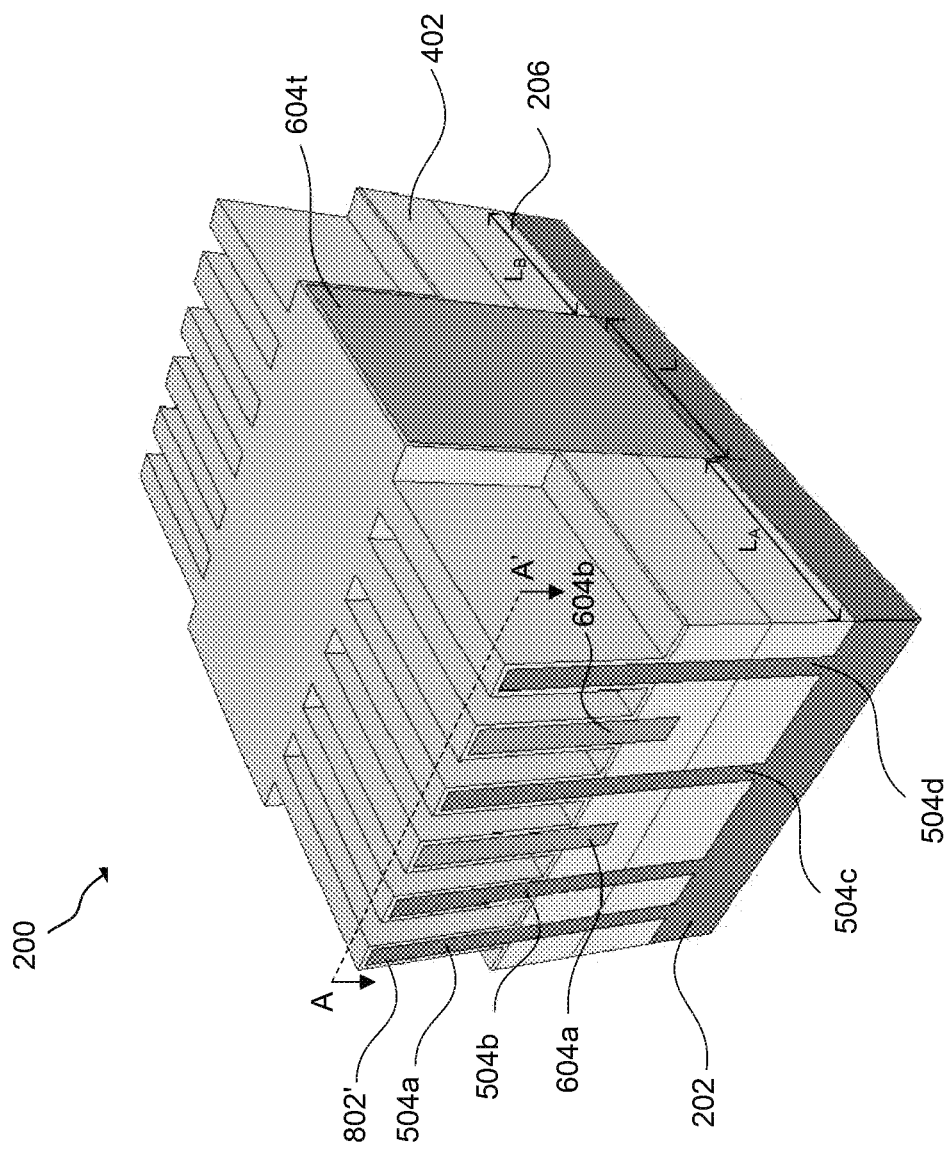
FIGS. 4A-4B are respective isometric and cross-sectional of a partially-fabricated fin-based structure after etching back spacing layers and disposing a gate dielectric layer, in accordance with some embodiments.
Figure 4B:
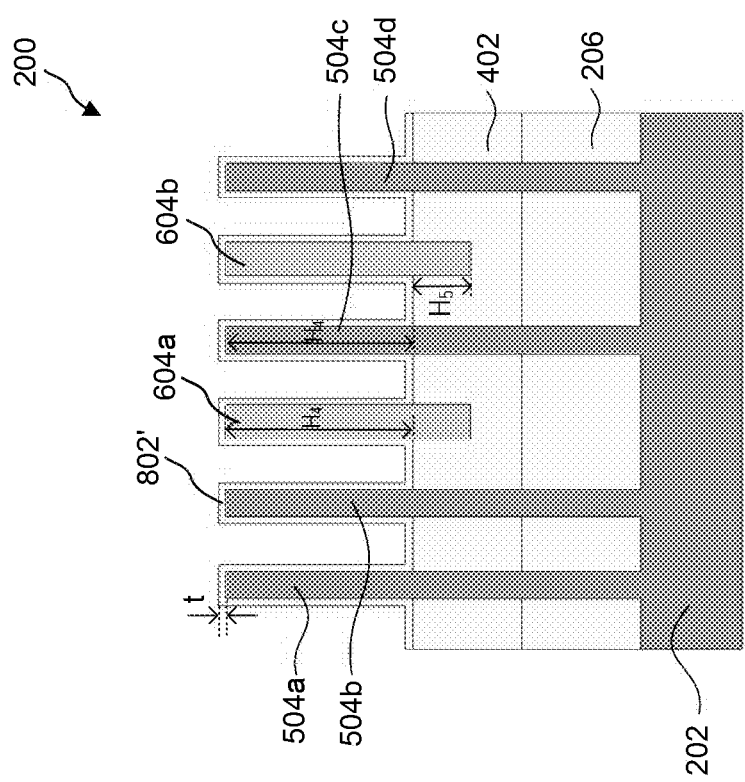

FIGS. 4A-4B are views of an exemplary partially-fabricated semiconductor structure 200 after spacing layer material 402' is etched back and a gate dielectric layer material 802' is formed, in accordance with some embodiments. FIG. 4A is a 3D view of the exemplary structure. FIG. 4B is a cross-sectional view of the structure along the A-A' line as illustrated by FIG. 4A.

Spacing layer material 402' can be etched back such that portions of active fin structures and self-aligned isolation fins can be protruding from the remaining portions of spacing layer material 402'. The remaining portions of spacing layer material 402' forms spacing layer 402. In some embodiments, self-aligned isolation fins 604a-604b, 604a'-604b', and 604t are slightly etched during the etching of spacing layer material 402', such that their top surfaces are substantially coplanar with active fin structures 504a-504d and 504a'-504d'. This coplanar structure can be achieved by any suitable methods such as, for example, an etch process that has suitable etch selectivity between materials of the spacing layer material, active fin structure, and self-aligned isolation fin. For example, the etch process can have a higher etch rate of spacing layer material 402' than the etch rate of dielectric fin material or active fin material. In some embodiments, etching rate difference be achieved by adjusting suitable parameters of the etch process such as, for example, etchant gas type, gas flow rate, etching temperature, plasma power, chamber pressure, other suitable parameters, and/or combinations thereof. In some embodiments, this coplanar structure can be achieved by a CMP process that removes top portions of spacing layer material 402' and self-aligned isolation fins 604a-604b, 604a'-604b', and 604t until they are coplanar with the top surfaces of active fin structures 504a-504d and 504a'-504d'. An etching process can then be used to etch back spacing layer material 402'. The etch processes of spacing layer material 402' can be plasma processes such as, for example, an RIE process using fluorine-based plasma. In some embodiments, the RIE etching process may include etchant gas such as, for example, $CF_4$, $CHF_3$, $C_3F_8$, and/or other suitable gases. In some embodiments, etching the spacing layer material 402' includes performing a wet chemical process that etches silicon oxide. Numerous other methods to form recesses can also be suitable. The remaining portions spacing layer material 402' after etching back form spacing layer 402. As shown in FIG. 4B, using the fins in first group of active fin structures 504a-504d for example, the height $H_4$ of the active fin structures 504a-504d or self-aligned isolation fins 604a-604b is measured from the top surface of spacing layer 402 to the top surfaces of active fin structures 504a-504d or self-aligned isolation fins 604a-604b. In some embodiments, height $H_4$ is between about 40 nm and about 70 nm (e.g., between 50 nm and 60 nm). As shown in FIGS. 4A-4B, self-aligned isolation fins 604a-604b are partially embedded in spacing layer 402. Height $H_5$ indicates the depth of embedment and is measured from the top surfaces of the remaining spacing layer 402 to the bottom surfaces of self-aligned isolation fins 604a-604b. In some embodiments, height $H_5$ can be in a range of between about 5 nm and about 30 nm.

Gate dielectric layer material 802' is formed through a blanket deposition, as shown in FIG. 4A-4B. In some embodiments, gate dielectric layer material 802' can be a silicon oxide layer (e.g., silicon dioxide). In some embodiments, gate dielectric layer material 802' can include a high-k material. In some embodiments, gate dielectric layer material 802' may include a plurality of layers. In some embodiments, gate dielectric layer material 802' is deposited using an ALD process or a CVD process. In some embodiments, the ALD process of forming the gate dielectric layer material 802' is performed at a temperature between about 200° C. and about 400° C. (e.g., between 200° C. and 400° C.). In some embodiments, the thickness t of gate dielectric layer material 802' is between about 2 nm and about 4 nm (e.g., between 2 nm and 4 nm). In some embodiments, gate dielectric layer material 802' can be used as gate dielectric for high voltage devices.

Figure 5A:
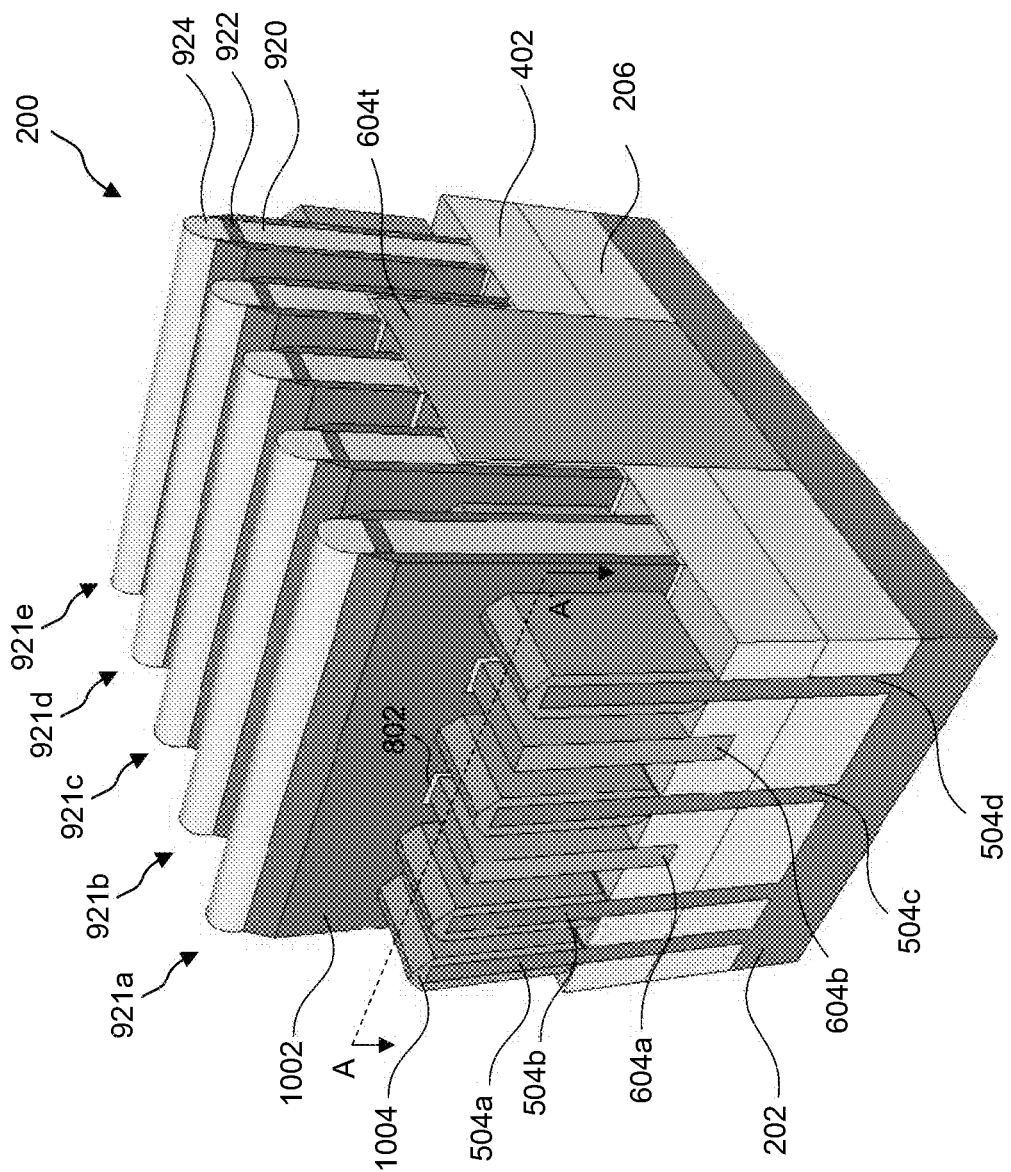
Figure 5E:
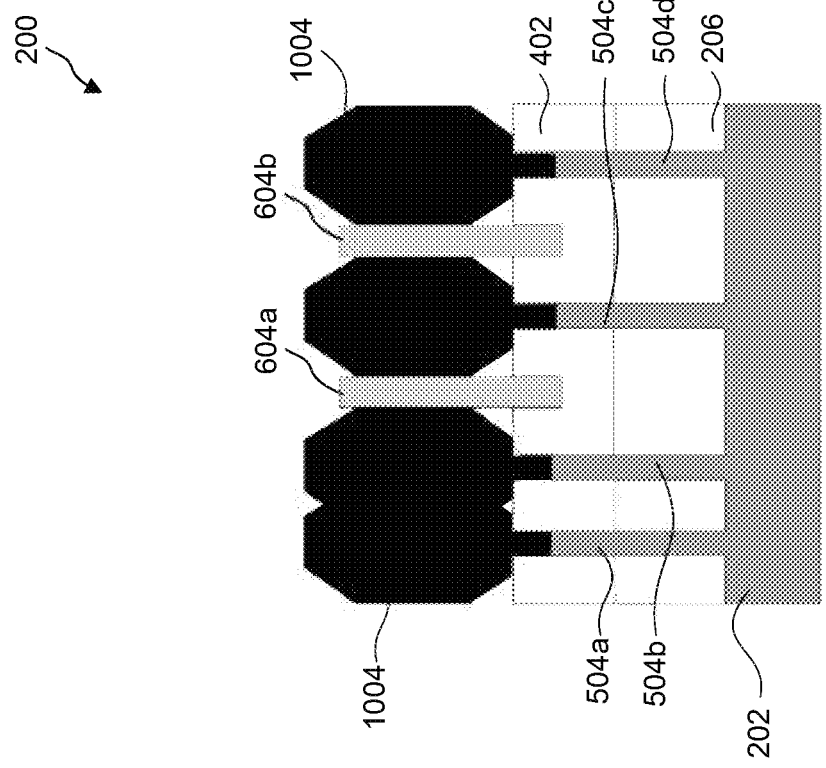
FIGS. 5D-5E are cross-sectional views of partially-fabricated fin-based structure after forming epitaxial source/drain structures using an etch back and grow method, in accordance with some embodiments.
Figure 5D:
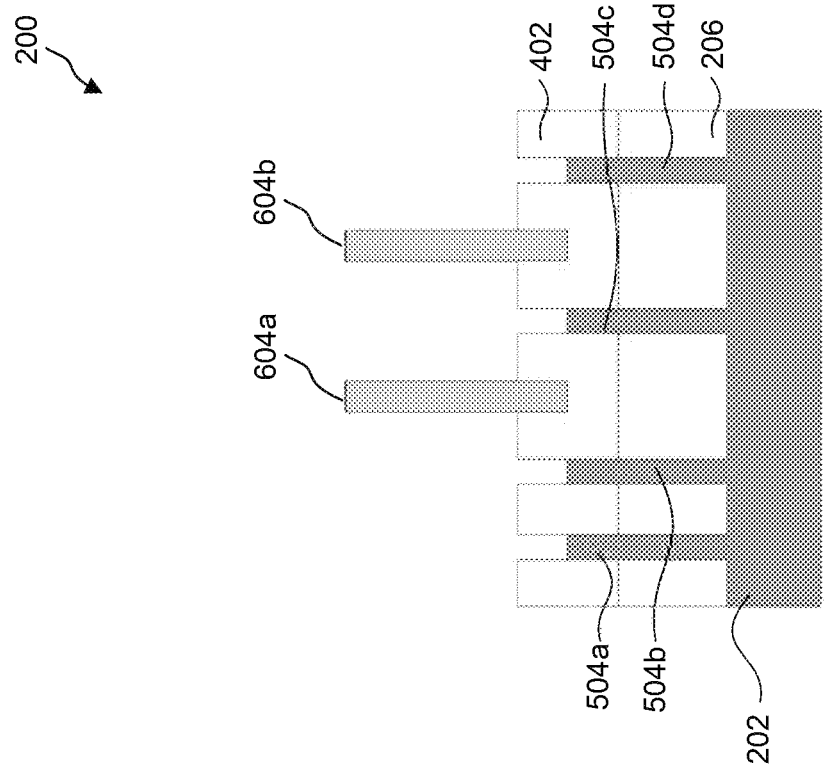

FIGS. 5A-5C are views of an exemplary partially-fabricated semiconductor structure 200 after forming sacrificial structures and epitaxial source/drain structures, in accordance with some embodiments. FIG. 5A is a 3D view of the exemplary structure. FIG. 5B is a cross-sectional view of the structure along the A-A' line as illustrated by FIG. 5A. FIG. 5C is a top-down view of the structure. FIGS. 5D-5E are cross-sectional views of partially-fabricated semiconductor structure 200 for forming epitaxial source/drain structures using an etch back and grow method.

Sacrificial structures 921a-921e can be formed in parallel and extend along a direction that is different from the direction of active fin structures 504a-504d or 504a'-504b'. Sacrificial structures 921a-921e can be uniformly spaced to provide a uniform pattern density and can be formed over self-aligned isolation fins and/or active fin structures. For example, sacrificial structures 921a and 921e are respectively formed over the top surface and the opposite side surfaces of active fin structures 504a-504d and 504a'-504d' and self-aligned isolation fins 604a-604b and 604a'-604b'. Sacrificial structure 921c is formed over self-aligned isolation fin 604t, therefore has a lower gate height than sacrificial structure 921a or 921e such that top surfaces of sacrificial structures 921a-921e are coplanar. In some embodiments, sacrificial structures 921a-921e include poly structures 920. The length of the poly structure 920 can be between about 12 nm and about 16 nm (e.g., between 12 nm and 16 nm). In some embodiments, the height of the poly structure 920 measured as the vertical distance between the top and bottom surfaces of the poly structure can be between about 100 nm and about 150 nm (e.g., between 100 nm and 150 nm). In some embodiments, sacrificial structures 921a-921e further include oxide hard masks 924 and nitride hard masks 922. In some embodiments, the thickness of the oxide hard mask 924 is between about 40 nm and about 80 nm (e.g., between 40 nm and 80 nm), and the thickness of the nitride hard mask 922 is between about 10 nm and about 30 nm (e.g., between 10 nm and 30 nm). In some embodiments, poly structure 920 is made of poly silicon, oxide hard mask 924 is made of $SiO_x$, and nitride hard mask 922 is made of silicon nitride ($SiN_x$) or silicon carbon nitride (SiCN). In some embodiments, forming sacrificial structures 921a-921e includes depositing a stack of gate materials including a gate electrode layer, a nitride hard mask layer, and an oxide hard mask layer, patterning the stack of gate materials using lithography, and etching the stack of gate materials to form poly structure 920, nitride hard mask 922, and oxide hard mask 924. In some embodiments, the etching of the stack of gate materials stops on the surface of gate oxide layer material 802'.

Sacrificial structures formed over self-aligned isolation fin 604t can provide a number of benefits. First, self-aligned isolation fins can prevent gaps or voids between fins and/or gate structures. In some embodiments, sacrificial structures can be formed at the interface where self-aligned isolation fin 604t abuts active fin structures 504a-504d and 504a'-504d' and self-aligned isolation fins 604a-604b and 604a'-604b'. In an example, sacrificial structures 921b is not only formed over active fin structures 504a-504d and self-aligned isolation fins 604a-604b, but also formed over self-aligned isolation fin 604t. In another example, sacrificial structure 921d is formed in a similar fashion. Without self-aligned isolation fin 604t, air gaps can exist between active fin structures 504a-504d and sacrificial structures that forms at the ends of active fin structures 504a-504d. Air gaps can lead to voids that degrade device performance. However, self-aligned isolation fin 604t formed abutting active fin structures 504a-504d can prevent the air gaps or voids. Second, self-aligned isolation fins can prevent some sacrificial structures from collapsing due to a lower height of the sacrificial structures compared to conventional sacrificial structures. Without self-aligned isolation fin 604t, a conventional sacrificial structure in the place of sacrificial structure 921c may have to be formed directly over isolation structure 206. In order to achieve an overall coplanar top surfaces across adjacent isolation structures, the height of the conventional sacrificial structure is higher than sacrificial structure 921c. Therefore the conventional sacrificial structure has a higher aspect ratio and is more likely to collapse. In addition, because sacrificial structure 921c is formed on self-aligned isolation fin 604t, it can have a lower gate height compared to sacrificial structures 921a or 921e to achieve coplanar top surfaces across sacrificial structures 921a-921e. Therefore, sacrificial structure 921c has a lower aspect ratio and less likely to collapse. Third, self-aligned isolation fin 604t provides mechanical support to the sacrificial structures and prevent gate structure from collapsing. For example, mechanical support provided by the fins increases the mechanical strength of the sacrificial structures because sacrificial structures 921b and 921d are both anchored or partially anchored over self-aligned isolation fin 604t and self-aligned isolation fins 604a-1604b and 604a'-604b'.

As shown in FIG. 5A, a spacer 1002 is formed on both side surfaces of sacrificial structures 921a-921e. Spacer 1002 is a low-k spacer with dielectric constant less than 4.0. In some embodiments, spacer 1002 includes elements such as, for example, silicon (Si), oxygen (O), and carbon (C). In some embodiments, the thickness of spacer 1002 is between about 6 nm and about 8 nm (e.g., between 6 nm and 8 nm). In some embodiments, forming spacer 1002 includes a blanket deposition of a spacer layer followed by pulling back the spacer layer with an etch (e.g., a dry etch) process. In some embodiments, pulling back the spacer layer includes etching and removing the spacer layer deposited over top surfaces of the sacrificial structures 921a-921e, and exposed surfaces of gate dielectric layer material 802'. In some embodiments, pulling back the spacer 1002 also includes etching a portion of spacer 1002 formed on the side surfaces of sacrificial structures 921a-921e.

Gate dielectric layer material 802' not protected by the formed spacer 1002 can be removed to expose the underlying active fin structures and self-aligned isolation fins. In some embodiments, a dry etch process can be used to remove gate dielectric layer material 802'. For example, gate dielectric layer material 802' can be removed from surfaces not protected by the formed spacer 1002, and exposing top surfaces and side surfaces of active fin structures 504a-504d and 504a'-504d', self-aligned isolation fins 604a-604b, 604a'-604b', and 604t. In some embodiments, removing the gate dielectric layer material 802' is done so that epitaxy source/drain layers can be grown on the exposed active fin structures 504a-504d and 504a'-504d'.

After exposed gate dielectric layer material 802' has been removed, its remaining portions form gate dielectric layer 802. The active fin structures can then be doped with p-type dopants for use in p-type FinFET devices or doped with n-type dopants for use in n-type FinFET devices. In some embodiments, the active fin structures can have different types of dopants from one another. In some embodiments, the active fin structures can be doped using the same type of dopants. For example, some active fin structures can be doped with p-type dopants while some active fin structures can be doped with n-type dopants, such that semiconductor structure 200 can include both p-type and n-type FinFETs. Active fin structures with different dopants can be achieved by protecting a first selection of active fin structures using a photoresist layer formed by a patterning process, and dope the exposed second selection of active fin structures with a type of dopants. The photoresist layer can then be removed and formed again using a patterning process over the second selection of active fin structures and exposing the first selection of active fin structures to a doping process. The patterning process can include forming a photoresist layer overlying the semiconductor structure, exposing the resist to a pattern, performing post-exposure bake processes, and developing the resist to form a patterned photoresist layer. In some embodiments, the photoresist layer is a positive tone resist. The doping process can be any suitable doping process such as, for example, an ion implantation process.

Epitaxial source/drains 1004 are formed on active fin structures 504a-504d and 504a'-504d'. In some embodiments, epitaxial source/drains 1004 are formed by growing epitaxial layers over exposed surfaces of active fin structures 504a-504d and 504a'-504d'. Growing the epitaxy layers on exposed surfaces of active fin structures 504a-504d and 504a'-504d' can include performing a pre-clean process to remove the native oxide on the surface of active fin structures 504a-504d and 504a'-504d'. Next, an epitaxy process is performed to grow the epitaxy layers on the surfaces of the active fin structures 504a-504d and 504a'-504d'. In some embodiments, the epitaxy process is an SiGe epitaxy process performed at a temperature between about 400° C. and about 500° C. (e.g., between 400° C. and 500° C.). The epitaxy process is a selective process that only grows the epitaxy layer on the exposed surfaces of the active fin structures. The growth process continues until a nominal size and/or structure of epitaxial source/drains 1004 has been reached. In some embodiments, epitaxial source/drains 1004 is a SiGe structure. In some embodiments, the thickness of epitaxial source/drains 1004 is between about 10 nm and about 20 nm (e.g., between 10 nm and 20 nm). In some embodiments, epitaxial source/drains 1004 are doped with p-type or n-type dopants during the epitaxy process. For example, epitaxial source/drains 1004 are doped with boron (B) during the epitaxy process.

The epitaxial source/drains 1004 can also take different shapes depending on various factors such as, for example, the epitaxy process condition, the crystalline orientation of active fin structures, and/or other suitable factors. In some embodiments, the shape of the epitaxial source/drains 1004 is a diamond like shape. As shown in FIG. 5D, active fin structures 504a-504d are etched back using a suitable etching process such as, for example, a dry RIE etching process. In some embodiments, the top surface of the remaining active fin structures 504a-504d is recessed below the top surface of spacing layer 402, as shown in FIG. 5D. In some embodiments, the top surface of the remaining active fin structures 504a-504d is substantially coplanar or higher or lower than the top surface of spacing layer 402. An epitaxy process is then performed to grow epitaxy layers from the top surfaces of active fin structures 504a-504d. The epitaxy process can use the top surfaces of active fin structures 504a-504d as a seed layer and the growth process continues until a nominal size and/or structure of epitaxial source/drains 1004 has been reached. An in-situ doping process can also be performed during the epitaxy process. A benefit of self-aligned isolation fins is for it to serve as a barrier layer between adjacent epitaxial source/drains. For example, as shown in FIG. 5E, epitaxial source/drains 1004 growing out of respective active fin structures 504b and 504c are separated by self-aligned isolation fin 604a, while epitaxial source/drains 1004 growing out of respective active fin structures 504c and 504d are separated by self-aligned isolation fin 604b. Therefore, the self-aligned isolation fins prevents epi-bridging between formed epitaxial source/drains.

Figure 6A:
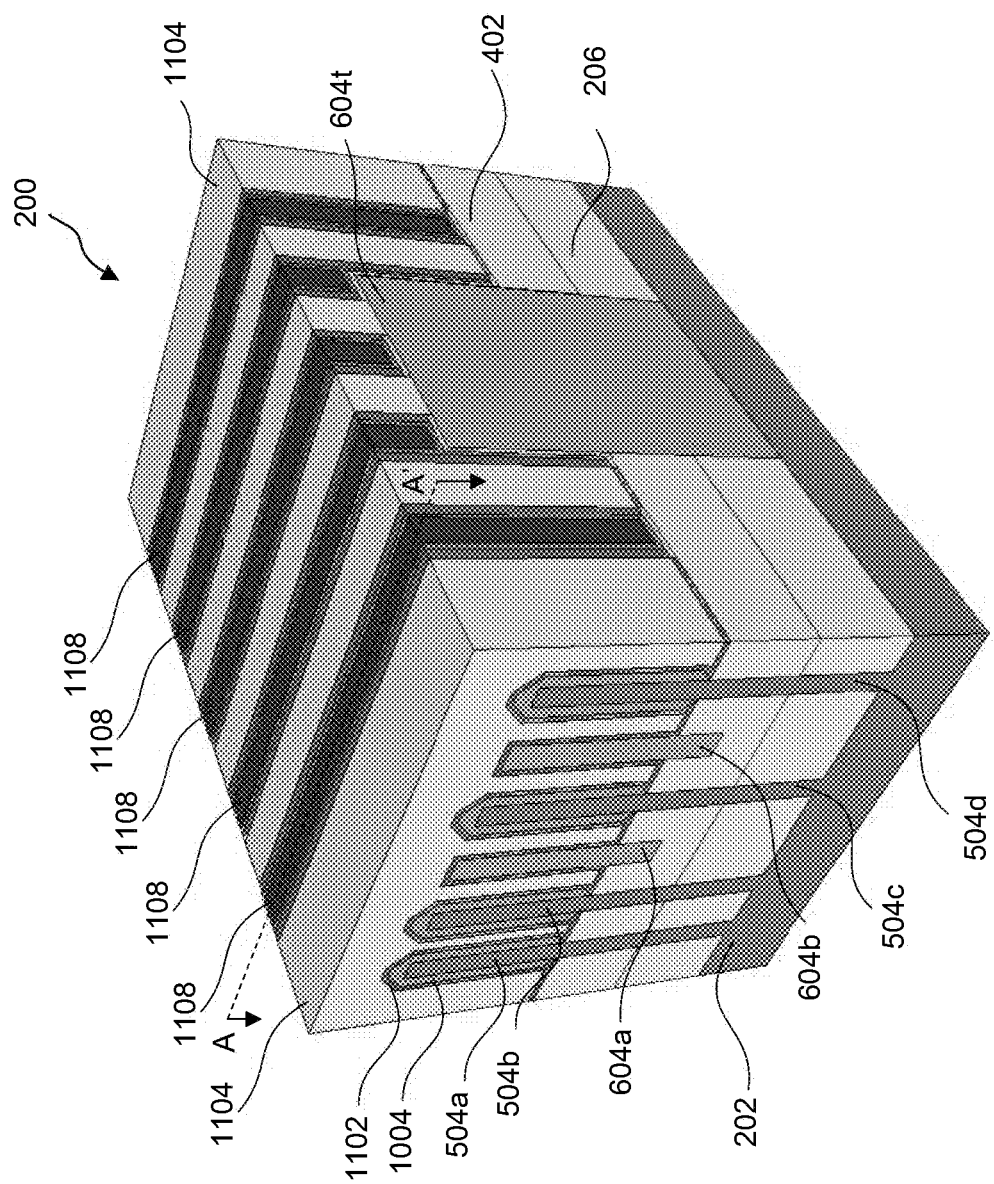

FIGS. 6A-6C are views of an exemplary partially-fabricated semiconductor structure 200 after forming interlayer dielectric layers and performing a gate replacement process, in accordance with some embodiments. FIG. 6A is a 3D view of the exemplary structure. FIG. 6B is a cross-sectional view of the structure through the gate structures and along the A-A' line as illustrated by FIG. 6A. FIG. 6C is a top-down view of the structure.

A contact etch stop layer 1102 can be deposited over epitaxial source/drains 1004 and/or self-aligned isolation fins of the semiconductor structure 200 as described above with reference to FIGS. 6A-6C. Contact etch stop layer 1102 can be used to protect epitaxial source/drains 1004 against moisture, dopants, and/or oxidation during subsequent processes. For example, contact etch stop layer 1102 can protect epitaxial source/drains 1004 from oxidation during the subsequent interlayer dielectric layer deposition. In some embodiments, contact etch stop layer 1102 can act as an etch stop layer for the subsequent contact etch so that epitaxial source/drains 1004 or self-aligned isolation fins below contact etch stop layer 1102 are not damaged by the contact etch. In some embodiments, contact etch stop layer 1102 can be a silicon nitride layer. In some embodiments, depositing contact etch stop layer 1102 can be performed using an ALD process, a CVD process, other suitable processes, and/or combinations thereof.

An interlayer dielectric layer 1104 can be formed using a blanket deposition followed by a planarization process to remove the excess interlayer dielectric material that is formed over the sacrificial structures. In some embodiments, interlayer dielectric layer 1104 is an oxide (e.g., $SiO_x$) layer. In some embodiments, interlayer dielectric layer 1104 is deposited using a CVD process, an ALD process, an FCVD process, a spin-on process, other suitable processes, and/or combinations thereof. In some embodiments, an additional anneal process performed at a temperature between about 400° C. and about 600° C. (e.g., between 400° C. and 600° C.) can be used to treat interlayer dielectric layer 1104 to densify the as-deposited dielectric layer. In some embodiments, after depositing interlayer dielectric layer 1104, a planarization process (e.g., CMP) is performed to remove portions of interlayer dielectric layer 1104 that is formed over the top surfaces of sacrificial structures 921a-921e. The planarization process can be performed such that the top surfaces of interlayer dielectric layer 1104, spacer 1002, and poly structure 920 are coplanar. In some embodiments, the oxide hard mask 924 and nitride mask 922 are also removed during the planarization process or during an additional etch process, so that the top surfaces of poly structures 920 is exposed. In some embodiments, after the planarization process, the height of poly structure 920 is between about 80 nm and about 130 nm (e.g., between 80 nm and 130 nm).

In some embodiments, sacrificial structures 921a-921e can be replaced by metal gate structures. More specifically, poly structures 920 can be replaced by metal gate electrodes 1108. First, poly structures 920 can be removed using a dry etch, a wet etch, or a combination thereof. Second, metal gate electrodes are deposited into the openings. In some embodiments, the process used to remove poly structure 920 is selective such that interlayer dielectric layer 1104 and spacer 1002 remain after the etch process. Therefore, the removal of poly structure 920 can form openings between opposing spacers 1002. In some embodiments, removing poly structure 920 can also include removing the gate dielectric layer 802 such that a second gate dielectric layer 1106 can be formed before forming metal gate electrode 1108 in the openings. In some embodiments, a second gate dielectric layer 1106 can be formed over gate dielectric layer 802, as shown in FIG. 6B. In some embodiments, the second gate dielectric layer 1106 can include an interfacial layer and a high-k dielectric layer. In some embodiments, the interfacial layer is an $SiO_x$ layer. In some embodiments, the high-k dielectric layer includes a high-k dielectric material such as, for example, hafnium oxide, lanthanum oxide, aluminum oxide, zirconium oxide, silicon nitride, or other suitable high-k materials. In some embodiments, the dielectric constant of the high-k dielectric layer is higher than about 3.9.

In some embodiments, the dielectric constant of the high-k dielectric layer is higher than about 7.0. In some embodiments, forming the second gate dielectric layer 1106 is performed using an ALD process, a CVD process, other suitable deposition processes, and/or combinations thereof.

In some embodiments, metal gate electrodes 1108 can include a metal conductor such as tungsten (W), titanium, tantalum, copper, titanium nitride, tantalum nitride, molybdenum, other suitable metal or metal alloys, and/or combinations thereof. In some embodiments, metal gate electrodes 1108 can also include a diffusion barrier such as, for example, titanium nitride (TiN) and titanium silicon nitride (TiSiN). In some embodiments, metal gate electrodes 1108 can further include a work-function layer such as, for example, TiN and titanium aluminum (TiAl) for n-type FinFET devices and tantalum nitride (TaN) and TiAl for p-type FinFET devices. In some embodiments, forming metal electrodes 1108 can be performed using an ALD process, a CVD process, other suitable deposition processes, and/or combinations thereof.

In some embodiments, after forming metal gate structures in the openings, a planarization process (e.g., a CMP process) is performed to planarize the top surfaces of the semiconductor structure. In some embodiments, the planarization process continues until the top surfaces of interlayer dielectric layer 1104, second gate dielectric layer 1106, spacers 1002, and metal gate electrodes 1108 are substantially coplanar.

Figure 7A:
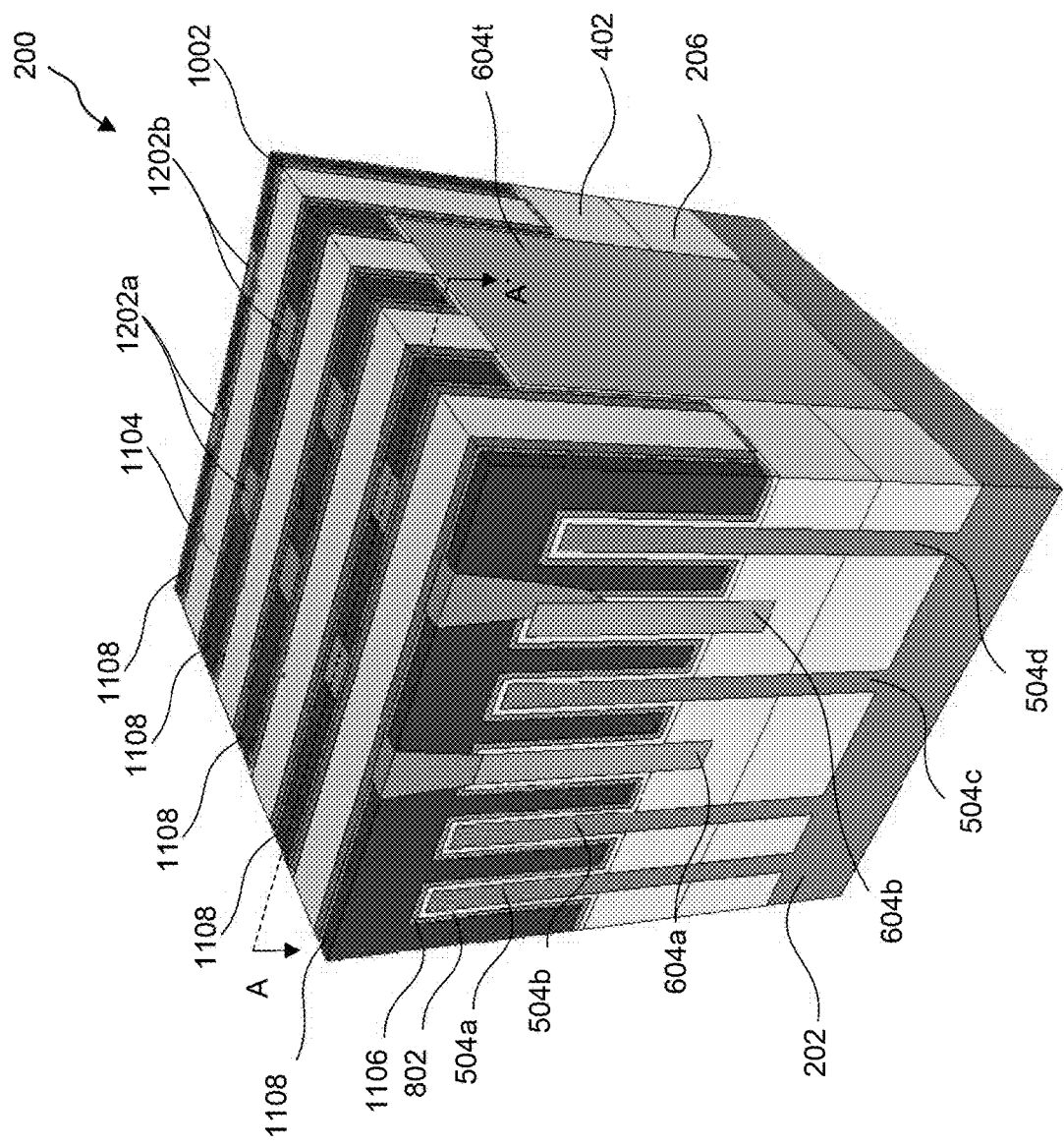

FIGS. 7A-7C are views of an exemplary partially-fabricated semiconductor structure 200 after forming gate isolation structures, in accordance with some embodiments. FIG. 7A is a 3D view of a portion of the exemplary structure. FIG. 7B is a cross-sectional view of the structure through the gate structures and along the A-A' line as illustrated by FIG. 7A. FIG. 7C is a top-down view of the structure.

FIG. 7A is a 3D view of the exemplary structure with a side that is the cross-sectional view of the gate structures. Gate isolation structures 1202a-1202b can be formed in metal gate electrodes 1108 and over self-aligned isolation fins to provide separate gate electrode control for one or more FinFETs. Gate isolation structures 1202a-1202b can be formed over self-aligned isolation fins 604a-604b, and together they form a barrier layer to separate gate electrode 1108 into different portions to allow separate control over selected transistors. Forming gate isolation structures 1202a-1202b over self-aligned isolation fins 604a-604b provides the benefit of not having the need to extend gate isolation structures down to spacing layer 402 or STI region 206 in order to achieve separation between gate structures. This also prevents interlayer dielectric loss as the etching depth of gate isolation structures is less. Some gate isolation structures are aligned with the underlying self-aligned isolation fins. Some gate isolation structures that are not aligned with self-aligned isolation fins 604a-604b still fully maintain their function as if they are aligned, but in addition provide the benefit of an increased margin for alignment and overlay requirements of the photolithography process, as described in detail further below. In addition, self-aligned isolation fins 604a-604b can fill up regions between active fin structures to prevent metal gate structures 1108 from forming in those regions. For example, self-isolated fin 604a fills up a region between active fin structures 504b and 504c that would otherwise be filled with metal gate structure material. Therefore self-aligned isolation fins can reduce the overall thickness of metal gate structures 1108 which can lead to greater AC gain due to reduced parasitic capacitance.

Gate isolation structures 1202a-1202b can be formed in metal gate electrodes 1108 by first forming openings that are over one or more self-aligned isolation fins. The location and selection of gate isolation structures 1202a-1202b can depend on the device needs such as, for example, separate gate control of certain FinFETs. The openings can be formed by a patterning process followed by an etching process to remove exposed portions of metal electrodes 1108. In some embodiments, a photoresist layer is coated and patterned to define areas to be recessed and subsequently filled by gate isolation structures. In some embodiments, the photoresist layer can be a positive tone photoresist. In some embodiments, the photoresist layer has a thickness between about 50 nm and about 100 nm (e.g., between 50 nm and 100 nm). In some embodiments, the etch process can be an anisotropic etch (e.g., a dry etch) process. In some embodiments, the etch process etches the exposed portion of metal gate structure 1108 and exposes the underlying second gate dielectric layer 1106 and gate dielectric layer 802. In some embodiments, the etch process can further proceed to remove the exposed underlying second gate dielectric layer 1106 and gate dielectric layer 802 and stops at self-aligned isolation fins 604a-604b. In some embodiments, the process can stop at gate dielectric layer 802 and is not shown in FIGS. 7A and 7B for simplicity. After the openings are formed, gate isolation structure material can be formed using a blanket deposition to fill and/or overfill the formed openings. In some embodiments, gate isolation structure material can be a silicon nitride layer. In some embodiments, depositing gate isolation structure material can be performed using an ALD process, a CVD process, other suitable processes, and/or combinations thereof. In some embodiments, after the blanket deposition of gate isolation structure material that fills up the openings, a planarization process (e.g., a CMP process) is performed to remove the gate isolation structure material that is formed over the top surface of interlayer dielectric layer 1104 and metal gate electrodes 1108. Gate isolation structures 1202a-1202b can be formed after the planarization process. In some embodiments, the planarization process continues until the top surfaces of gate isolation structures 1202a-1202b, interlayer dielectric layer 1104, second gate dielectric layer 1106, spacers 1002, and metal gate electrodes 1108 are substantially coplanar. The depth of gate isolation structures 1202a-1202b measured between the top surface of gate electrodes 1108 and the top surface of self-aligned isolation fins 604a-604b can be less than about 60 nm.

In some embodiments, gate isolation structure 1202a can be formed directly above and aligned with self-aligned isolation fin 604a, as shown in FIGS. 7A and 7B. In some embodiments, gate isolation structure can be formed with a horizontal offset with reference to the self-aligned isolation fins, and only a portion of gate isolation structure is formed directly over self-aligned isolation fin. For example, gate isolation structure 1202b can be formed partially above self-aligned isolation fin 604b with a horizontal overlap distance $d_4$. The overlap distance $d_4$ is measured as the horizontal length of contact between gate isolation structure 1202b and self-aligned isolation fin 604b and can be equal to or greater than about 4 nm (e.g., between about 4 nm and about 5 nm). Thus, the need is reduced for accurately aligning the boundaries of the gate isolation structures with the underlying self-aligned isolation fins, which provides an increased margin or tolerance for alignment and overlay requirements in the lithography processes.

Figure 8A:
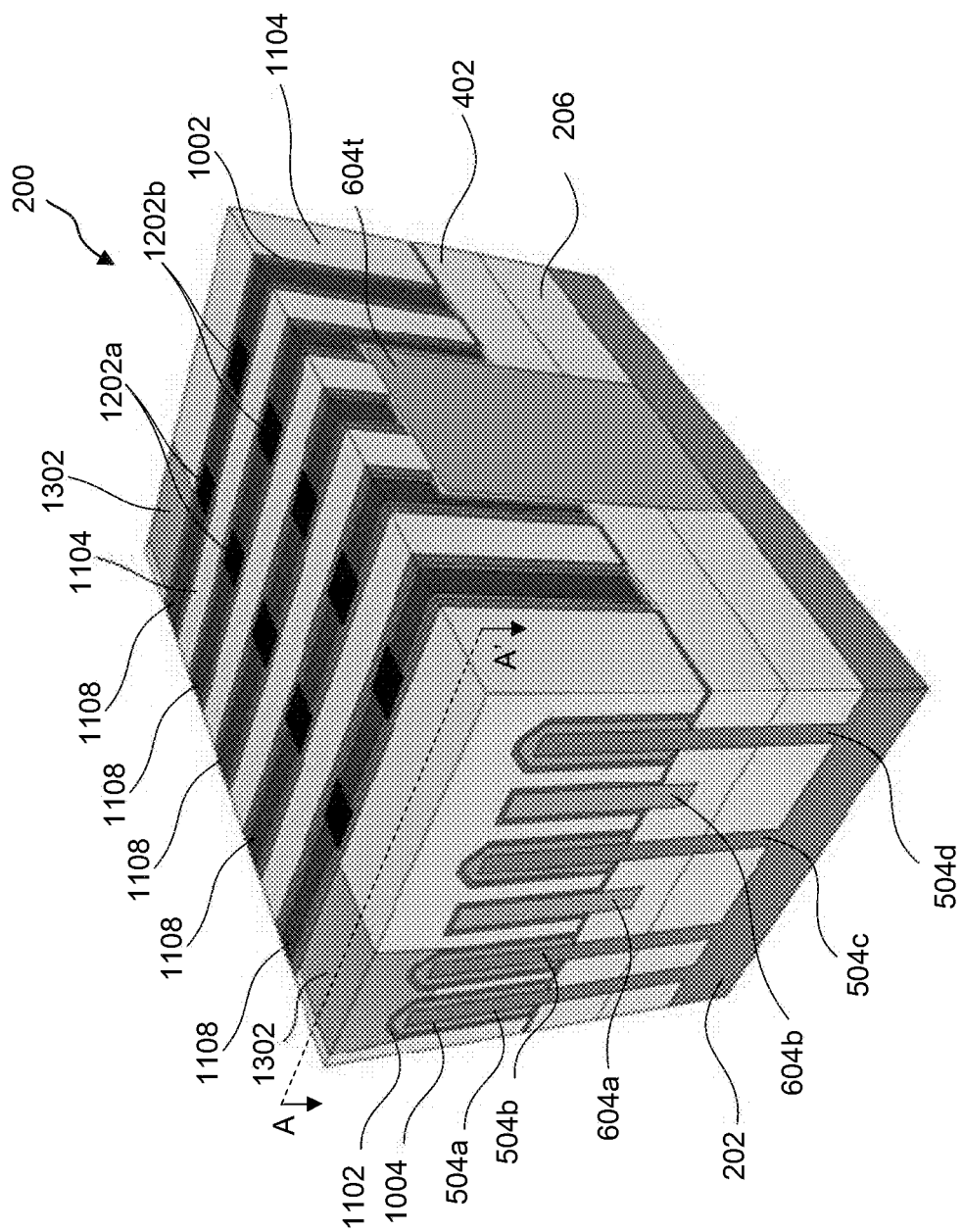
Figure 8D:
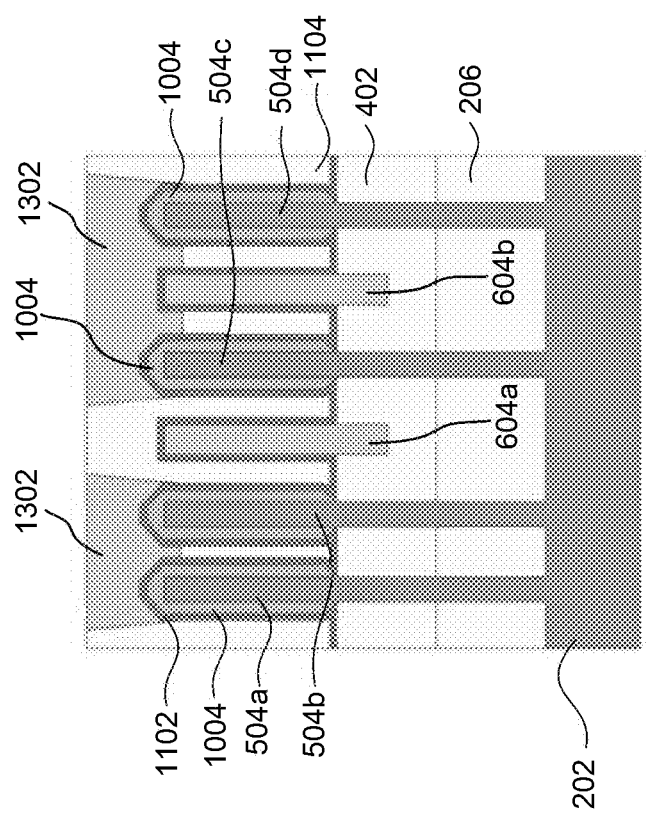
FIG. 8D is a cross-sectional view of a partially-fabricated fin-based structure with source/drain contacts formed over self-aligned isolation fins, in accordance with some embodiments.

FIGS. 8A-8C are views of an exemplary partially-fabricated semiconductor structure 200 after forming source/ drain contacts, in accordance with some embodiments. FIG. 8A is a 3D view of the exemplary structure. FIG. 8B is a cross-sectional view of the structure along the A-A' line as illustrated by FIG. 8A. FIG. 8C is a top-down view of the structure. FIG. 8D is a cross-sectional view of the exemplary structure with source/drain contacts formed over self-aligned isolation fins.

Source/drain contacts 1302 can be formed in interlayer dielectric layer 1104 and over the epitaxial source/drains 1004. Patterning and etching processes can be used to form openings in interlayer dielectric layer 1104 for deposition of source/drain contact material. In some embodiments, source/drain contact material is formed by a blanket deposition using an ALD process, a CVD process, a PVD process, or a combination thereof. In some embodiments, the source/drain contact material can be made of metal such as, for example, cobalt (Co), tungsten (W), copper (Cu), nickel (Ni), ruthenium (Ru), or other suitable materials. In some embodiments, a planarization process (e.g., a CMP process) is performed to remove excessive epitaxial source/drain contact material that are formed over the top surface of interlayer dielectric layer 1104 or the top surface of the metal gate structures. Source/drain contacts 1302 can be formed after the planarization process, and the top surfaces of the source/drain contacts 1302, interlayer dielectric layer 1104, and the metal gate electrodes 1108 are coplanar. In some embodiments, source/drain contacts 1302 can further include a barrier layer to avoid diffusion of materials from source/drain contacts 1302 into interlayer dielectric layer 1104, or vice versa.

In some embodiments, forming source/drain contacts 1302 can further include forming a silicide layer between source/drain contacts 1302 and epitaxial source/drains 1004. In some embodiments, forming the silicide layer includes removal of the contact etch stop layer 1102 that covers the top surfaces of epitaxial source/drains 1004. In some embodiments, after removing contact etch stop layer 1102, an additional etch is performed to recess the top surfaces of the epitaxial source/drains 1004 to form a flat surface for the source/drain contacts. In some embodiments, recessing the epitaxial source/drains 1004 increases the contact area between the source/drain contacts 1302 and epitaxial source/drains 1004 which can reduce contact resistance. In some embodiments, forming the silicide layer is performed by a silicidation process that includes depositing a metal layer, causing the metal to react with the epitaxy layers or the active fin structures or the upper sections of the active fin structures, and removing the un-reacted metal layer. In some embodiments, the silicide layer can includes cobalt silicide ($CoSi_x$), nickel silicide ($NiSi_x$), other suitable silicide layers, and/or combinations thereof.

In some embodiments, source/drain contacts 1302 can be formed between epitaxial source/drains 1004 that are separated by self-aligned isolation fins. For example, as shown in FIG. 8D, source/drain contact 1302 is also formed between two epitaxial source/drains 1004 that are separated by self-aligned isolation fin 604b. During the formation of source/drain contacts 1302, self-aligned isolation fin 604b can prevent source/drain contact 1302 from cutting deeper into interlayer dielectric layer 1104 between active fin structures 504c-504d and/or further down into spacing layer 402 or isolation structures 206. Therefore, a source/drain contact uniformly deposited with reduced thickness can be achieved. Thinned source/drain contacts can provide the benefit of reduced parasitic capacitance which leads to greater AC gain. In addition, reducing the deep-cutting effect of source/drain contacts into interlayer dielectric layer can also prevent void or seam to be formed around and in the metal source/drain contacts.

Self-aligned isolation fins can also be formed using a fin replacement process. The fin replacement process forms the self-aligned isolation fins by removing a portion of material from active fin structures and replaces it with dielectric isolation fin material. This mechanism is also a self-aligned method for forming isolation fins and further provides the benefit of reducing the need for a spacing layer. FIGS. 9A-15C describes the fin replacement process and subsequent processing in details below.

Figure 9A:
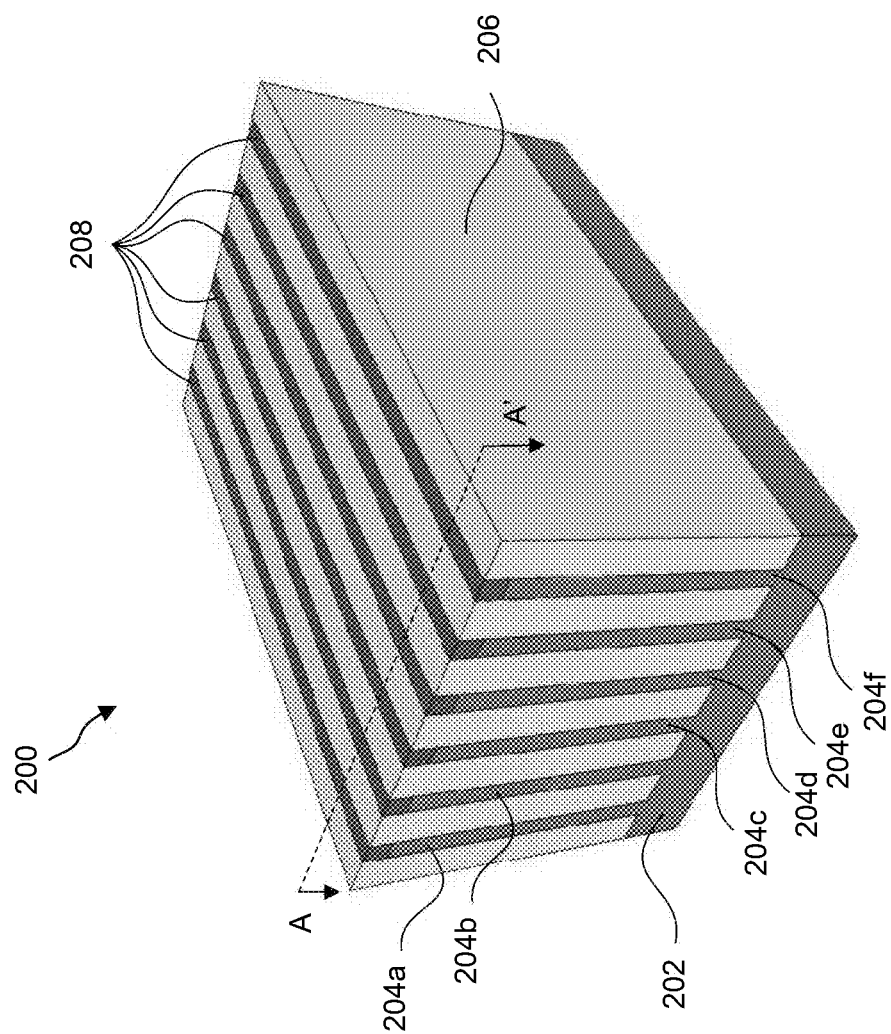
FIGS. 9A-9C are respective isometric, cross-sectional, and top-down views of a partially-fabricated fin-based structure after active fin structures are formed on a substrate, in accordance with some embodiments.
Figure 9C:
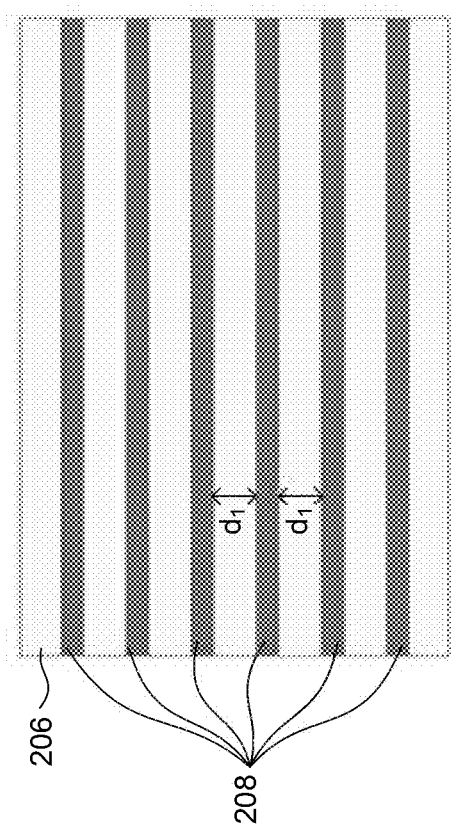
Figure 9B:
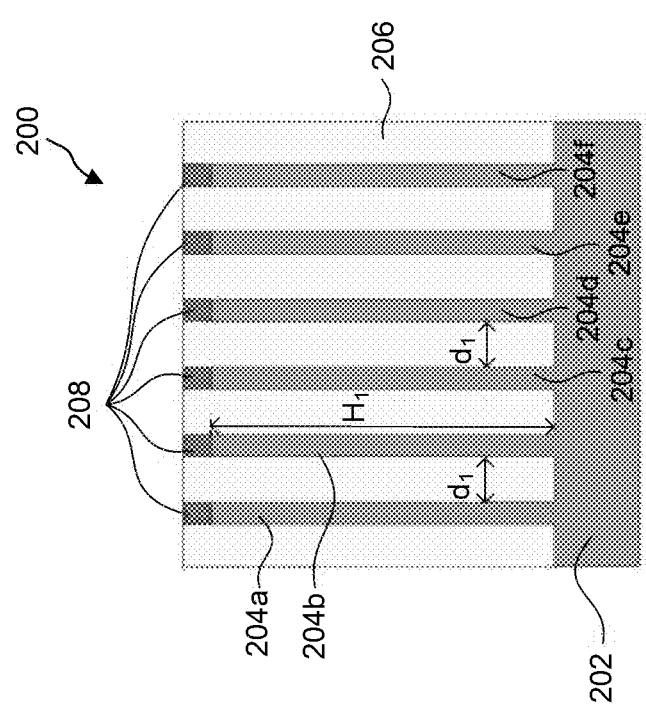

FIGS. 9A-9C are views of an exemplary partially-fabricated semiconductor structure 200 after a number of active fin structures 204a-204f are formed on a substrate 202, in accordance with some embodiments. FIG. 9A is a 3D view of the exemplary structure. FIG. 9B is a cross-sectional view of the structure along the A-A' line of the exemplary structure as illustrated by FIG. 9A. FIG. 9C is a top-down view of the exemplary structure.

The semiconductor structure 200 described in FIGS. 9A-9C can be formed using structures and methods similar to the structure described with reference to FIGS. 2A-2C. For example, substrate 202 can be made of silicon or some other suitable elementary semiconductor material. Active fin structures 204a-204f protrude from substrate 202 and are mutually parallel with one another, as illustrated by FIG. 9A. In some embodiments, active fin structures 204a-204f can be doped with p-type or n-type dopants. In some embodiments, active fin structures 204a-204f are made of silicon or other suitable materials. In some embodiments, active fin structures 204a-204f are formed by patterning a hard mask layer 208 and etching into substrate 202 using an anisotropic etch (e.g., dry etch). In some embodiments, hard mask layer 208 is made of silicon nitride. Active fin structures 204a-204f can have a width along the A-A' direction between about 5 nm and about 20 nm (e.g., between about 6 nm and about 10 nm, between about 7 nm and about 18 nm, between about 10 nm and about 15 nm, or between about 12 nm and about 18 nm). In some embodiments, the active fin structures 204a-204d have a height $H_1$ between about 100 nm and about 140 nm (e.g., between 100 nm and 140 nm) measured from the upper surface of substrate 202, as shown in FIG. 9B. In some embodiments, isolation structures 206 are STI structures and can fill the openings and provide isolation between active fin structures 204a-204f and can be made of a dielectric material such as, for example, silicon oxide.

Separations can be different between active fin structures of the semiconductor structure described in FIGS. 9A-9C and the semiconductor structure in FIGS. 2A-2C. For example, active fin structures 204a-204f can be equally spaced as shown in FIGS. 9A and 9B. In some embodiments, the distance $d_1$ between adjacent active fin structures 204a-204f can be between about 10 nm and about 25 nm (e.g., between about 12 nm and about 20 nm).

Figure 10A:
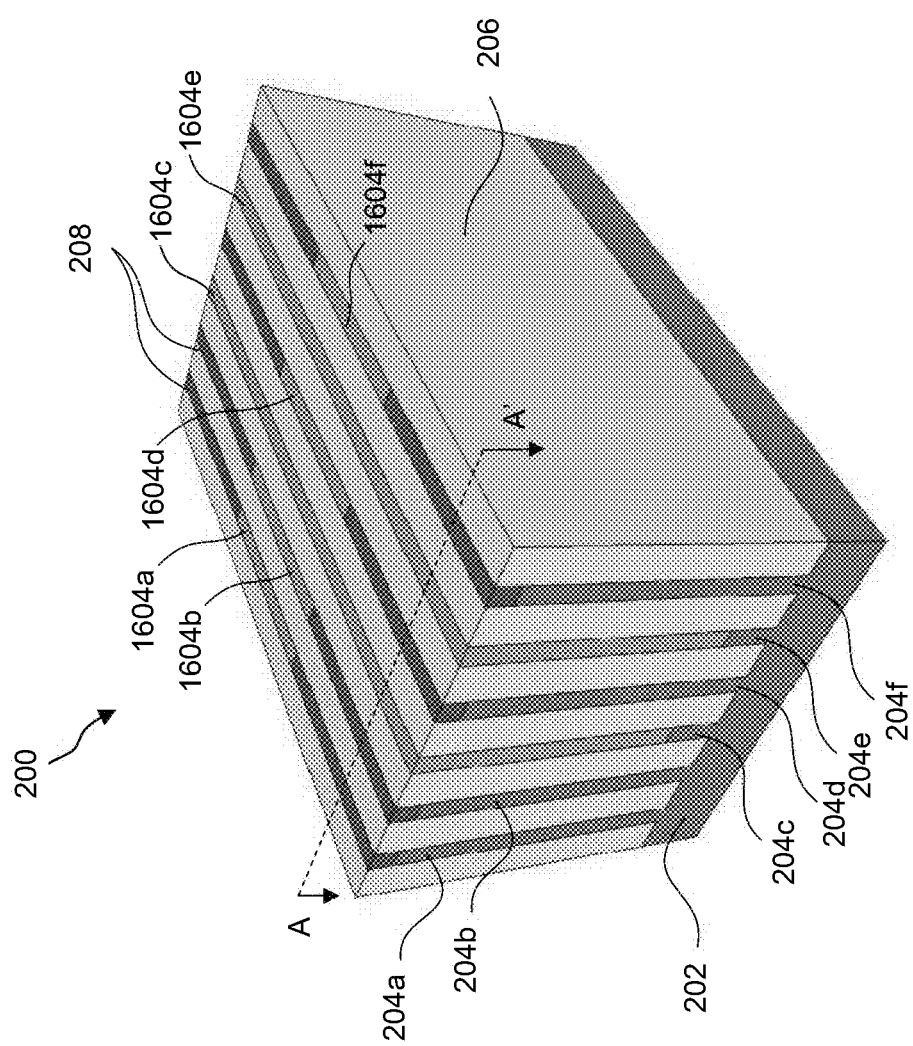
FIGS. 10A-10C are respective isometric, cross-sectional, and top-down views of a partially-fabricated fin-based structure after forming self-aligned isolation fins in openings, in accordance with some embodiments.
Figure 10C:
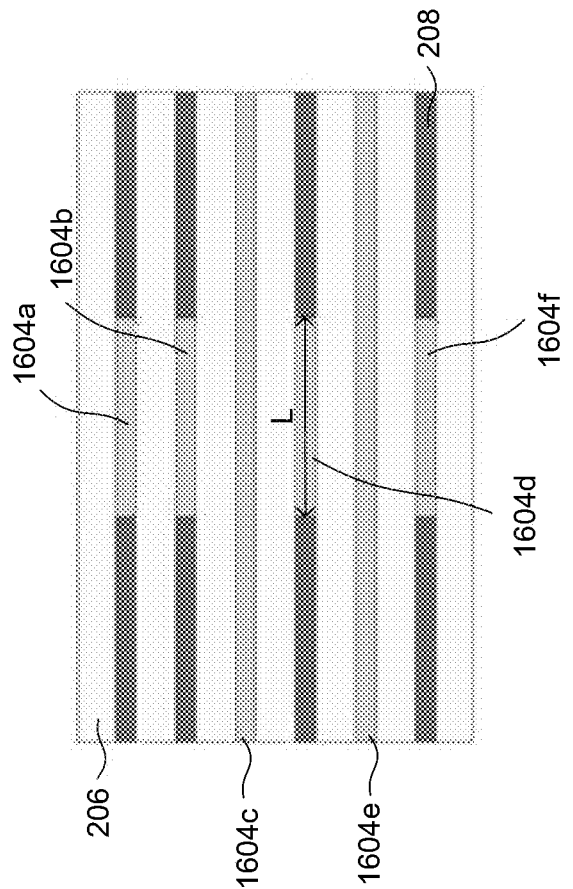
Figure 10B:
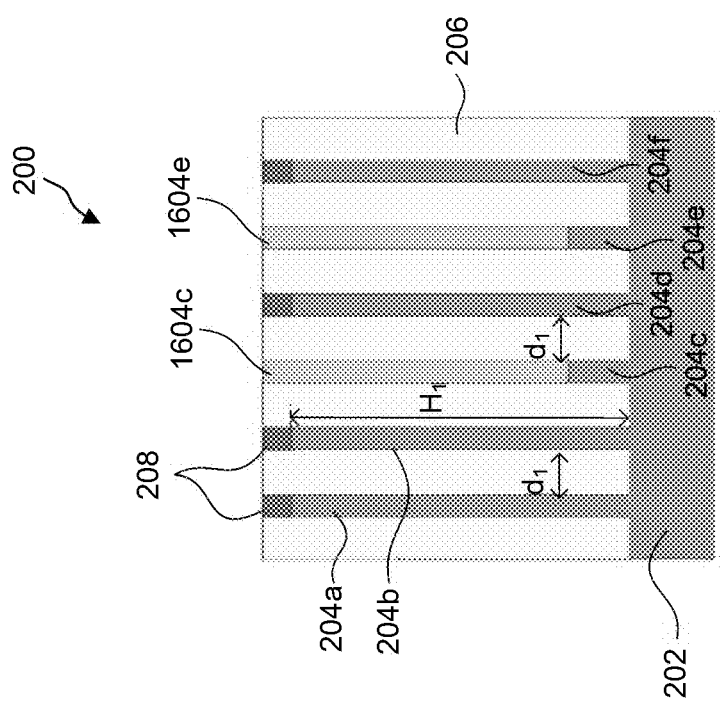

FIGS. 10A-10C are views of an exemplary partially-fabricated semiconductor structure 200 after forming openings in selected active fin structures and forming self-aligned isolation fins in the openings, in accordance with some embodiments. FIG. 10A is a 3D view of the exemplary structure. FIG. 10B is a cross-sectional view of the structure along the A-A' line of the exemplary structure as illustrated by FIG. 10A. FIG. 10C is a top-down view of the exemplary structure.

Openings can be formed at selected locations of active fin structures 204a-204f by removing hard mask layer 208 and etching back a portion of selected active fin structures 204a-204f. In some embodiments, only a portion of an active fin structure is removed to form an opening in the active fin structure and between adjacent isolation structures 206. For example, opening can be formed by only removing a portion of hard mask layer 208 over active fin structures 204a, 204b, 204d, and 204f. The remaining hard mask layer 208 can be used as a masking element for the etching process that removes the exposed active fin structure material. In some embodiments, an active fin structure is removed throughout its length. For example, openings can be formed by removing hard mask layer 208 of active fin structures 204c and 204e, and uniformly etching the entire active fin structures 204c and 204e until a nominal depth has reached. Removing the hard mask layer 208 can include performing a wet chemical process with $H_3PO_4$ that etches silicon nitride. After hard mask layer 208 is patterned, exposed portions of active fin structures 204a-204f are recessed but the top surface of the remaining active fin structures can be above the top surface of substrate 202. In some embodiments, the top surface of the remaining active fin structures is substantially coplanar or lower than the top surface of substrate 202. The etch processes of active fin structures 204a-204f can be similar to the process as described with reference to FIGS. 3A-3C. The etch process can be a plasma processes such as, for example, an RIE process using fluorine-based plasma. The etch process can be a timed etch process where a longer processing time can result in a greater depth of the openings, and the etch process can continue until a nominal depth is achieved.

Dielectric fin material is deposited into the openings to form self-aligned isolation fins 1604a-1604f using a method similar to the deposition method as described above with references to FIGS. 3A-3C. As shown in FIGS. 10A and 10C, self-aligned isolation fins 1604a, 1604b, 1604d, and 1604f are formed between isolation structures 206 and are also abutted by remaining portions of active fin structures. Self-aligned isolation fins 1604c and 1604e are formed between isolation structures 206 and only their bottom surfaces are in contact with the remaining portions of active fin structures. As the openings are defined and formed prior to the deposition of dielectric fin material, no alignment process is needed when the dielectric fin material fills the exposed openings. In some embodiments, openings can be filled by an ALD process. In some embodiments, the dielectric fin material includes SiCN, SiOCN, or metal oxides such as, for example, $HfO_2$, $ZrO_2$, $Al_2O_3$, other suitable metal oxides, and/or combinations thereof. In some embodiments, forming the self-aligned isolation fins further includes performing a planarization step (e.g., a CMP step) to remove the excess dielectric materials on isolation structures 206 and hard mask layer 208, so that the upper surfaces of the self-aligned isolation fins and the upper surface of isolation structure 206 and hard mask layer 208 are substantially coplanar. In some embodiments, self-aligned isolation fins 1604a, 1604b, 1604d, and 1604f can have a length L between the remaining portions of active fin structures that is in a range of between about 10 nm to about 100 um, as shown in FIG. 10C.

Figure 11A:
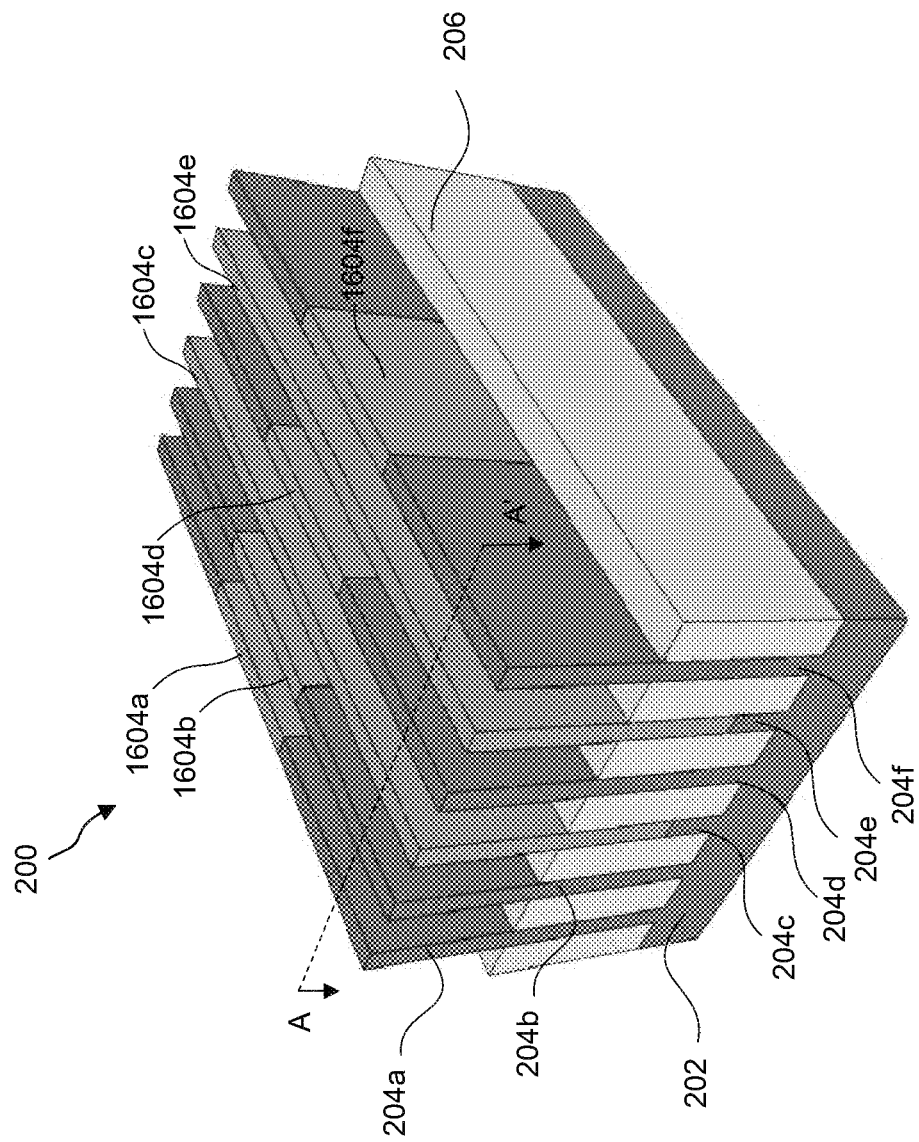

FIGS. 11A-11C are views of an exemplary partially-fabricated semiconductor structure 200 after etching back the isolation structures leaving fins protruding from the top surface of the remaining isolation structures, in accordance with some embodiments. FIG. 11A is a 3D view of the exemplary structure. FIG. 11B is a cross-sectional view of the structure along the A-A' line of the exemplary structure as illustrated by FIG. 11A. FIG. 11C is a top-down view of the exemplary structure.

Isolation structures 206 can be pulled back by an etching process. In some embodiments, hard mask layer 208 can be removed using processes similar to the process described above with reference to FIGS. 10A-10C. For example, wet chemical processes can be used. In some embodiments, planarization processes can be used and could continue until hard mask 208 is removed and that the upper surfaces of self-aligned isolation fins 1604a-1604f, active fin structures 204a-204f, and isolation structures 206 are substantially coplanar. After hard mask layer 208 is removed, isolation structures 206 can be etched back to expose a portion of both active fin structures 204a, 204b, 204d, 204f and self-aligned isolation fins 1604a-1604f. In some embodiments, isolation structures 206 are etched-back so that the top surfaces of the remaining isolation structures are above the bottom surface of the self-aligned isolation fins 1604a-1604f. The etch processes to etch back isolation structures 206 can be plasma processes such as, for example, an RIE process using oxygen-based plasma. In some embodiments, the RIE etching process may include other etchant gas such as, for example, nitrogen, $CF_4$, and/or other suitable gases. Numerous other etch back methods can also be suitable. In some embodiments, the height $H_4$ of the active fin structures 204a-204d measured from the top surface of the remaining isolation structures 206 to the top surface of active fin structures 204a-204d is between about 50 nm and about 90 nm (e.g., between about 65 nm and about 70 nm). After isolation structures 206 are etched back, portions of active fin structures 204a-204d can be protruding from the remaining portions of isolation structures 206.

As shown in FIG. 11B, the height $H_4$ of the active fin structures 204a-204f or self-aligned isolation fins 1604c and 1604b is measured from the top surface of the remaining isolation structure 206 to the top surfaces of active fin structures 204a-204f or self-aligned isolation fins 1604c and 1604b. Self-aligned isolation fins 1604a, 1604b, 1604d, and 1604f are not shown in FIG. 11B but can have similar heights. In some embodiments, height $H_4$ can be between about 40 nm and about 70 nm (e.g., between 50 nm and 60 nm).

Figure 12A:
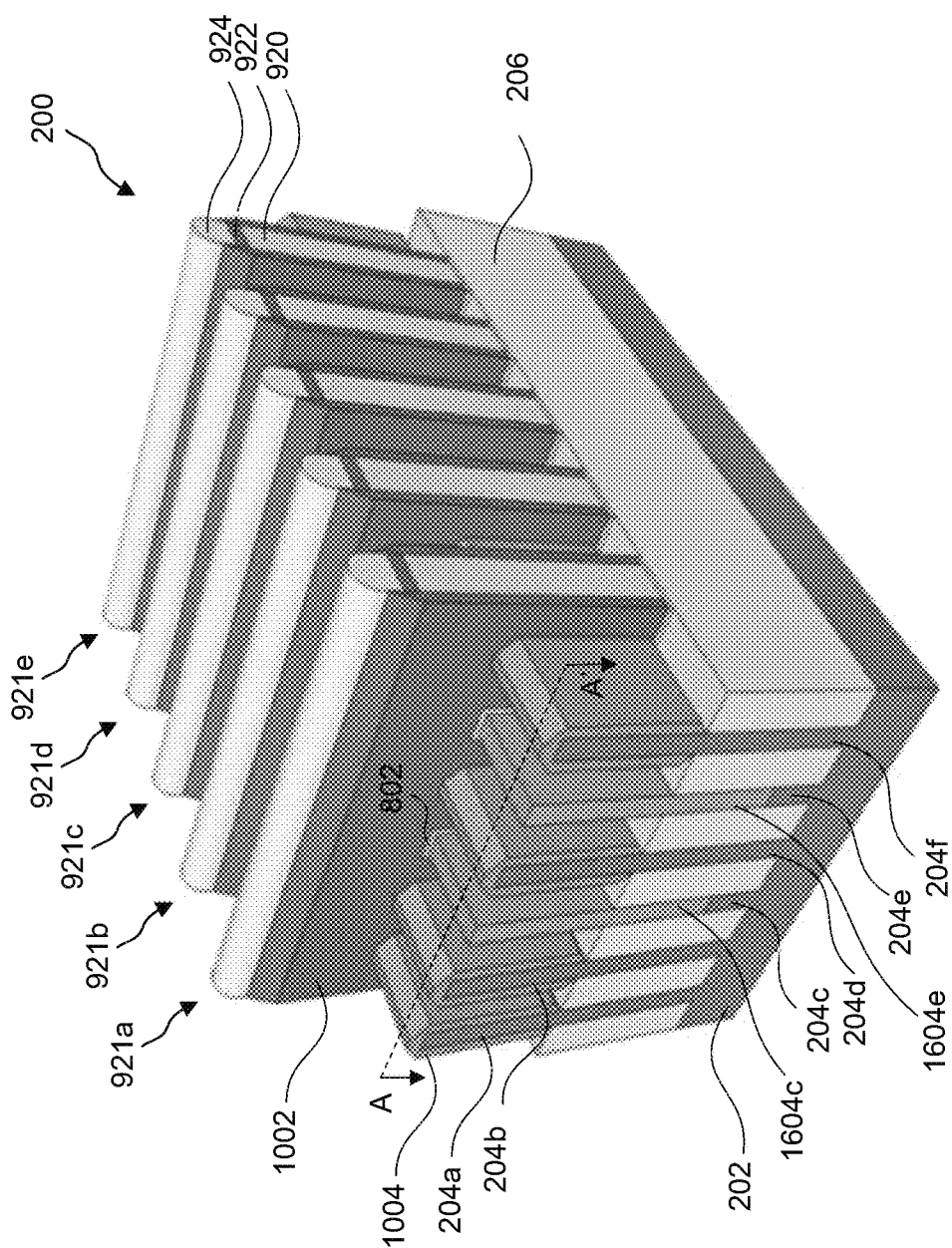
FIGS. 12A-12C are respective isometric, cross-sectional, and top-down views of a partially-fabricated fin-based structure after forming gate dielectric layers, sacrificial structures, and epitaxial source/drain structures, in accordance with some embodiments.
Figure 12C:
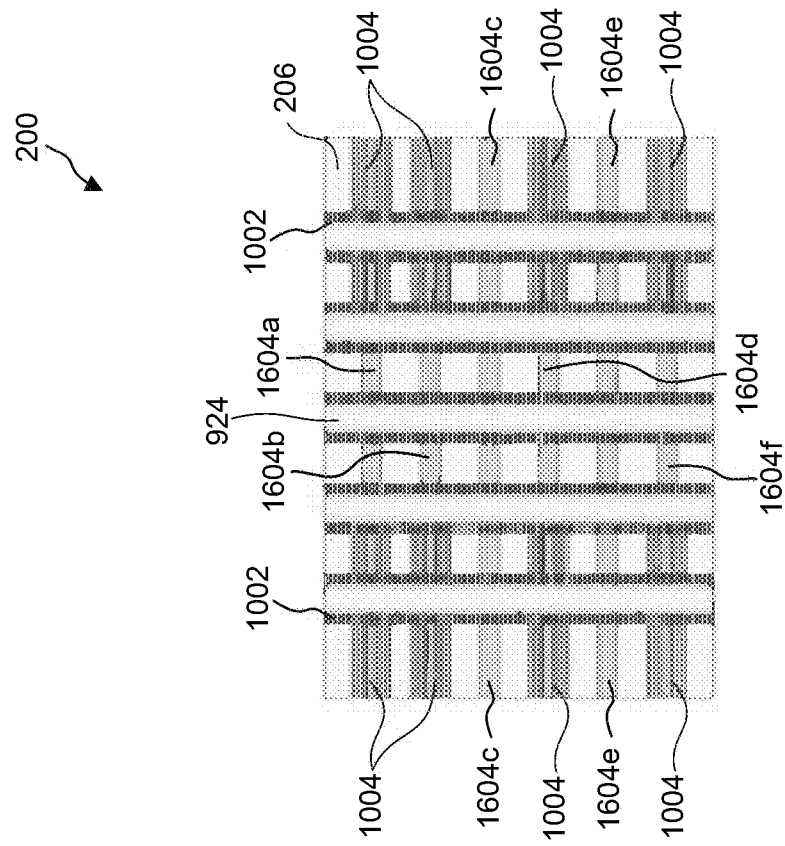
Figure 12B:
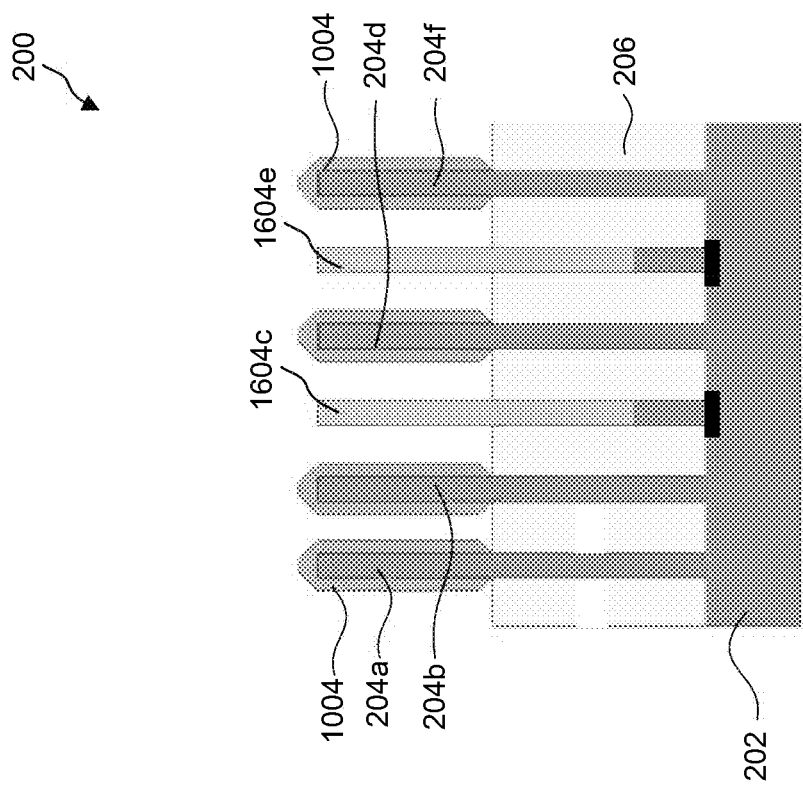

FIGS. 12A-12C are views of an exemplary partially-fabricated semiconductor structure 200 after forming a gate dielectric layer, sacrificial structures, and epitaxial source/drain structures, in accordance with some embodiments. FIG. 12A is a 3D view of the exemplary structure. FIG. 12B is a cross-sectional view of the structure along the A-A' line as illustrated by FIG. 12A. FIG. 12C is a top-down view of the structure.

Gate dielectric layer 802 is formed over exposed surfaces of active fin structures active fin structures 204a-204f, self-aligned isolation fins 1604a-1604f, and top surfaces of isolation structure 206. In some embodiments, gate dielectric layer 802 can be similar to the gate dielectric layer as described with reference to FIG. 4A-4B. For example, gate dielectric layer 802 can be a silicon oxide layer or a high-k material. In some embodiments, gate dielectric layer 802 may include a plurality of layers. In some embodiments, the gate dielectric layer 802 is deposited using an ALD process or a CVD process. The thickness t of gate dielectric layer 802 can be between about 2 nm and about 4 nm (e.g., between 2 nm and 4 nm). Gate dielectric layer 802 can be used as gate dielectric for high voltage devices.

Sacrificial structures 921a-921e can be formed in parallel and extend along a direction that is different from the direction of active fin structures 204a-204f. Sacrificial structures 921a-921e can be formed using processes similar to the process described above with reference to FIGS. 5A-5C.

Sacrificial structures 921a-921e can be uniformly spaced to provide a uniform pattern density. In some embodiments, sacrificial structures 921a-921e include poly structures 920, nitride hard masks 922, and oxide hard masks 924.

Similar to the structures described with reference to FIGS. 5A-5B, sacrificial structures shown in FIG. 12A can also be anchored or partially anchored over self-aligned isolation fins. For example, sacrificial structure 921c is anchored on self-aligned isolation fins 1604a-1604f and is not formed over active fin structures 204a-204f. In another example, sacrificial structures 921b and 921d can be formed over the interface between both active fin structures and self-aligned isolation fins and therefore are anchored on both structures. Similar to the self-aligned isolation fins described above with reference to FIG. 5A, self-aligned isolation fins can provide at least a number of benefits. First, self-aligned isolation fins 1604a, 1604b, 1604d, and 1604f connect respective portions of active fin structures 204a, 204b, 204d, and 204f, thus can prevent formation of air gaps or voids. Second, self-aligned isolation fins can prevent some sacrificial structures from collapsing by providing mechanical support. Without self-aligned isolation fins 1604a-1604f, conventional sacrificial structures in the place of sacrificial structure 921c may have to be formed directly over isolation structure 206. However, sacrificial structure 921c is anchored over self-aligned isolation fins 1604a-1604f and their support increases the mechanical strength of sacrificial structure 921c. Similarly, sacrificial structures 921a, 921b, 921d, and 921e are both anchored or partially anchored over and supported by the self-aligned isolation fins.

Epitaxial source/drains can be formed using processes similar to the processes described above with reference to FIGS. 5A-5C. For example, a spacer 1002 can be formed on both side surfaces of sacrificial structures 921a-921e. Spacer 1002 can be formed by a blanket deposition of a spacer layer over the semiconductor structure 200 followed by pulling back the spacer layer with an etch process. Gate dielectric layer material not protected by the formed spacer 1002 can be removed to form gate dielectric layer 802 and expose the underlying active fin structures and self-aligned isolation fins. A doping process can be performed on active fin structures after gate dielectric layer 802 is removed. The active fin structures can have the same or different types of dopants from one another. Epitaxial source/drains 1004 can then be formed by an epitaxial growth process on exposed active fin structures 204a, 204b, 204d, and 204f. A pre-clean process can be performed prior to the epitaxial growth process. The growth process continues until a nominal size and/or structure of epitaxial source/drains 1004 has been reached. Epitaxial source/drains 1004 can be doped with p-type or n-type dopants during the epitaxy process. The epitaxial source/drains 1004 can also take different shapes depending on different factors. For example, the shape of the epitaxial source/drains 1004 can be a diamond like shape.

Figure 13A:
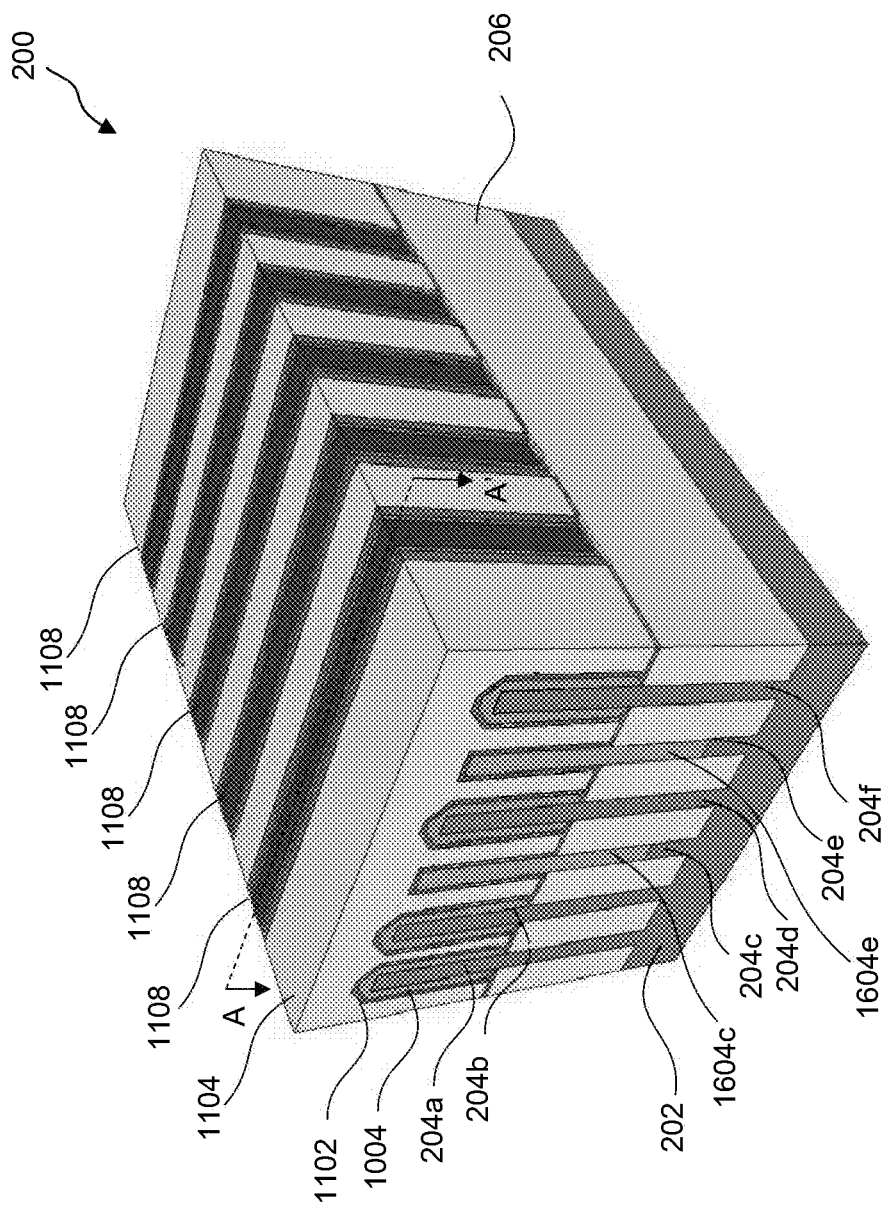

FIGS. 13A-13C are views of an exemplary partially-fabricated semiconductor structure 200 after forming interlayer dielectric layers and performing a gate replacement process, in accordance with some embodiments. FIG. 13A is a 3D view of the exemplary structure. FIG. 13B is a cross-sectional view of the structure through the gate structures and along the A-A' line as illustrated by FIG. 13A. FIG. 13C is a top-down view of the structure. Forming interlayer dielectric layer and performing the gate replacement process can be similar to the processes described above with reference to FIGS. 6A-6C.

Figure 14A:
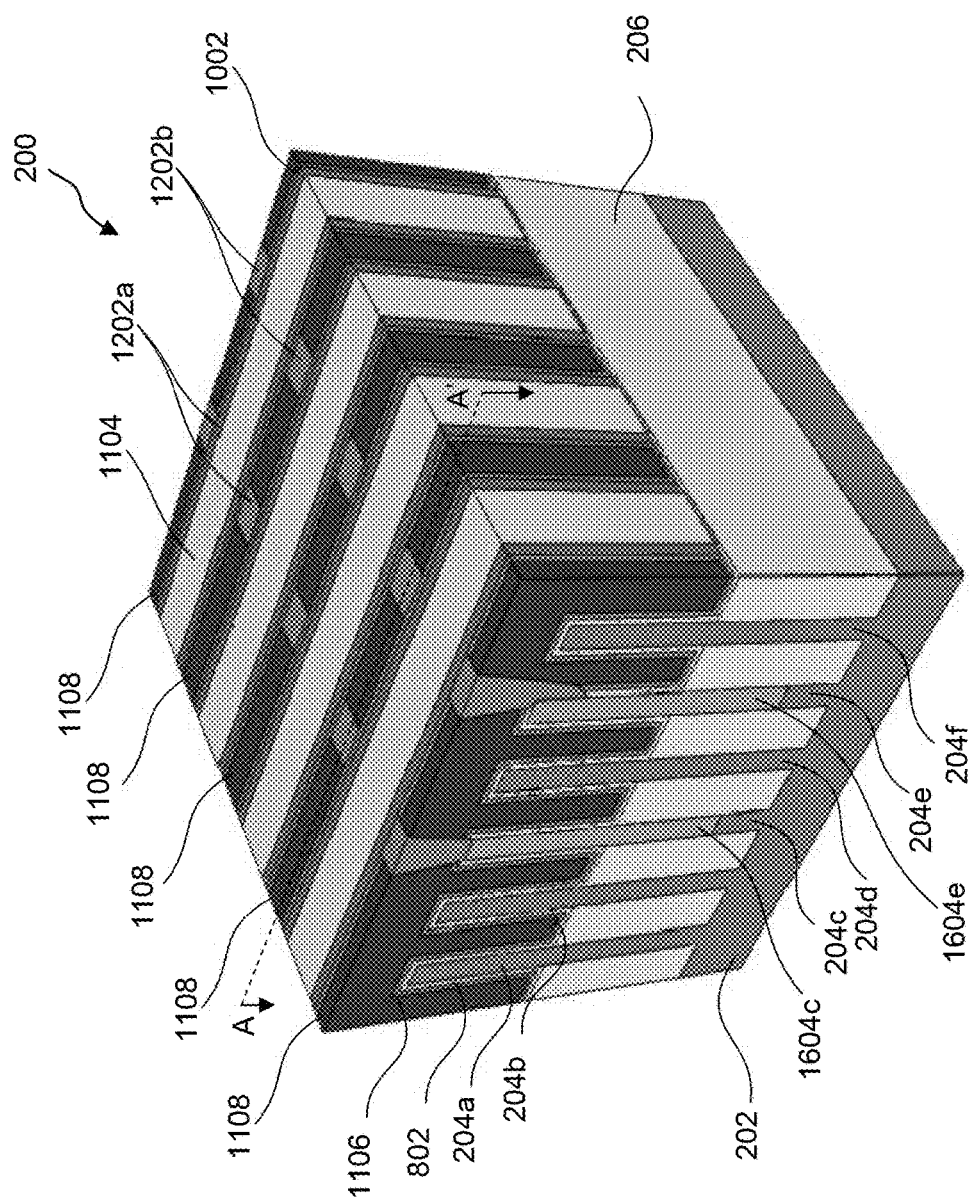

FIGS. 14A-14C are views of an exemplary partially-fabricated semiconductor structure 200 after forming gate isolation structures, in accordance with some embodiments. FIG. 14A is a 3D view of a portion of the exemplary structure. FIG. 14B is a cross-sectional view of the structure through the gate structures and along the A-A' line as illustrated by FIG. 14A. FIG. 14C is a top-down view of the structure. Gate isolation structures 1202a-1202b can be formed using processes that are similar to the processes described above with reference to FIGS. 7A-7C. The gate isolation structures can be used to provide separate gate electrode control for one or more FinFETs. In some embodiments, gate isolation structure can be formed directly above and aligned with self-aligned isolation fin, or with a horizontal offset and only a portion of the gate isolation structure is formed directly over self-aligned isolation fin.

Figure 15A:
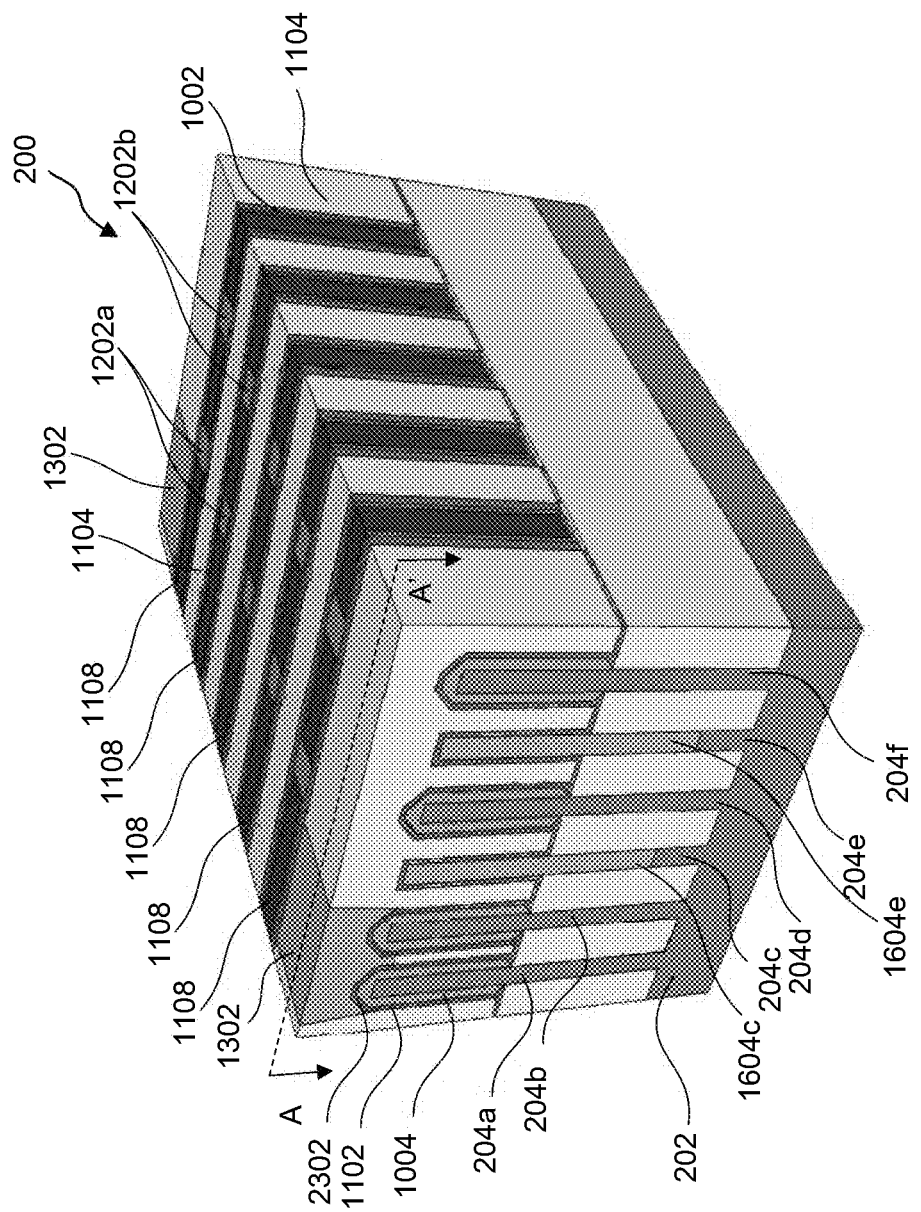
FIGS. 15A-15C are respective isometric, cross-sectional, and top-down views of a partially-fabricated fin-based structure after forming source/drain contacts, in accordance with some embodiments.
Figures 15B, 15C:
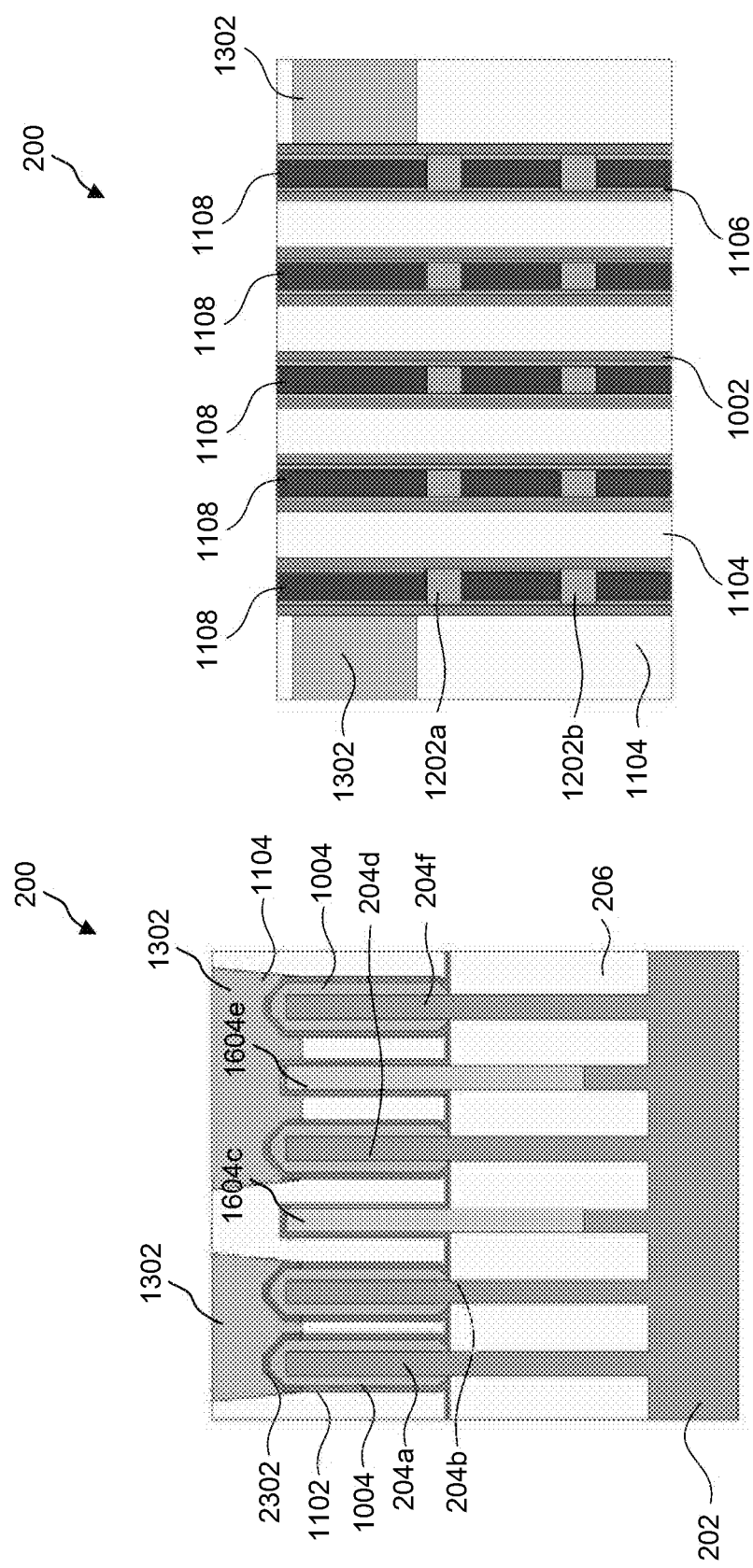

FIGS. 15A-15C are views of an exemplary partially-fabricated semiconductor structure 200 after forming source/drain contacts, in accordance with some embodiments. FIG. 15A is a 3D view of the exemplary structure. FIG. 15B is a cross-sectional view of the structure along the A-A' line as illustrated by FIG. 15A. FIG. 15C is a top-down view of the structure. FIG. 15D is a cross-sectional view of the exemplary structure with source/drain contacts formed over self-aligned isolation fins.

Source/drain contacts 1302 can be formed in interlayer dielectric layer 1104 and over the epitaxial source/drains 1004 using processes similar to the processes described above with reference to FIGS. 8A-8C. Similar to the process described with reference to FIG. 8D, source/drain contacts 1302 can also be formed over active fin structures 204d and 204f, and also over self-aligned isolation fins 1604e, as shown in FIG. 15D.

Figure 16:
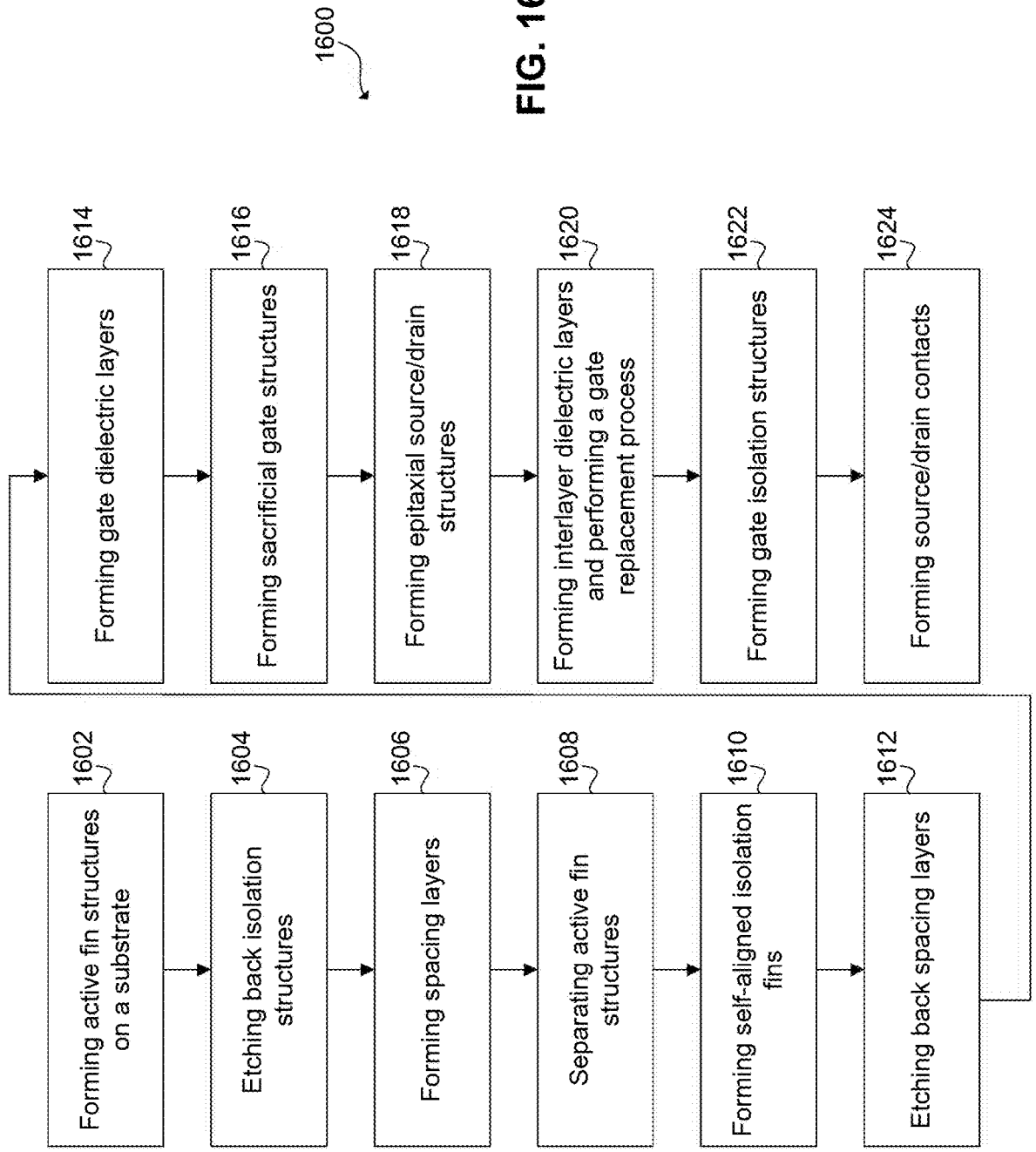
FIG. 16 is a flow diagram of an exemplary method of forming self-aligned isolation fins by depositing dielectric material in recesses formed in spacing layers, in accordance with some embodiments.

FIG. 16 is a flow diagram of an example method 1600 of forming self-aligned isolation fins by depositing dielectric material in recesses formed in a spacing layer, in accordance with some embodiments of the present disclosure. Other operations in method 1600 can be performed and operations of method 1600 can be performed in a different order and/or vary.

At operation 1602, structures and layers are formed on and/or within a semiconductor structure, in accordance with some embodiments. The semiconductor structure can include a substrate, one or more etch stop layers, and one or more dielectric layers. The semiconductor structure can also include other layers as needed. The substrate can be a silicon substrate, according to some embodiments. An example of the substrate can be substrate 202 as described with respect to FIG. 2A. Active fin structures can protrude from the substrate 202, and are mutually parallel and extend in one direction. Active fin structures can be doped with n-type dopants such as, for example, P and As, or p-type dopants such as, for example, B and Ga. Some fin structures can be doped with n-type dopants and are used in n-type FinFETs while some fin structures are doped with p-type dopants and are used in in p-type FinFETs. Active fin structures can be made of silicon or other suitable materials. Active fin structures can be formed by patterning a hard mask layer and etching into the substrate using an anisotropic etch. Areas covered by the hard mask layer are blocked by the hard mask layer during the anisotropic etch process, and the areas not covered by the hard mask layer are recessed, resulting in active fin structures. Examples of active fin structures can be active fin structures 204a-204d described above with reference to FIG. 2A. Active fin structures can have a width between about 5 nm and about 20 nm and a height $H_1$ between about 100 nm and about 140 nm. The distance between adjacent active fin structures can be between about 10 nm and about 25 nm, or the distance between active fin structures can be larger than 20 nm. Isolation structures can be used to fill openings between active fin structures and can be made of a dielectric material. Isolation structures can be STI structures.

At operation 1604, isolation structures are etched back, in accordance with some embodiments. Isolation structures can be etched back by removing the hard mask layer and etching a portion of the isolation structures. Removing the hard mask layer can include a wet chemical process or a CMP process. After the hard mask layer is removed, isolation structures can be etched back to expose a portion of active fin structures. Isolation structures can be etched back so that the top surface of the remaining isolation structures is below the top surface of the active fin structures. The height of the active fin structures measured from the top surface of the remaining isolation structures to the top surface of active fin structures can be between about 50 nm and about 90 nm. After the isolation structures are etched back, portions of the active fin structures can be protruding from the remaining portions of isolation structures. Examples of etching back in isolation structures can be the mechanisms described above with reference to FIGS. 2A-2C.

At operation 1606, spacing layers are formed on active fin structures and isolation structures, in accordance with some embodiments. A spacing layer can be deposited on the exposed sidewalls and top planar surfaces of active fin structures and exposed top surfaces of isolation structures. The spacing layer can be made of a dielectric material and deposited by an ALD process or CVD process and the thickness of the spacing layer can be in a range of about 5 nm to about 30 nm. The spacing layer can be deposited on the top planar surfaces of active fin structures and can also be deposited in exposed surfaces between active fin structures. The nominal thickness of the spacing layer can be achieved by controlling deposition parameters of the deposition process. For example, the deposition process can be a timed deposition process where a longer processing time can result in a greater thickness, and the deposition process can continue until a nominal thickness is achieved. The spacing layer can be deposited to substantially fill the opening between some active fin structures. The thickness of the spacing layer can be at least half of distance separating active fin structures in order to substantially fill the opening. The thickness of the spacing layer can be between about 5 nm and about 30 nm. The spacing layer can be deposited between some active fin structures to form openings. By choosing suitable processing deposition parameters, the openings can be configured to create spaces for the subsequent deposition of self-aligned isolation fins. The height of the openings can be in a range between about 50 nm and about 90 nm. In some embodiments, the width of the openings can be in a range between about 5 nm and about 20 nm. Examples of forming spacing layers can be the mechanisms described above with reference to FIGS. 2A-2C

At operation 1608, active fin structures are separated into two groups of active fin structures, in accordance with some embodiments. Portions of the spacing layer, the active fin structures, and the isolation structures can be removed to form a trench. Remaining portions of active fin structures can be separated into two groups of active fin structures. The trench can be formed in the semiconductor structure using a patterning and etching process. The etching selectivity can be substantially similar between the spacing layer and the active fin structures by controlling etching parameters of the etch process. The etch process can be an anisotropic etch process. The spacing layer and the active fin structures can be removed using different processes. The etch process can be a timed etch process where a longer processing time can result in a greater depth of the trench, and the etch process can continue until a nominal depth is achieved. Portions of the active fin structures and the isolation structure can remain at the bottom of the trench. After the etch process, the masking layer can be subsequently removed by any suitable process. Examples of the two groups of active fin structures can be respective first and second groups of active fin structures including active fin structures 504a-504d and 504a'-504d'.

At operation 1610, self-aligned isolation fins are formed, in accordance with some embodiments. Self-aligned isolation fins can be formed in the openings and the trenches of the semiconductor structure. Forming the self-aligned isolation fins can include filling the openings and the trenches with a dielectric fin material. Filling the openings can be performed by an ALD process. Filling the trenches can be performed by a CVD or a FCVD process. The dielectric fin material can include SiCN, SiOCN, or metal oxides such as, for example, $HfO_2$, $ZrO_2$, $Al_2O_3$, other suitable metal oxides, and/or combinations thereof. Forming the self-aligned isolation fins can also include performing a planarization step (e.g., a CMP step) to remove the excess dielectric materials on the upper surfaces of the spacing layer, so that the upper surfaces of the self-aligned isolation fins and the upper surface of the spacing layer are substantially coplanar. Self-aligned isolation fins are formed between the active fin structures. As the openings and the trenches are defined and formed prior to the deposition of dielectric fin material, no alignment process is needed when the dielectric fin material fills in the exposed opening and trenches. Examples of self-aligned isolation fins are self-aligned isolation fins 604a-604b and 604t.

At operation 1612, the spacing layer is etched back to expose portions of the active fin structures and self-aligned isolation fins, in accordance with some embodiments. The spacing layer can be etched back to form recesses such that portions of active fin structures and self-aligned isolation fins can be protruding from the remaining portions of the spacing layer. The self-aligned isolation fins can be slightly etched during the etching of the spacing layer, such that their top surfaces are substantially coplanar with the active fin structures. The coplanar structure can be achieved by any suitable methods such as, for example, an etch process that has suitable etch selectivity between materials of the spacing layer, active fin structure, and self-aligned isolation fin. The etch processes of the spacing layer can be plasma processes such as, for example, an RIE process using fluorine-based plasma. Etching the spacing layer can include performing a wet chemical process that etches silicon oxide.

At operation 1614, a gate dielectric layer is formed over the semiconductor structures, in accordance with some embodiments. A gate dielectric layer can be formed over exposed surfaces of active fin structures, self-aligned isolation fins, and top surfaces of the spacing layer. The gate dielectric layer can be a silicon oxide layer and can include a high-k material. The gate dielectric layer can also include a plurality of layers deposited using an ALD process or a CVD process. The thickness of the gate dielectric layer can be between about 2 nm and about 4 nm. The gate dielectric layer can be used as gate dielectric for high voltage devices. An example of the gate dielectric layer can be gate dielectric layer 802 as described above with reference to FIG. 4A.

At operation 1616, sacrificial structures are formed over the self-aligned isolation fins and active fin structures, in accordance with some embodiments. Sacrificial structures can be formed in parallel and extend along a direction that is different from the direction of the active fin structures. The sacrificial structures can be uniformly spaced to provide a uniform pattern density. Sacrificial structures can include poly structures, oxide hard masks, and nitride hard masks. The etching of the stack of gate materials can stop on the surface of the gate oxide layer. The sacrificial structures can be formed over self-aligned isolation fins and/or active fin structures. For example, the sacrificial structures are formed over the top surface and the opposite side surfaces of the active fin structures. Examples of the sacrificial structures can be sacrificial structures 921a-921e as described above with reference to FIGS. 5A-5C.

At operation 1618, epitaxial source/drain structures are formed over the active fin structures, in accordance with some embodiments. Epitaxial source/drain structures can be directly formed on active fin structures or can be formed using an etch back and grow method. A spacer layer can be first formed on the sacrificial structures, the active fin structures, and self-aligned isolation fins. Forming the spacer can include depositing a spacer layer uniformly over the semiconductor structure followed by pulling back the spacer layer with an anisotropic etch process. The gate dielectric layer not protected by the formed spacer can be removed to expose the underlying active fin structures and self-aligned isolation fins. After the gate dielectric layer has been removed, the active fin structures can be doped with p-type dopants for use in p-type FinFET devices, or doped with n-type dopants and be used in n-type FinFET devices. The doping process can be any suitable doping process such as, for example, an ion implantation process. In some embodiments, epitaxial source/drains can be formed by growing epitaxial layers over exposed surfaces of active fin structures. The epitaxy process can be a selective process that only grows the epitaxy layer on the surfaces of the active fin structures that are exposed. The growth process continues until a nominal size and/or structure of epitaxial source/drains has been reached. The epitaxial source/drains can also take different shapes depending on different factors. For example, the shape of the epitaxial source/drains can be a diamond-like shape. A diamond-like shaped epitaxial source/drains can be formed by an etch back and growth process. An in-situ doping process can also be performed during the epitaxy process. An example of epitaxial source/drains is epitaxial source/drains 1004 as described above with reference to FIGS. 5A-5C.

At operation 1620, interlayer dielectric layers are formed over the semiconductor structure and a gate replacement process is performed, in accordance with some embodiments. Prior to the deposition of interlayer dielectric layer, a contact etch stop layer can be deposited over the epitaxial source/drains and/or self-aligned isolation fins. An interlayer dielectric layer can be formed over the contact etch stop layer and between the active fin structures and the self-aligned isolation fins. In some embodiments, the interlayer dielectric layer can also be deposited over the top surfaces of sacrificial structures. After depositing the interlayer dielectric layer, a planarization process is performed to remove portions of the interlayer dielectric layer that is formed over the top surfaces of sacrificial structures. The planarization process can be performed such that the top surfaces of interlayer dielectric layer, the spacer, and the poly structure are coplanar. The oxide hard mask and nitride mask are also removed during the planarization process or during an additional etch process, so that the top surfaces of the poly structures is exposed. An example of the interlayer dielectric layer is the interlayer dielectric layer 1104 as described above with reference to FIG. 6A.

The sacrificial structures can be replaced by metal gate structures. More specifically, the poly structures can be replaced by metal gate electrodes. A second gate dielectric layer can be formed over the gate dielectric layer prior to the formation of metal gate electrodes. The metal gate electrodes can also include a diffusion barrier and a work-function layer. A planarization process can be performed to remove the metal gate structures formed over the top surface of interlayer dielectric layer. An example of metal gate structure is the metal gate electrode 1108 as described above with reference to FIG. 6A.

At operation 1622, gate isolation structures are formed in the metal gate structures, in accordance with some embodiments. Gate isolation structures can be formed in the metal gate electrodes and over self-aligned isolation fins to provide separate gate electrode control for one or more FinFETs. The gate isolation structures can be formed over self-aligned isolation fins, and together they form a barrier layer to separate gate electrode into different portions to allow separate control. The gate isolation structure can be formed directly above and aligned to self-aligned isolation fin, or formed with a horizontal offset with reference to self-aligned isolation fins and only a portion of gate isolation structure is formed directly over self-aligned isolation fin. Allowing a horizontal offset provides the benefit of an increased margin for the alignment and overlay requirements of the photolithography process. In addition, the overall thickness of metal gate structures is reduced which can lead to greater AC gain due to reduced parasitic capacitance. After forming the gate isolation structures, a planarization process can be performed such that the top surfaces of the interlayer dielectric layer, the second gate dielectric layer, the spacers, and the metal gate electrodes are substantially coplanar. An example of gate isolation structures are gate isolation structures 1202a-1202b as described above with reference to FIG. 7A.

At operation 1624, source/drain contacts are formed in the interlayer dielectric layer and over the epitaxial source/drains, in accordance with some embodiments. Source/drain contacts can be formed in the interlayer dielectric layer and over the epitaxial source/drains. Patterning and etching processes can be used to form openings in the interlayer dielectric layer for source/drain contacts deposition. The source/drain contacts can further include a barrier layer to avoid diffusion of materials. A planarization process can be used such that the top surface of the source/drain contacts, the interlayer dielectric layer, and the metal gate electrodes are coplanar. The source/drain contacts can be formed between epitaxial source/drains that are separated by self-aligned isolation fins. The self-aligned isolation fin can prevent the source/drain contact from cutting deeper into the interlayer dielectric layer resulting in a reduced thickness of the source/drain contact that leads to a reduced parasitic capacitance. An example of source/drain contacts are source/drain contacts 1302 as described with reference to FIG. 8A.

FIG. 17 is a flow diagram of an example method 1700 of forming self-aligned isolation fins by replacing portions of fins with dielectric material, in accordance with some embodiments of the present disclosure. Other operations in method 1700 can be performed and operations of method 1700 can be performed in a different order and/or vary.

At operation 1702, structures and layers are formed on and/or within a semiconductor structure, in accordance with some embodiments. Operation 1702 can be performed using the same processes as described above with reference to operation 1602. For example, active fin structures can protrude from the substrate, and are mutually parallel and extend in one direction. However, the separation between adjacent active fin structures can be equal to one another. For example, the separation between active fin structures can be between about 10 nm and about 25 nm (e.g., between 12 nm and 20 nm). The distance between active fin structures can be larger if needed. Isolation structures can be used to fill openings between active fin structures and can be made of a dielectric material. Isolation structures can be STI structures.

At operation 1704, recesses can be formed in selected active fin structures of a semiconductor structures, in accordance with some embodiments. Recesses can be formed at selected locations of active fin structures by removing the hard mask layer and etching back a portion of selected active fin structures. After the hard mask layer is removed, portions of active fin structures can be recessed to form openings above recessed active fin structures and between the isolation structures. Portions of active fin structures are recessed so that the top surface of the remaining active fin structures is above the top surface of the substrate. Some active fin structures are not protected by the hard mask layer and are removed throughout the length of the semiconductor structure. In some embodiments, a portion of an active fin structure is removed. For example, openings can be formed by only removing a portion of the hard mask layer over the active fin structures. The remaining hard mask layer can be used as a masking element for the etching process that removes the exposed active fin structure material.

At operation 1706, self-aligned isolation fins are formed in the openings of semiconductor structures, in accordance with some embodiments. Self-aligned isolation fins be formed using processes similar to the processes described above in operation 1610. For example, self-aligned isolation fins can be formed by depositing dielectric fin material in the openings formed in operation 1704 as described above. A planarization step can be performed to remove excess dielectric materials, so that the upper surfaces of the self-aligned isolation fins and the upper surface of the hard mask layer, and isolation structures are substantially coplanar. Self-aligned isolation fins can be formed between the isolation structures and/or active fin structures. As the openings and the trenches are defined and formed prior to the deposition of dielectric fin material, no alignment process is needed when the dielectric fin material fills in the exposed opening and trenches. Examples of self-aligned isolation fins can be self-aligned isolation fins 1604a-1604f.

At operation 1708, isolation structures are etched back to leave fins protruding from the top surface of the remaining isolation structures, in accordance with some embodiments. Operation 1708 can be processed using similar processes described above with reference to operation 1604. The isolation structures can be etched back by removing the hard mask layer and etching a portion of the isolation structures. Wet chemical processes or planarization processes can be used to remove the hard mask layer. The planarization process could continue until the hard mask is removed and that the upper surfaces of self-aligned isolation fins, the active fin structures, and the isolation structures are substantially coplanar. After the hard mask layer is removed, the isolation structures can be etched back to expose portions of both the active fin structures and the self-aligned isolation fins. After the isolation structures are etched back, portions of the active fin structures can be protruding from the remaining portions of isolation structures.

At operation 1710, a gate dielectric layer is formed over the semiconductor structures, in accordance with some embodiments. A gate dielectric layer can be formed using processes similar the processes described above with reference to operation 1614. The gate dielectric layer can be deposited over exposed surfaces of active fin structures, self-aligned isolation fins, and top surfaces of the isolation structure. The gate dielectric layer can be a silicon oxide layer and can include a high-k material. The gate dielectric layer can also include a plurality of layers deposited using an ALD process or a CVD process. The thickness of the gate dielectric layer can be between about 2 nm and about 4 nm. The gate dielectric layer can be used as gate dielectric for high voltage devices. An example of the gate dielectric layer can be gate dielectric layer 802 as described above with reference to FIG. 12A.

At operation 1712, sacrificial structures are formed over the self-aligned isolation fins and active fin structures, in accordance with some embodiments. Sacrificial structures can be formed using processes similar the processes described above with reference to operation 1616. Sacrificial structures can be formed in parallel and extend along a direction that is different from the direction of the active fin structures. The sacrificial structures can be uniformly spaced to provide a uniform pattern density. Sacrificial structures can include poly structures, oxide hard masks, and nitride hard masks. Examples of the sacrificial structures can be sacrificial structures 921a-921e as described above with reference to FIGS. 12A-12C.

At operation 1714, epitaxial source/drain structures are formed over the active fin structures, in accordance with some embodiments. Epitaxial source/drains can be formed using processes similar the processes described above with reference to operation 1618. Epitaxial source/drain structures can be directly formed on active fin structures or can be formed using an etch back and grow method. A spacer layer can be first formed on the sacrificial structures, the active fin structures, and self-aligned isolation fins. The gate dielectric layer not protected by the formed spacer can be removed to expose the underlying active fin structures and self-aligned isolation fins. After the gate dielectric layer has been removed, the active fin structures can be doped with different type of dopants. Epitaxial source/drains can be formed by growing epitaxial layers over exposed surfaces of active fin structures. The epitaxial source/drains can be doped with p-type or n-type dopants during the epitaxy process. The epitaxial source/drains can also take different shapes such as a diamond-like shape. An in-situ doping process can also be performed during the epitaxy process. An example of epitaxial source/drains is epitaxial source/drains 1004 as described above with reference to FIGS. 12A-12C.

At operation 1716, interlayer dielectric layers are formed over the semiconductor structure and a gate replacement process is performed, in accordance with some embodiments. Interlayer dielectric layer formation and gate replacement process can be formed using processes similar the processes described above with reference to operation 1620. An example of the interlayer dielectric layer is the interlayer dielectric layer 1104 as described above with reference to FIG. 13A. An example of metal gate structure is the metal gate electrode 1108 as described above with reference to FIG. 13A.

At operation 1718, gate isolation structures are formed in the metal gate structures, in accordance with some embodiments. Gate isolation structures can be formed using processes similar the processes described above with reference to operation 1622. Gate isolation structures can be formed in the metal gate electrodes and over self-aligned isolation fins to provide separate gate electrode control for one or more FinFETs. The gate isolation structure can be formed directly above and aligned to self-aligned isolation fin, or formed with a horizontal offset with reference to self-aligned isolation fins, and only a portion of gate isolation structure is formed directly over self-aligned isolation fin. After forming the gate isolation structures, a planarization process can be performed such that the top surfaces of the interlayer dielectric layer, the second gate dielectric layer, the spacers, and the metal gate electrodes are substantially coplanar. An example of gate isolation structures are gate isolation structures 1202a-1202b as described above with reference to FIG. 14A.

At operation 1720, source/drain contacts are formed in the interlayer dielectric layer and over the epitaxial source/drains, in accordance with some embodiments. Source/drain contacts can be formed using processes similar the processes described above with reference to operation 1624. Source/drain contacts can be formed in the interlayer dielectric layer and over the epitaxial source/drains. Patterning and etching processes can be used to form openings in the interlayer dielectric layer for source/drain contacts deposition. The source/drain contacts are then deposited into the openings and can further include a barrier layer to avoid diffusion of materials. A planarization process can be used such that the top surface of the source/drain contacts, the interlayer dielectric layer, and the metal gate electrodes are coplanar. A silicide layer can also be formed between the source/drain contacts and the epitaxial source/drains. The source/drain contacts can be formed between epitaxial source/drains that are separated by self-aligned isolation fins.

Various embodiments in accordance with this disclosure provide mechanisms of forming self-aligned isolation fins in FinFET structures. In some embodiments, the self-aligned isolation fins can be formed by depositing dielectric material in recesses formed in a spacing layer. In some embodiments, the self-aligned isolation fins can be formed by replacing portions of fins with dielectric material. In some embodiments, the self-aligned isolation fins can be separated from each other or separated with the active fin structures by a minimum design rule spacing such as, for example, a critical dimension of the utilized photolithography process. The separation between self-aligned isolation fins can be approximately equal to or larger than the separation between active fins of the FinFET structures.

In accordance with various embodiments of this disclosure, using the self-aligned isolation fins in semiconductor structures provides, among other things, benefits of (i) uniform etch for metal source/drain and void-free metal source/drain contacts with no seams; (ii) preventing gate structure collapsing by anchoring the gate structures on the self-aligned isolation fins; (iii) preventing STI layer undercut during epitaxial source/drain formation; (iv) preventing epi-bridging between adjacent epitaxial source/drain by using self-aligned isolation fins as barrier layers; (v) providing isolation between gate structures by using self-aligned isolation fins as barrier layers; and (vi) increased AC gain due to reduced parasitic capacitance from the thinned metal source/drain contacts.

In some embodiments, a semiconductor structure includes a substrate and first and second fins protruding from the substrate. The semiconductor structure further includes a spacing layer formed over the substrate and on opposing sidewalls of the first and second fins. An isolation fin structure is formed over the spacing layer and also between the opposing sidewalls of the first and second fins. The semiconductor structure also includes a dielectric isolation fin abutting the first and second fins and the isolation fin structure. The semiconductor structure further includes a gate structure that is formed over the isolation fin structure and also over the first and second fins.

In some embodiments, a semiconductor structure includes a substrate and first and second plurality of fins protruding from the substrate. The semiconductor structure further includes a dielectric isolation fin that is formed between the first and second plurality of fins. The dielectric isolation fin abuts the first and second plurality of fins. The semiconductor structure further includes a plurality of parallel gate structures that are formed in parallel, and a first gate structure of the plurality of parallel gate structures is formed over the dielectric isolation fin.

In some embodiments, a method of forming a semiconductor structure includes forming first and second fins that are protruding from a substrate. The method further includes forming a spacing layer over the substrate and also on opposing sidewalls of the first and second fins. The spacing layer forms an opening between the opposing sidewalls of the first and second fins. The method also includes forming an isolation fin structure in the opening. A dielectric isolation fin is formed abutting the first and second fins as well as the isolation fin structure. The spacing layer is etched back such that the isolation fin structure, the first and second fins, and the dielectric isolation fin are protruding from the spacing layer. A gate structure is formed over the isolation fin structure and the first and second fins. The method also includes forming a gate isolation structure in the gate structure and also over the isolation fin structure.

In some embodiments, a semiconductor structure includes a substrate and first, second, and third fins protruding from the substrate. The semiconductor structure also includes an isolation fin structure that is formed on the second fin and between the first and the third fins. The semiconductor structure further includes a gate structure that is formed over the isolation fin structure and the first and third fins.

In some embodiments, a semiconductor structure includes a substrate and a fin that has first and second portions. The first and second portions protrude from the substrate and their top surfaces are coplanar. The semiconductor structure also includes a dielectric isolation fin that is formed between the first and second portions of the fin. The dielectric isolation fin is in parallel with and abuts the first and second portions of the fin. The semiconductor structure further includes a plurality of parallel gate structures with at least one gate structure formed over the dielectric isolation fin.

In some embodiments, a method of forming a semiconductor includes forming a plurality of fins protruding from the substrate. The method also includes forming isolation structures over the substrate and also between each fin of the plurality of fins. A first fin of the plurality of fins is recessed to form an opening between the recessed first fin and adjacent isolation structures. The first fin is between the second and third fins of the plurality of fins. The method also includes forming an isolation structure in the opening. A gate structure is formed over the isolation fin structure and the second and third fins. A gate isolation structure is formed over the isolation structure and in the gate structure.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor structure, comprising:
    an isolation structure on a substrate;
    a first fin protruding from the substrate, wherein the first fin comprises first, second, and third portions, and top surfaces of the first and third portions are above a top surface of the isolation structure and a top surface of the second portion is below the top surface of the isolation structure;
    a second fin protruding from the substrate and adjacent to the first fin, wherein a top surface of the second fin is below the top surface of the isolation structure;
    a first dielectric fin on the top surface of the second portion of the first fin, wherein the first dielectric fin is between the first and second portions of the first fin; and
    a second dielectric fin on the top surface of the second fin, wherein the second dielectric fin extends above the top surface of the isolation structure.

2. The semiconductor structure of claim 1, wherein the top surfaces of the first and third portions of the first fin and top surfaces of the first and second dielectric fins are substantially coplanar.

3. The semiconductor structure of claim 1, wherein a width of the second dielectric fin is substantially uniform throughout an entire height of the second dielectric fin.

4. The semiconductor structure of claim 1, further comprising an epitaxial source/drain structure on the first fin and a metal contact on the epitaxial source/drain structure.

5. The semiconductor structure of claim 4, wherein the metal contact is connected to another epitaxial source/drain structure over the second dielectric fin.

6. The semiconductor structure of claim 1, wherein the first and second dielectric fins are parallel to and separate from each other.

7. The semiconductor structure of claim 1, wherein the first and second dielectric fins comprise silicon carbon nitride (SiCN), silicon oxygen carbon nitride (SiOCN), hafnium oxide (HfO$_2$), zirconium oxide (ZrO$_2$), or aluminum oxide (Al$_2$O$_3$).

8. The semiconductor structure of claim 1, wherein the first and second fins comprise a same material.

9. The semiconductor structure of claim 1, further comprising:
    a metal gate structure over the second dielectric fin and the first and second fins; and
    a gate isolation structure on the second dielectric fin, wherein the gate isolation structure and the second dielectric fin separates the metal gate structure into two portions.

10. The semiconductor structure of claim 9, wherein the gate isolation structure extends below a top surface of the second dielectric fin and above the top surface of the second fin.

11. A semiconductor device, comprising:
    first and second active fins protruding from a substrate, wherein the first and second active fins comprise a first material;
    a first non-active fin on the first active fin and abutting two portions of the first active fin, wherein the first non-active fin comprises a second material different from the first material;
    a second non-active fin between the first and second active fins, wherein the second non-active fin comprises the second material and has a top surface substantially coplanar with top surfaces of the first and second active fins; and
    a gate structure on the second non-active fin and the first and second active fins.

12. The semiconductor device of claim 11, further comprising a gate isolation structure on the second non-active fin, wherein the gate isolation structure and the second non-active fin separates the gate structure into first and second portions.

13. The semiconductor device of claim 12, wherein the first portion of the gate structure is over the first active fin and the second portion of the gate structure is over the second active fin.

14. The semiconductor device of claim 12, wherein the gate isolation structure is in contact with a sidewall surface and the top surface of the second non-active fin.

15. The semiconductor device of claim 11, further comprising a contact etch stop layer (CESL) on the first and second non-active fins and the first and second active fins.

16. A semiconductor structure, comprising:
    first, second, and third fins on a substrate, wherein the first, second, and third fins comprise a first material and top surfaces of the first and third fins are above a top surface of the second fin;
    a shallow trench isolation (STI) layer on the substrate and surrounding the first, second, and third fins, wherein a top surface of the STI layer is above a top surface of the second fin and below the top surfaces of the first and third fins;
    a first dielectric fin on the first fin and abutting a pair of sidewalls of the first fin, wherein the first dielectric fin comprises a second material different from the first material and has a top surface substantially coplanar with the top surfaces of the first and third fins; and
    a second dielectric fin on the second fin and between the first and third fins, wherein the second dielectric fin comprises the second material and has a top surface substantially coplanar with the top surfaces of the first and third fins.

17. The semiconductor structure of claim 16, further comprising:
    a gate structure over the second dielectric fin and the first and second fins; and
    a gate isolation structure in contact with the second dielectric fin, wherein the gate isolation structure and the second dielectric fin separate the gate structure into two portions.

18. The semiconductor structure of claim 17, wherein the gate isolation structure extends below a top surface of the second dielectric fin and above the top surface of the second fin.

19. The semiconductor structure of claim 16, wherein the first and second dielectric fins are parallel to and separate from each other.

20. The semiconductor structure of claim 16, further comprising:
- a first epitaxial structure on the first fin;
- a second epitaxial structure on the third fin; and
- a metal contact on the second dielectric fin and the first and second epitaxial structures.

* * * * *

UNITED STATES PATENT AND TRADEMARK OFFICE
CERTIFICATE OF CORRECTION

PATENT NO. : 12,324,225 B2
APPLICATION NO. : 18/447922
DATED : June 3, 2025
INVENTOR(S) : Chiang et al.

Page 1 of 1

It is certified that error appears in the above-identified patent and that said Letters Patent is hereby corrected as shown below:

On the Title Page

Column 1, Item (73), in "Assignee", Line 2, delete "Ltd." and insert -- Ltd., Hsinchu (TW) --, therefor.

Column 1, Item (60), under "Related U.S. Application Data", delete "(60)" and insert -- (63) --, therefor.

In the Specification

In Column 6, Line 46, delete "Vth" and insert -- $V_{th}$ --, therefor.

In Column 11, Line 28, delete "$d_{30}f$" and insert -- $d_3$ of --, therefor.

Signed and Sealed this
Twenty-first Day of October, 2025

John A. Squires
*Director of the United States Patent and Trademark Office*